(12) United States Patent
Hashimoto et al.

(10) Patent No.: US 8,010,872 B2
(45) Date of Patent: Aug. 30, 2011

(54) ELECTRONIC CONTROLLER

(75) Inventors: Koji Hashimoto, Tokyo (JP); Katsuya Nakamoto, Tokyo (JP); Shoso Tsunekazu, Tokyo (JP); Shinsuke Suzuki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 1035 days.

(21) Appl. No.: 11/847,061

(22) Filed: Aug. 29, 2007

(65) Prior Publication Data

US 2008/0162854 A1 Jul. 3, 2008

(30) Foreign Application Priority Data

Dec. 28, 2006 (JP) .................................. 2006-355311

(51) Int. Cl.
*G11C 29/00* (2006.01)
(52) U.S. Cl. ........................................ 714/763; 365/158
(58) Field of Classification Search .................. 714/763; 365/158

See application file for complete search history.

(56) References Cited

U.S. PATENT DOCUMENTS

| | | | | |
|---|---|---|---|---|
| 6,597,595 B1 * | 7/2003 | Ichiriu et al. | | 365/49.18 |
| 6,690,595 B1 * | 2/2004 | Srinivasan et al. | | 365/49.17 |
| 7,861,138 B2 * | 12/2010 | Oh | | 714/763 |
| 2005/0144551 A1 * | 6/2005 | Nahas | | 714/763 |

FOREIGN PATENT DOCUMENTS

| | | |
|---|---|---|
| JP | 2003-104137 A | 4/2003 |
| JP | 2003-115197 A | 4/2003 |
| JP | 2005-208958 A | 8/2005 |

* cited by examiner

*Primary Examiner* — M. Mujtaba K Chaudry
(74) *Attorney, Agent, or Firm* — Sughrue Mion, PLLC

(57) ABSTRACT

The invention improves safety of an electronic controller using a nonvolatile memory MRAM able to easily perform reading and writing operations at high speed. Therefore, MRAM for writing a control program from an external tool has a correction code adding writing circuit, a decoding reading-out circuit, and error registers for writing an error generating address number thereto as error data. When the error generating address is designated and confirmation reading-out is performed and an error is generated as before, an overlapping abnormality judgment is made and abnormality notification is performed. A program memory area of MRAM is normally in a writing inhibition state. When the external tool is connected, the inhibition state is released. The error registers are arranged in a data memory area set to no writing inhibition object.

22 Claims, 16 Drawing Sheets

ELECTRONIC CONTROLLER

BACKGROUND OF THE INVENTION

1. Field of the Invention

This invention relates to an improvement of an electronic controller having a microprocessor using MRAM (Magnetic Random Access Memory) as a nonvolatile memory able to easily perform reading and writing operations at high speed as a program memory and a data memory.

2. Background Art

In the electronic controller using the microprocessor, it is considered to use MRAM as a nonvolatile memory able to easily perform the reading and writing operations at high speed instead of a former memory construction in which a nonvolatile memory of a mask ROM memory or a flash memory, etc. is set to a program memory, and a battery-backed-up RAM memory is set to a data memory for arithmetic processing.

However, there is a high possibility that stored data are easily changed by a noise error operation, etc. although it is convenient to easily perform the reading and writing operations at high speed. Accordingly, prudent dealing is required.

For example, in accordance with JP-A-2003-104137 (Patent Document 1), a memory area of MRAM is divided into a RAM area and a ROM area, and a write inhibiting means with respect to the ROM area is arranged. When a maintenance tool is also connected with respect to the RAM area, the controller is constructed to perform writing inhibition by commands from a control terminal so as not to delete stored data in error. Thus, the controller is considered such that writing and erasion are not carelessly performed.

Further, in accordance with JP-A-2003-115197 (Patent Document 2), MRAM for obtaining error correction decoding data by using error correction coding data stored to the solid memory device (MRAM) is disclosed. Read-out data are restored when a code error is generated in the range of a limited bit number. In addition, in accordance with JP-A-2005-208958 (Patent Document 3) as a technique relating to this invention, a program area of a memory is divided into suitable areas, and is partitioned into plural data blocks. Further, sum check data of stored program data and an error correction code are stored to each data block together. At a starting time of the microcomputer, a sum check of the program data is performed. When no sum check is conformed, a data restoring program is started and an abnormal portion of the program data is found. Further, normal data of a pertinent portion are calculated and the program data are restored.

In accordance with the above Patent Document 1, there is an important point in a writing inhibition function for executing no erroneous writing operation. The correction of a generated error, the detection of an error unable to be corrected, and an abnormality processing countermeasure are not referred. Accordingly, there is a defect in that no controller of high safety can be obtained by merely performing the writing inhibition. Further, in accordance with the above Patent Document 2, there is a limit in a correctable error bit number, and no countermeasure processing of an error of a bit number exceeding this correctable error bit number is referred.

For example, when a correction code of three bits is added to data of four bits, the error can be corrected within the range of one bit. However, when a code error of two bits is generated, a problem exists in that this error cannot be corrected. In this state, it is dangerous to operate the microprocessor.

However, there are defects in that a correction code bit length becomes large so as to make the error correction of many bits, and the memory is large-sized and becomes expensive. Further, in accordance with the above Patent Document 3, even when a code error of many bits is generated within one data, the original correct data can be arithmetically calculated and presumed. However, when code errors are simultaneously scattered and generated in plural data, a problem exists in that no code errors can be recovered.

SUMMARY OF THE INVENTION

An object of this invention is to provide an electronic controller for preventing erroneous writing with respect to MRAM, and able to perform restoring writing, and detecting abnormality generation difficult to be restored and improving safety in MRAM with an error correction code constructed so as to restore and read-out the code error in the range of a limited bit number.

The electronic controller in this invention is an electronic controller having a microprocessor in which electricity is supplied from an external electric power source and the operation of an electric load group is controlled in accordance with an operating situation of an input sensor group, and constructed such that a control program including a control constant is transferred and written from an external tool to a nonvolatile program memory cooperated with the microprocessor;

wherein the microprocessor is operated on the basis of the control program stored to MRAM (Magnetic Random Access Memory) as a nonvolatile program memory electrically read and written;

MRAM is dividedly stored into different address areas comprising a program memory area mainly constructed by an input-output control program not rewritten and changed during the operation of the microprocessor after being transferred and written from the external tool, and a data memory area rewritten and changed at any time during the operation of the microprocessor, and storage is performed.

The MRAM further includes:

a correction code adding writing circuit for writing stored data adding an error correction code to a memory cell of a designation address in accordance with a writing command signal from the microprocessor;

a decoding reading-out circuit for decoding and reading-out the stored data from the memory cell of the designation address in accordance with a reading-out command signal from the microprocessor;

an error register arranged in the data memory area; and a control program as a confirmation reading-out means and an overlapping abnormality judging means arranged in the program memory area; and the writing command signal from the microprocessor is constructed so as to be supplied to the MRAM through a writing inhibition/releasing means.

the error register stores an address number generating an error as error data when there is a code error in the stored data of the memory cell; and the stored error data are error data first generated after being reset by the microprocessor, or are a memory of a specific address for storing error data sequentially updated if there is a code error with respect to a new address by sequentially reading-out contents of each address of the memory cell.

The confirmation reading-out means is operated in accordance with storage of the error data to the error register, and is a means for again reading-out and confirming contents of the error register after the error data are reset and the error generating address is then again accessed.

The overlapping abnormality judging means is a means for judging that the contents of a memory of the same address are a continuation abnormality when the contents of the error register read out by the confirmation reading-out means include the same error data.

The writing inhibition/releasing means inhibits that the writing command signal provided by the microprocessor is supplied to the MRAM with respect to the program memory area of the MRAM for storing the control program;

the writing inhibition/releasing means releases the writing inhibition function when the external tool is connected to the microprocessor and it is a writing state of the control program with respect to the MRAM;

the writing inhibition/releasing means also releases the writing inhibition function as an exception when restoring writing of the control program is performed at an unconnecting time of the external tool; and abnormality processing including at least abnormality notification is executed when the overlapping abnormality judging means makes an abnormality judgment, or is executed in accordance with the execution of abnormality judgments made plural times.

In accordance with the above electronic controller in this invention, the magnetic random memory (MRAM) having the code correction function is used as a program memory with respect to the microprocessor. The error register is added to this MRAM, and the overlapping abnormality judging means based on the confirmation reading-out means and the writing inhibition/releasing means are arranged.

Accordingly, in addition to a self correction function of MRAM, a preventing treatment of error writing using the writing inhibition/releasing means is taken. Further, abnormality generation of MRAM is detected by the overlapping abnormality judging means, and abnormality processing is performed without making an excessive response to a temporary noise error operation. Accordingly, safety of the controller is improved, and large-sized formation of MRAM using excessively large ECC data (Error Correct Code) is avoided. Thus, there is an effect able to practically use MRAM able to simply perform reading and writing operations.

The foregoing and other object, features, aspects, and advantages of the present invention will become more apparent from the following detailed description of the present invention when taken in conjunction with the accompanying drawings.

DESCRIPTION OF THE PREFERRED EMBODIMENTS

Embodiment Mode 1 of the Invention (1) Detailed Explanation of Construction

Figure 1:
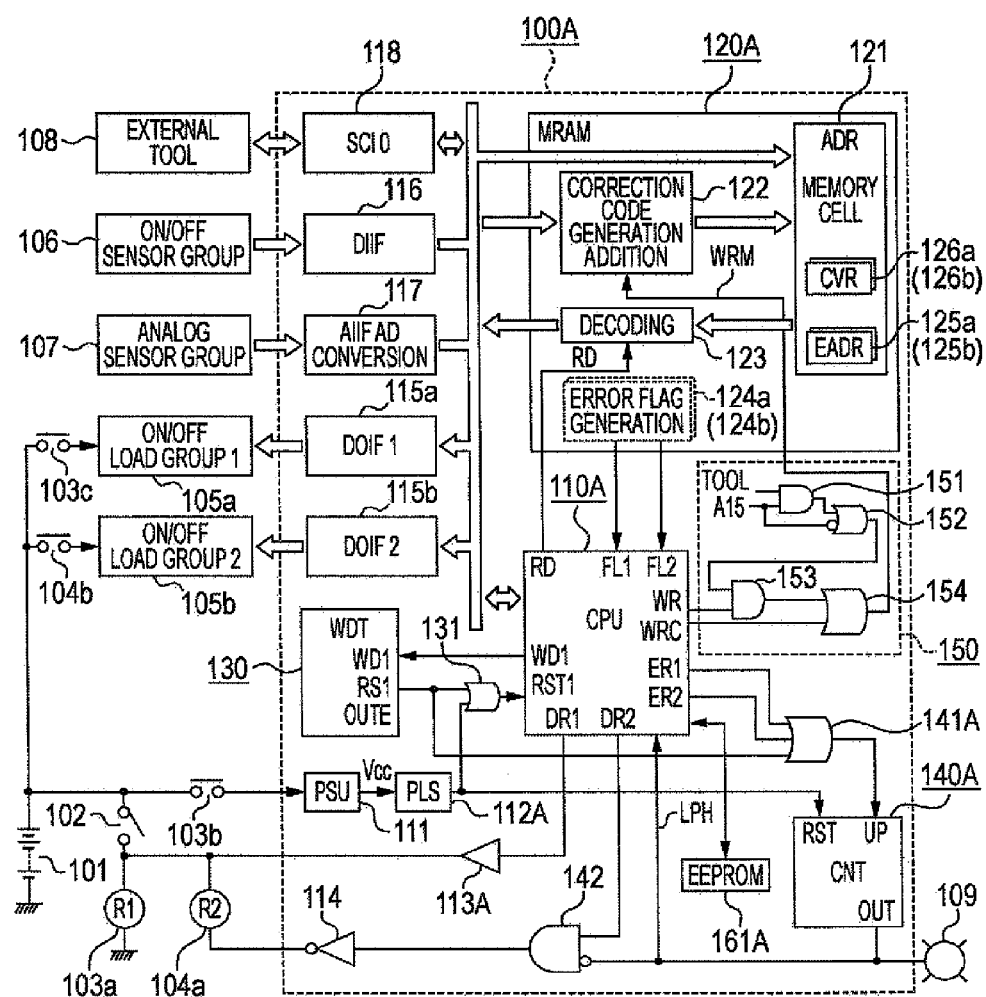
FIG. 1 is a circuit block diagram of a first embodiment device of this invention.

FIG. 1 showing a circuit block diagram of a first embodiment device of this invention will next be explained.

In FIG. 1, for example, an electronic controller 100A is a controller of a vehicle mounting engine. An external electric power source 101 as a vehicle mounting battery is connected to the electronic controller 100A through an output contact 103b of an electric power relay. A magnetizing coil 103a of the electric power relay is connected to the external electric power source 101 through an electric power switch 102.

A positive end of a magnetizing coil 104a of a load electric power relay is connected to the external electric power source 101 through the electric power switch 102. However, a negative end of the magnetizing coil 104a is controlled in electric conduction by an inversion driving circuit element 114 described later.

Electricity is supplied from a microprocessor 110A described later to a first electric load group 105a through a first output interface circuit 115a so that the first electric load group 105a is operated. For example, in the first electric load group 105a, there are an electromagnetic coil for operating a fuel injection valve, an ignition coil of an engine (when an engine type is a gasoline engine), a motor for operating an exhaust circulating valve, an electromagnetic clutch for an air conditioner, an alarm indicator, etc.

Further, electricity is supplied to a second electric load group 105b through a second output interface circuit 115b so that the second electric load group 105b is operated. For example, the second electric load group 105b includes a motor for controlling the valve aperture of an intake throttle.

Electricity is supplied to the first electric load group 105a through an output contact 103c of the electric power relay. In contrast to this, electricity is supplied to the second electric load group 105b through an output contact 104b of the load electric power relay.

A signal of an opening-closing sensor group 106 is inputted to the microprocessor 110A described later through an input interface circuit 116. For example, the opening-closing sensor group 106 is constructed by various kinds of sensors of an ON/OFF operation for monitoring a driving situation of the engine such as a crank angle sensor of the engine, a pulse sensor for measuring a vehicle speed, etc.

A signal of an analog sensor group 107 is inputted to the microprocessor 110A described later through an analog input interface circuit 117 including a multi-channel AD converter. For example, the analog sensor group 107 is constructed by various kinds of sensors for monitoring the driving situation of the engine such as an air flow sensor for measuring an intake air amount of the engine, an accelerator position sensor for detecting a stepping-in degree of an accelerator pedal, a throttle position sensor for detecting the aperture of a throttle valve, an exhaust gas sensor, a temperature sensor of cooling water of the engine, etc.

An external tool 108 connected to the microprocessor 110A described later through a serial interface circuit 118 is connected through an unillustrated attachment-detachment connector when a forwarding inspection and a maintenance inspecting operation of a product are performed.

Electricity is supplied from a comparison output terminal OUT of a counter circuit 140A as an abnormality generation memory means described later to an alarm indicator 109. The alarm indicator 109 notifies that an abnormality generating time number counted by the counter circuit 140A exceeds a predetermined time number.

The microprocessor 110A is cooperated with MRAM 120A as a nonvolatile program memory and a nonvolatile backup memory 161A as e.g., an EEPROM memory or a mask ROM memory as the internal construction of the electronic controller 100A.

The microprocessor 110A is operated by a stabilizing voltage generated by a control electric power source unit 111 supplied in electricity from the output contact 103b of the electric power relay. The microprocessor 110A generates an electric supply holding command output DR1 so that the microprocessor 110A continues energization with respect to the magnetizing coil 103a of the electric power relay through a driving circuit element 113A.

A reset pulse generating circuit 112A generates a reset pulse signal at a generating time point of an output voltage of the control electric power source unit 111, and initializes the microprocessor 110A through a logical sum element 131 described later. The reset pulse generating circuit 112A also initializes the counter circuit 140A as an abnormality generation memory means described later.

MRAM 120A is divided into address areas in which a program memory area and a data memory area are different, and storage is performed. The program memory area is mainly constructed by an input-output control program not rewritten and changed during the operation of the microprocessor 110A after data are transferred and written from the external tool 108. In the data memory area, data are rewritten and changed at any time during the operation of the microprocessor 110A.

Further, MRAM 120A includes a correction code adding writing circuit 122, a decoding reading-out circuit 123, first and second error flag generating circuits 124a, 124b, first and second error registers 125a, 125b arranged in the above data memory area, and a control program as a confirmation reading-out means and an overlapping abnormality judging means described later and arranged in the above program memory area. The correction code adding writing circuit 122 is operated in accordance with a writing command signal from the microprocessor 110A, and writes stored data adding an error correction code to a memory cell 121 of a designation address. The decoding reading-out circuit 123 is operated in accordance with a reading-out command signal from the microprocessor 110A, and decodes and reads-out the above stored data from the memory cell 121 of the designation address. MRAM 120A is constructed such that a writing command signal from the microprocessor 110A is supplied to MRAM 120A through a writing inhibition/releasing means 150.

The first error flag generating circuit 124a generates an error within a bit number of a range able to decode contents of the memory cell 121 of the designation address. When read-out stored data are data restored and corrected by the above decoding reading-out circuit 123, the first error flag generating circuit 124a becomes a logic circuit for generating a first error flag FL1 as binarized logic information.

The first error register 125a generates an error within the bit number of a range able to decode the contents of the memory cell 121 of the designation address. When the read-out stored data are data decoded and corrected by the decoding reading-out circuit 123, the first error register 125a becomes an error register for locating an address number generating this error at a first specific address stored as first error data. It is convenient to arrange the first error flag generating circuit 124a. However, it is possible to know whether a first error is generated by confirming the contents of the first error register 125a even when this first error flag generating circuit 124a is not arranged.

A first present value register 126a is a memory used in a first totalizing means described later. The first present value register 126a and the first error register 125a are arranged in the data memory area of the memory cell 121.

The second error flag generating circuit 124b generates an error exceeding the bit number of a range able to decode the contents of the above memory cell 121 of the designation address. When the read-out stored data are data unable to guarantee whether these read-out stored data are conformed to stored original data, the second error flag generating circuit 124b becomes a logic circuit for generating a second error flag FL2 as binarized logic information.

The second error register 125b generates an error exceeding the bit number of a range able to decode the contents of the memory cell 121 of the designation address. When the read-out stored data are data unable to guarantee whether these read-out stored data are conformed to stored original data, the second error register 125b becomes an error register for locating an address number generating this error at a second specific address stored as second error data. It is convenient to arrange the second error flag generating circuit 124b. However, even when this second error flag generating circuit 124b is not arranged, it is possible to know whether a second error is generated by confirming the contents of the second error register 125b.

A second present value register 126b is a memory used in a second totalizing means described later. The second present value register 126b and the second error register 125b are arranged in the data memory area of the memory cell 121.

A watch dog timer 130 monitors a watch dog clear signal WD1 as a pulse series signal generated by the microprocessor 110A. When a pulse width of the watch dog clear signal WD1 exceeds a predetermined threshold value, the watch dog timer 130 generates a reset pulse signal RS1. The watch dog timer 130 then supplies this reset pulse signal RS1 to a reset input terminal RST1 of the microprocessor 110A through the logical sum element 131, and initializes and restarts the microprocessor 110A.

Further, the reset pulse signal RS1 is supplied to a counting input terminal UP of the counter circuit 140A as an abnormality generation memory means described later through a logical sum element 141A.

The watch dog timer 130 generates an output allowance signal OUTE when the pulse width of the watch dog clear signal WD1 is normal. Thus, the outputs of first and second output interface circuits 115a, 115b can be generated.

The counter circuit 140A as an abnormality generation memory means counts a generating time number of a logical sum output signal of the logical sum element 141A. First and second abnormality detecting signals ER1, ER2 generated by the microprocessor 110A, and the reset pulse signal RS1 generated by the watch dog timer 130 are supplied to an input terminal of the logical sum element 141A.

A gate circuit 142 as a driving stopping means is connected between a load electric supply command output DR2 generated by the microprocessor 110A and the inversion driving circuit element 114. When the load electric supply command output DR2 is "H" in logic level, the gate circuit 142 energizes the magnetizing coil 104a of the load electric power relay. However, when the logic level of the comparison output terminal OUT of the counter circuit 140A becomes "H", the magnetizing coil 104a is de-energized.

Further, in such an abnormality deciding state, a mode switching command signal LPH is supplied to the microprocessor 110A.

A logic circuit 150 as a writing inhibition/releasing means is constructed by a logical product element 151 and a logical sum element 152 of a first stage, and a logical product element 153 and a logical sum element 154 of a latter stage.

A tool connecting signal TOOL inputted to the first stage logical product element 151 is a signal for detecting that the external tool 108 is connected, and attaining "H" in logic level. An address signal A15 is a signal attaining "H" in logic level when an uppermost order address of the memory cell 121 is accessed. In this embodiment, the area (A15="H") of a half of MRAM 120A is used as the program memory area. The area (A15="L") of the remaining half is used as the data memory area.

A writing command signal WR generated by the microprocessor 110A is a signal attaining "H" in logic level when an address is designated with respect to the memory cell 121 and data sent-out to a data bus are then written to the memory cell 121. This writing command signal WR is supplied to an input terminal of the latter stage logical product element 153.

A writing correction command signal WRC generated by the microprocessor 110A is a command signal for setting the logic level to "H" after an error generating address is designated and correction data are sent-out to the data bus when it is desirous to correct an error code within the memory cell 121. This command signal is supplied to an input terminal of the latter stage logical sum element 154.

A logical output of the first stage logical product element 151 and an inversion logical output of the address signal A15 are inputted to an input terminal of the first stage logical sum element 152. Its logical sum output is connected to an input terminal of the latter stage logical product element 153.

A logical output of the latter stage logical product element 153 and a writing correction command signal WRC are inputted to an input terminal of the latter stage logical sum element 154. Its logical sum output is supplied to MRAM 120A as a writing command input WRM. For example, an escaping operation program is stored to the backup memory 161A. When an abnormality is generated in the escaping operation program as an important control program within the memory cell 121, the contents of the backup memory 161A are transferred to the memory cell 121.

(2) Detailed Explanation of Acting Operation

In the first embodiment device of this invention constructed as shown in FIG. 1, when the electric power switch 102 is closed, the output contact 103b of the electric power relay is closed and electricity is supplied from the external electric power source 101 to the control electric power source unit 111. Thus, the control electric power source unit 111 generates a stabilized control electric power source voltage Vcc. The microprocessor 110A and the counter circuit 140A are initialized by a reset pulse signal generated by the reset pulse generating circuit 112A. The microprocessor 110A then starts its operation, and generates a watch dog clear signal WD1.

At a first time electric supplying time before a control program is stored to MRAM 120A, the control program is transferred from the external tool 108 to MRAM 120A through the serial interface circuit 118 on the basis of a boot program stored to MRAM 120A in advance. When the control program is written by the external tool 108, both the logic levels of the tool connecting signal TOOL and the uppermost order address signal A15 attain "H". As its result, output logics of the former stage logical product element 151 and the former stage logical sum element 152 become "H". The writing command signal WR of the microprocessor 110A is supplied to MRAM 120A as it is as a writing command input WRM through the latter stage logical product element 153 and the latter stage logical sum element 154.

On the other hand, when the electric power switch 102 is closed after the control program is stored to MRAM 120A, the microprocessor 110A begins to be operated after the microprocessor 110A and the counter circuit 140A are initialized. The microprocessor 110A generates a watch dog clear signal WD1 and also generates an electric supply holding command output DR1 and a load electric supply command output DR2. The magnetizing coil 104a of the load electric power relay is energized.

In this state, the tool connecting signal TOOL becomes "L" in logic level. As its result, with respect to the program memory area attaining "H" together in logic level of the uppermost order address signal A15, the output logic of the latter stage logical product element 153 becomes "L" even when the logic level of the writing command signal WR becomes "H". Thus, no writing command signal WR is supplied to MRAM 120A.

However, with respect to the data memory area attaining "L" together in logic level of the upper order address signal A15, the output logic of the first stage logical sum element 152 becomes "H". Accordingly, the writing command signal WR becomes valid.

Further, a rewriting correction command signal WRC described later always becomes valid irrespective of the memory area.

The microprocessor 110A controls the operations of the first and second electric load groups 105a, 105b in accordance with the voltage level of an analog signal obtained from the analog sensor group 107, an operating state of an ON/OFF signal obtained from the opening-closing sensor group 106, and the input-output control program stored to the memory cell 121 of MRAM 120A.

When first and second abnormality detecting signals ER1, ER2 generate an abnormality detection pulse signal by a noise error operation, etc. during the operation of the microprocessor 110A, and the watch dog timer 130 generates a reset pulse signal RS1, a counting input signal is supplied to the counting input terminal UP of the counter circuit 140A through the logical sum element 141A. The counter circuit 140A counts an abnormality generating time number. When this abnormality generating time number exceeds a predetermined value, the counter circuit 140A is counted up and the logic level of the comparison output terminal OUT becomes "H".

As its result, the alarm indicator 109 is operated and the load electric supply command output DR2 is interrupted by the gate circuit 142. The magnetizing coil 104a of the load electric power relay is de-energized, and a mode switching command signal LPH is supplied to the microprocessor 110A.

As its result, the microprocessor 110A proceeds to an escaping operation mode for restraining an engine rotating speed.

When the electric power switch 102 is opened during the operation of the microprocessor 110A, the energization with respect to the magnetizing coils 103a, 104a is continued by the electric supply holding command output DR1 and the driving circuit element 113A. The microprocessor 110A executes confirmation storage of learning memory information, etc., and then personally stops the electric supply holding command output DR1. As its result, the magnetizing coil 103a is de-energized.

When the electric power switch 102 is again turned on, the microprocessor 110A and the counter circuit 140A are initialized by the reset pulse generating circuit 112A. Accordingly, when the counter circuit 140A is counted up by a noise error operation, it is recovered to a normal operation state.

However, when first and second abnormality detecting signals ER1, ER2 or the watch dog timer 130 generates the reset pulse signal RS1 by an abnormality of MRAM 120A and other hardware, the counter circuit 140A again counts these abnormality signals, and rapidly notifies the abnormality and stops the operation of the load electric power relay, etc.

Figure 2:
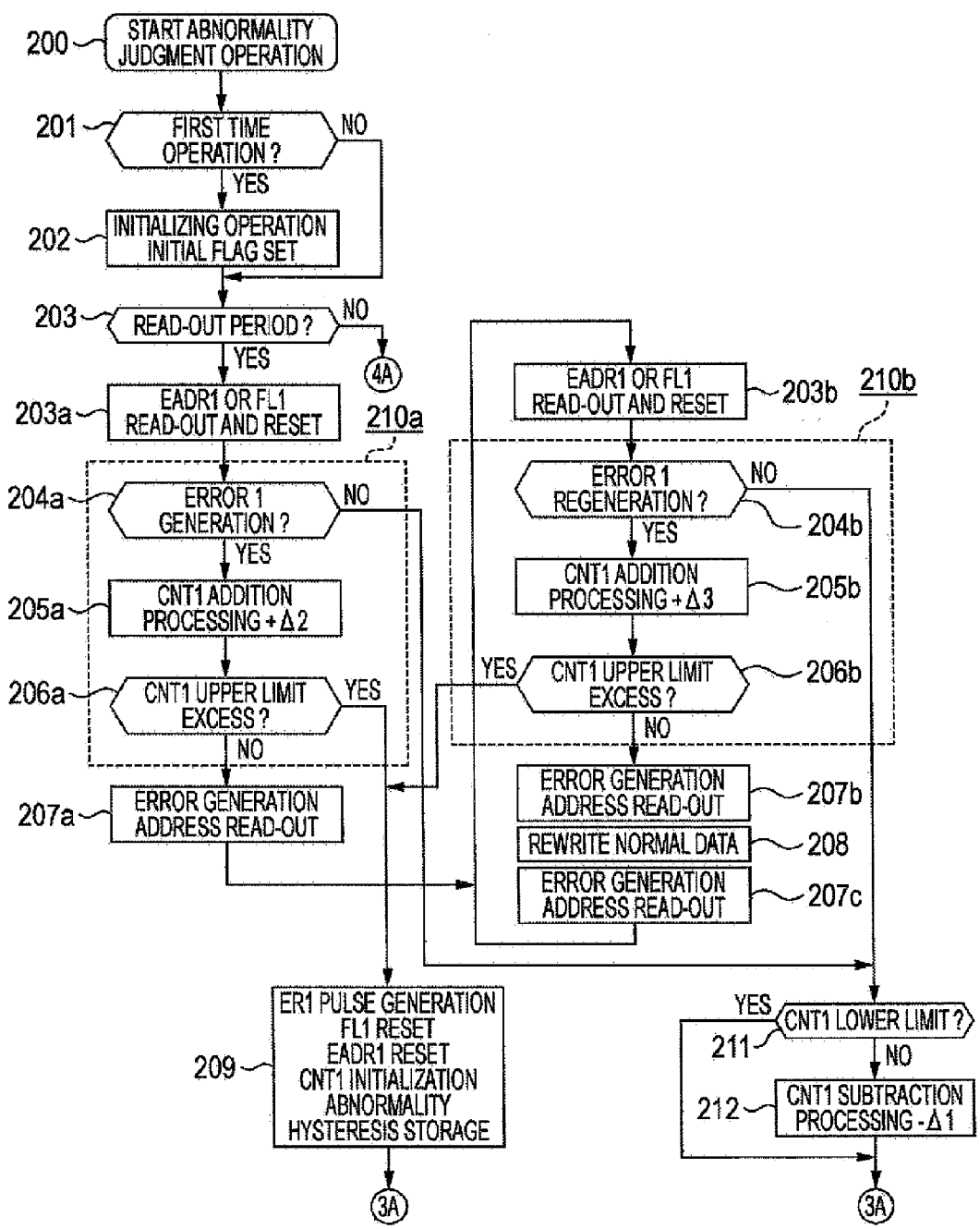
FIG. 2 is a flow chart for explaining an operation relative to a first abnormality judgment in FIG. 1.

Next, FIG. 2 as a flow chart for explaining an operation relative to a first abnormality judgment in FIG. 1 will be explained. In FIG. 2, process 200 is a step for starting an abnormality judging operation of MRAM 120A by the microprocessor 110A. In subsequent process 201, it is judged in process 202 described later whether it is a first time operation according to whether an initial flag is set. If it is the first time operation, the judgment of YES is made and it proceeds to process 202. In contrast to this, if it is no first time operation, the judgment of NO is made and it proceeds to process 203. Process 202 is a step for initializing contents of the above first and second error flag generating circuits 124a, 124b, the first and second error registers 125a, 125b and the first and second present value registers 126a, 126a, and setting an unillustrated initial flag. This initial flag is reset when the electric power switch 102 is turned on.

In process 203, it is judged whether it is timing for reading-out the contents of the first error flag FL1 or the first error register 125a. If it is a reading-out period, the judgment of YES is made and it proceeds to process 203a. In contrast to this, if it is no reading-out period, the judgment of NO is made and it proceeds to process 401 of FIG. 4 through a relay terminal 4A. The judgment as to whether it is the reading-out period or not is measured by an unillustrated timer. For example, the judgment of YES is made in a ratio of one time for about 10 msec.

In process 203a, the contents of the first error flag FL1 or the first error register 125a are read-out, and are overwritten and stored to an unillustrated temporary register having priority in after-writing. The contents of the first error flag 124a or the first error register 125a are reset.

In subsequent step 204a, the judgment of YES is made at a generating time of a first error according to whether the contents of the temporary register read out in process 203a are a generating state of the first error. It then proceeds to process 205a. In contrast to this, if no first error is generated, the judgment of NO is made and it proceeds to process 211.

The first error is an error able to correct a code. When the logic of the first error flag FL1 is correct or the contents of the first error register 125a are an address of the memory cell 121, it is judged that the first error is generated.

Process 205a is a step for adding e.g., "2" to the first present value register 126a as a second variational value Δ2. In subsequent process 206a, it is judged whether the value of the first present value register 126a exceeds e.g., "11" as a normal side limit value. If no value of the first present value register 126a exceeds "11", the judgment of NO is made and it proceeds to process 207a. In contrast to this, if the value of the first present value register 126a exceeds "11", the judgment of YES is made and it proceeds to process 209.

Process 207a is a step for designating an address generating an error and reading-out its contents. However, if the first error register 125a is read out in process 203a, an error generating address stored to the first error register 125a is designated and read out. If the first error flag FL1 is read out in process 203a, the contents of the first error register 125a are first readout in process 207a. Subsequently, the error generating address stored to the first error register 125a is designated and read out.

Accordingly, when the first error flag FL1 is used in process 203a, double time and labor are taken in process 207a. However, if it is a normal state generating no error, it can rapidly proceed to process 211 even when no contents of the first error register 125a are confirmed.

In process 203b executed subsequently to process 207a, the contents of the first error flag FL1 or the first error register 125a are read out and are overwritten to the unillustrated temporary register. Further, the contents of the first error flag FL1 or the first error register 125a are reset. In subsequent process 204b, the judgment of YES is made at a generating time of a first error according to whether the contents of the temporary register read out in process 203b are a generating state of the first error. It then proceeds to process 205b. In contrast to this, if no first error is generated, the judgment of NO is made and it proceeds to process 211. Process 205b is a step for adding e.g., "4" to the first present value register 126a as a third variational value Δ3. In subsequent process 206b, it is judged whether the value of the first present value register 126a exceeds e.g., "11" as a normal side limit value. If no value of the first present value register 126a exceeds "11", the judgment of NO is made and it proceeds to process 207b. In contrast to this, if the value of the first present value register 126a exceeds "11", the judgment of YES is made and it proceeds to process 209.

Process 207b is a step for designating an address generating an error and reading-out its contents. However, if the first error register 125a is read out in process 203b, the error generating address stored to the first error register 125a is designated and read out. If the first error flag FL1 is read out in process 203b, the contents of the first error register 125a are first readout in process 207b. Subsequently, the error generating address stored to the first error register 125a is designated and read out.

Subsequent process 208 is a step for restoring and writing decoding data read out in process 207b through the correction code adding writing circuit 122.

Subsequent process 207c is a step for reading-out data restored and written by process 208 through the decoding reading-out circuit 123. Subsequently to process 207c, it is returned to process 203b, and reading-out as to whether error generation is continued is performed.

If the judgment of process 204b becomes NO and no error is generated as a result of the restoration and the writing in process 208, it proceeds to process 211. In contrast to this, if the first error is generated as before, the addition of the variational value Δ3 in process 205b is repeated. An exceeding judgment is made by subsequent process 206b, and it proceeds to process 209.

In process 209 executed when the judgments of processes 206a, 206b show upper limit excess, a pulse of a first abnormality detecting signal ER1 is generated. Further, the contents of the first error flag FL1 and the first error register 125a are reset, and the value of the first present value register 126a is initialized to e.g., "9". It then proceeds to process 303a of FIG. 3 via the relay terminal 3A.

Process block 210a is a process group constituting a first scattering abnormality judging means constructed by processes 204a, 205a, 206a. Process block 210b is a process group constituting a first overlapping abnormality judging means constructed by processes 204b, 205b, 206b.

In process block 210a, the second variational value Δ2 is added to the first present value register 126a by the first error generated at many unspecific addresses. In contrast to this, in process block 210b, the third variational value Δ3 is added by a reconfirming operation with respect to a specific address during abnormality generation designated by process 207a or 207c.

In process 211 executed when the judgments of processes 204a, 204b are NO and no first error is generated, it is judged whether the value of the first present value register 126a becomes e.g., a normal side limit value "0". If no value of the first present value register 126a becomes "0", the judgment of NO is made and it proceeds to process 212. In contrast to this, if the value of the first present value register 126a becomes "0", the judgment of YES is made and it proceeds to process 303a of FIG. 3 via the relay terminal 3A. Process 212 is a step for subtracting e.g., "1" as the variational value Δ1 from the value of the first present value register 126a. Subsequently to process 212, it proceeds to process 303a of FIG. 3 through the relay terminal 3A.

The above flow chart will be schematically explained generally. Processes 205a, 212 correspond to a first totalizing means. The first totalizing means 205a, 212 are operated in accordance with generation of the first error and add (or subtract) the second variational value Δ2 to the first present value register 126a, and reset the first error register 125a and the first error flag FL1. If no first error is generated, the first variational value Δ1 is subtracted (or added) and adding and subtracting corrections with respect to the first present value register 126a are made so as to be mutually lessened. When an unoperating state of the above first error is continued, the first totalizing means 205a, 212 stop the adding and subtracting corrections using the above first variational value Δ1 at a predetermined normal side limit value. In the illustrated embodiment, these first totalizing means 205a, 212 are explained so as to make an adding calculation by the error generation.

As the real mode, the first error register 125a and the first error flag FL1 are reset in process 203a stored to the above temporary register.

Adding and subtracting directions with respect to the first present value register 126a may be also oppositely set, and an abnormal side lower limit value of the present value may be set to "0" and a normal side upper limit value may be set to "11". Further, when the first error is generated, the second variational value Δ2 may be subtracted. The first variational value Δ1 may be also added at a normal time.

Process 206a corresponds to a first scattering abnormality detecting means. This first scattering abnormality detecting means 206a is a means for generating the first abnormality detecting signal ER1 when the value of the first present value register 126a becomes a value outside the area of a predetermined abnormal side limit value by accumulating the first and second variational values Δ1 and Δ2. The second variational value Δ2 is a value greater than the first variational value Δ1, and is set as a value smaller than an allowance accumulating value as a difference between the above abnormal side limit value and the normal side limit value.

Accordingly, when the first error is scatteringly generated by a noise error operation, etc., no first abnormality detecting signal ER1 is immediately generated. When the first error is continuously generated by a hardware abnormality, the first abnormality detecting signal ER1 is rapidly generated.

Process block 210a becomes a first scattering abnormality judging means including the first totalizing means 205a and the first scattering abnormality detecting means 206a.

Process 203b corresponds to a first confirmation reading-out means. This first confirmation reading-out means 203b is a means operated in accordance with storage of first error data to the first error register 125a, and again reading-out and confirming the contents of the first error register 125a after the first error data are reset (by process 203a) and an error generating address is then again accessed (by process 207a).

Process 208 corresponds to a correction writing means. The correction writing means 208 becomes a restoring writing means operated in accordance with the storage of the first error data to the first error register 125a as before as a reading-out result using the first confirmation reading-out means 203b. The restoring writing means overwrites and stores stored data of the error generating address read out through the decoding reading-out circuit 123 to the error generating address of MRAM 120A through the correction code adding writing circuit 122.

Processes 205b, 212 correspond to a first totalizing means. When reading-out confirmation is performed by the first confirmation reading-out means 203b, or in the reading-out confirmation after a correction is written by the correction writing means 208, the first totalizing means 205b adds or subtracts the third variational value Δ3 as a value of the second variational value Δ2 or more with respect to the first present value register 126a at a generating time of an overlapping abnormality again generating the first error.

Process 206b corresponds to a first overlapping abnormality detecting means. The first overlapping abnormality detecting means 206b is a means for generating the first abnormality detecting signal ER1 when the value of the first present value register 126a becomes a value outside the area of a predetermined abnormal side limit value by accumulating the first and third variational values Δ1, Δ3. The third variational value Δ3 is set as a value smaller than an allowance accumulating value as the difference between the above abnormal side limit value and the normal side limit value.

Process block 210b constructed by including the first totalizing means 205b and the first overlapping abnormality detecting means 206b corresponds to a first overlapping abnormality judging means. When reading-out confirmation is performed by the first confirmation reading-out means 203b, or in the reading-out confirmation after a correction is written by the correction writing means 208, the first overlapping abnormality judging means 210b judges that the contents of a memory of the same address are a continuation abnormality when the contents of the first error register 125a again include the same error data.

However, in the case of the embodiment explained above, when confirmation reading-out and correction writing of plural times are performed, the first abnormality detecting signal ER1 is set to be generated. If the third variational value Δ3 is largely set, the first abnormality detecting signal ER1 can be immediately generated.

Next, FIG. 3 as a flow chart for explaining an operation relative to a second abnormality judgment in FIG. 1 will be explained.

Figure 3:
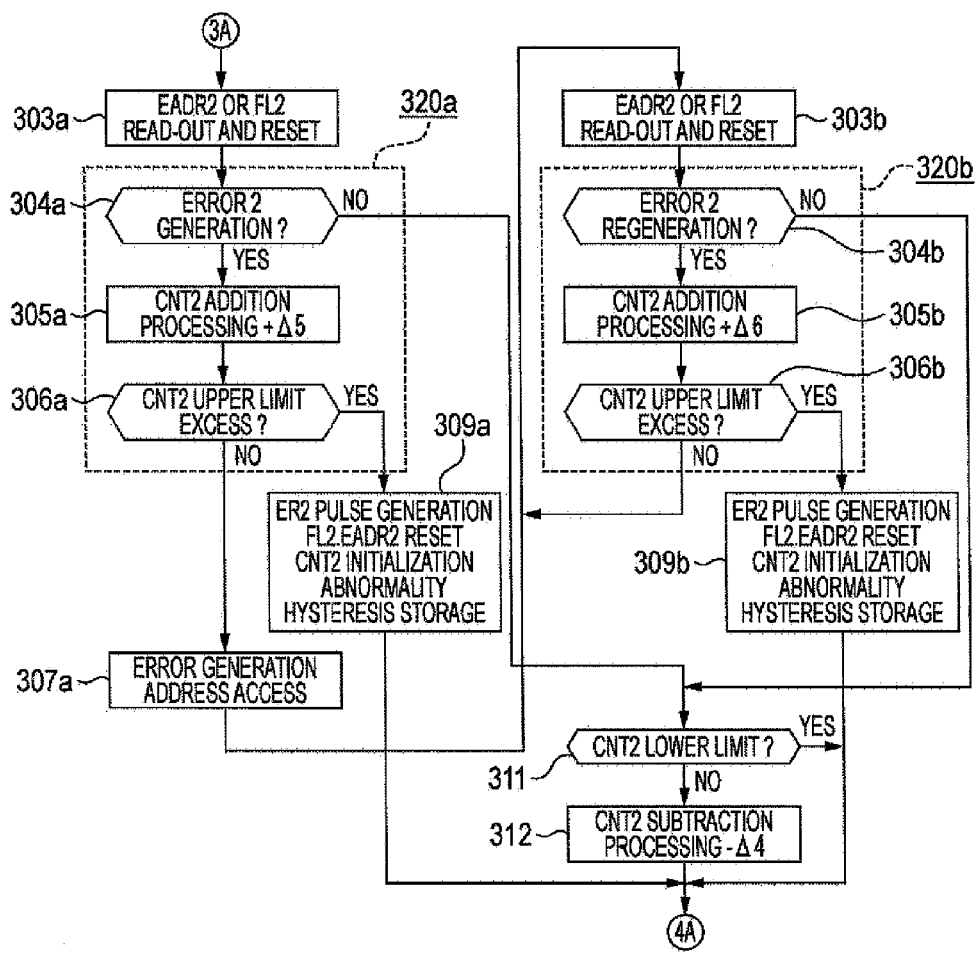
FIG. 3 is a flow chart for explaining an operation relative to a second abnormality judgment in FIG. 1.

In FIG. 3, in process 303a executed subsequently to the above processes 209, 211, 212, the contents of the second error flag FL2 or the second error register 125b are read out and are stored to an unillustrated temporary register. Further, the contents of the second error flag FL2 or the second error register 125b are reset. In subsequent process 304a, the judgment of YES is made and it proceeds to process 305a at a generating time of a second error according to whether the contents of the temporary register read out in process 303a are a generating state of the second error. In contrast to this, if no second error is generated, the judgment of NO is made and it proceeds to process 311.

The second error is an error unable to correct a code. When the logic of the second error flag FL2 is correct, or when the contents of the second error register 125b show an address of the memory cell 121, it is judged that the second error is generated.

Process 305a is a step for adding e.g., "3" to the second present value register 126b as a fifth variational value Δ5. In subsequent process 306a, it is judged whether the value of the second present value register 126b exceeds e.g., "11" as a normal side limit value. If no value of the second present value register 126b exceeds "11", the judgment of NO is made and it proceeds to process 307a. In contrast to this, if the value of the second present value register 126b exceeds "11", the judgment of YES is made and it proceeds to process 309a.

In process 309a, the second abnormality detecting signal ER2 is generated and the contents of the second error flag FL2 and the second error register 125b are reset. After the present value of the second present value register 126b is initialized to e.g., "9", it proceeds to process block 401a of FIG. 4 through a relay terminal 4A.

Process 307a is a step for designating an address generating an error and reading-out its contents. However, if the second error register 125b is read out in process 303a, the error generating address stored to the second error register 125b is designated and read out. If the second error flag FL2 is read out in process 303a, the contents of the second error register 125b are first read out in process 307a, and the error generating address stored to the second error register 125b is subsequently designated and read out.

Accordingly, when the second error flag FL2 is used in process 303a, double time and labor are taken in process 307a. However, if it is a normal state generating no error, it can rapidly proceed to process 311 even when no contents of the second error register 125b are confirmed.

In process 303b executed subsequently to process 307a, the contents of the second error flag FL2 or the second error register 125b are read out and stored to the unillustrated temporary register, and the contents of the second error flag FL2 or the second error register 125b are reset. In subsequent process 304b, the judgment of YES is made and it proceeds to process 305b at a generating time of the second error according to whether the contents of the temporary register read out in process 303b are a generating state of the second error. In contrast to this, if no second error is generated, the judgment of NO is made and it proceeds to process 311.

Process 305b is a step for adding e.g., "6" to the second present value register 126b as a sixth variational value Δ6. In subsequent process 306b, it is judged whether the value of the second present value register 126b exceeds e.g., "11" as a normal side limit value. If no value of the second present value register 126b exceeds "11", the judgment of NO is made and it is returned to process 303b. In contrast to this, if the value of the second present value register 126b exceeds "11", the judgment of YES is made and it proceeds to process 309b.

In process 309b, the second abnormality detecting signal ER2 is generated, and the contents of the second error flag FL2 and the second error register 125b are reset. After the present value of the second present value register 126b is initialized to e.g., "9", it proceeds to process block 401 of FIG. 4 through the relay terminal 4A.

Process block 320a is a process group constituting a second scattering abnormality judging means constructed by processes 304a, 305a, 306a. Process block 320b is a process group constituting a second overlapping abnormality judging means constructed by processes 304b, 305b, 306b.

In process block 320a, the fifth variational value Δ5 is added to the second present value register 126b by the second error generated at many unspecific addresses. In contrast to this, in process block 320b, the sixth variational value Δ6 is added by a reconfirming operation with respect to a specific address during abnormality generation designated by process 307a.

In process 311 executed when the judgments of processes 304a, 304b are NO and no second error is generated, it is judged whether the value of the second present value register 126b becomes e.g., a normal side limit value "0". If no value of the second present value register 126b becomes "0", the judgment of NO is made and it proceeds to process 312. In contrast to this, if the value of the second present value register 126b becomes "0", the judgment of YES is made and it proceeds to process block 401 of FIG. 4 via the relay terminal 4A.

Process 312 is a step for subtracting e.g., "1" as a variational value Δ4 from the value of the second present value register 126b. Subsequently to process 312, it proceeds to process block 401 of FIG. 4 through the relay terminal 4A.

The above flow chart will be schematically explained generally. Processes 305a, 312 correspond to a second totalizing means. The second totalizing means 305a, 312 are operated in accordance with generation of the second error, and add (or subtract) the fifth variational value Δ5 to the second present value register 126b, and reset the second error register 125b and the second error flag FL2. if no second error is generated, the second totalizing means 305a, 312 subtract (or add) the fourth variational value Δ4, and make adding and subtracting corrections with respect to the second present value register 126b so as to be mutually lessened. When an unoperating state of the above second error is continued, the second totalizing means 305a, 312 stop the adding and subtracting corrections using the above fourth variational value Δ4 at a predetermined normal side limit value. In the illustrated embodiment, the second totalizing means 305a, 312 are explained so as to make the adding calculation by the error generation.

However, adding and subtracting directions with respect to the second present value register 126b may be also oppositely set, and an abnormal side lower limit value of the present value may be set to "0" and a normal side upper limit value may be set to "11". Further, when the second error is generated, the fifth variational value Δ5 may be subtracted. The fourth variational value Δ4 may be also added at a normal time.

Process 306a corresponds to a second scattering abnormality detecting means. This second scattering abnormality detecting means 306a is a means for generating the second abnormality detecting signal ER2 when the value of the second present value register 126b becomes a value outside the area of a predetermined abnormal side limit value by accumulating the fourth and fifth variational values Δ4, Δ5. The fifth variational value Δ5 is a value greater than the fourth variational value Δ4, and is set as a value smaller than an allowance accumulating value as the difference between the above abnormal side limit value and the normal side limit value.

Accordingly, when the second error is scatteringly generated by a noise error operation, etc., no second abnormality detecting signal ER2 is immediately generated. When the second error is continuously generated by a hardware abnormality, the second abnormality detecting signal ER2 is rapidly generated.

Process block 320a becomes a second scattering abnormality judging means including the second totalizing means 305a and the second scattering abnormality detecting means 306a.

Process 303b corresponds to a second confirmation reading-out means. This second confirmation reading-out means 303b is a means operated in accordance with storage of second error data to the second error register 125b, and again reading-out and confirming the contents of the second error register 125b after the second error data are reset (by process 303a) and an error generating address is then again accessed (by process 307a).

Processes 305b, 312 correspond to the second totalizing means. When reading-out confirmation is performed by the second confirmation reading-out means 303b, the second totalizing means 305b adds or subtracts the sixth variational value Δ6 as a value of the fifth variational value Δ5 or more with respect to the second present value register 126b at a generating time of an overlapping abnormality again generating the second error.

Process 306b corresponds to a second overlapping abnormality detecting means. The second overlapping abnormality detecting means 306b is a means for generating the second abnormality detecting signal ER2 when the value of the second present value register 126b becomes a value outside the area of a predetermined abnormal side limit value by accumulating the fourth and sixth variational values Δ4, Δ6. The sixth variational value Δ6 is set as a value smaller than an allowance accumulating value as the difference between the above abnormal side limit value and the normal side limit value.

Process block 320b constructed by including the second totalizing means 305b and the second overlapping abnormality detecting means 306b corresponds to a second overlapping abnormality judging means. When the reading-out confirmation is performed by the second confirmation reading-out means 303b, the second overlapping abnormality judging means 320b judges that the contents of a memory of the same address are a continuation abnormality when the contents of the second error register 125b again include the same error data.

However, in the case of the embodiment explained above, when confirmation reading-out of plural times is performed, the second abnormality detecting signal ER2 is set to be generated. If the sixth variational value Δ6 is largely set, the second abnormality detecting signal ER2 can be immediately generated.

Next, FIG. 4 as a flow chart for an operating explanation relative to an inspecting operation in FIG. 1 will be explained.

Figure 4:
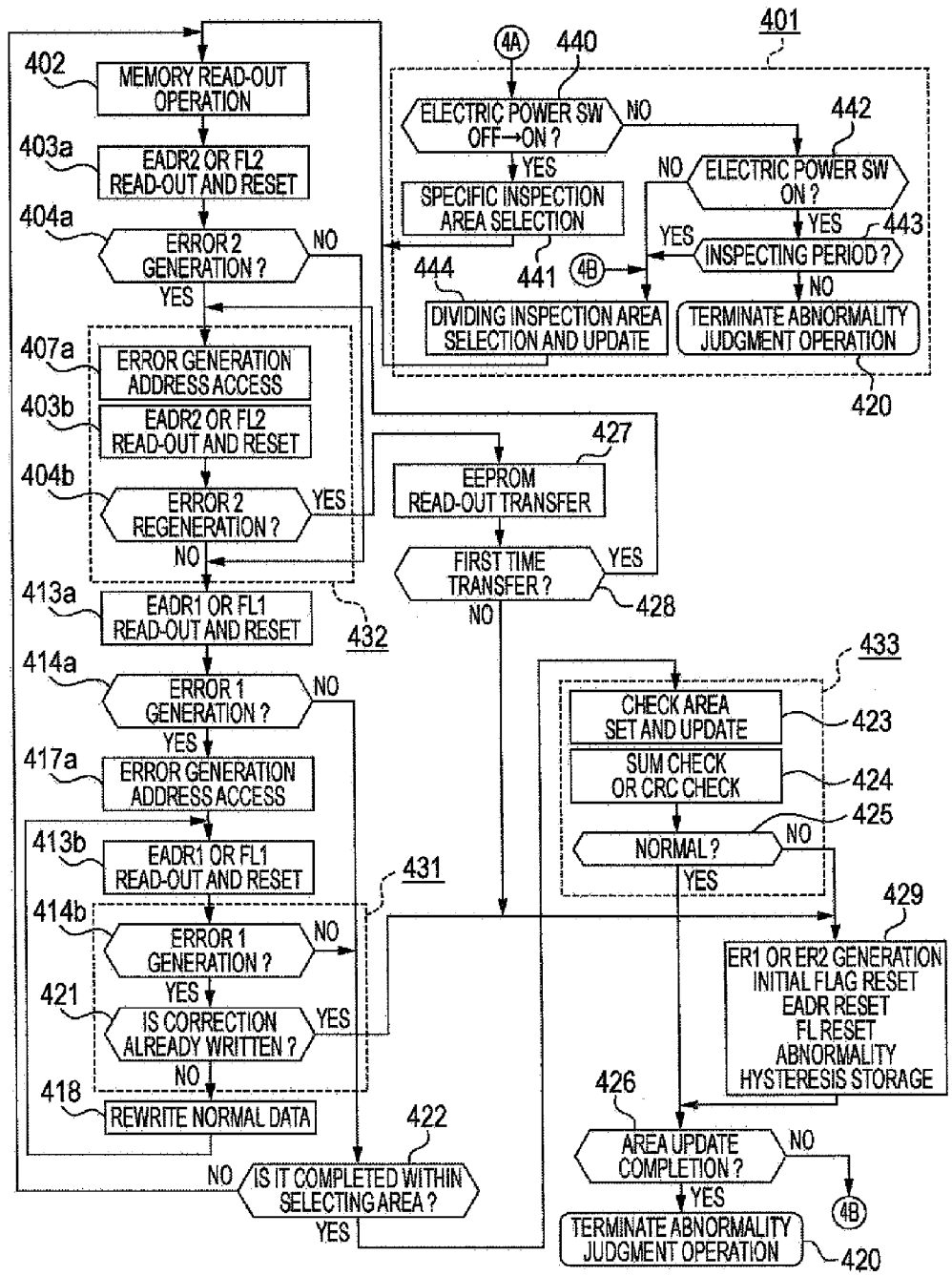
FIG. 4 is a flow chart for explaining an operation relative to an inspecting operation in FIG. 1.

In FIG. 4, in a process group of process block 401 executed subsequently to the above processes 203, 309a, 309b, 311, 312, it is judged whether it is an abnormality inspecting period. If it is no abnormality inspecting period, the judgment of NO is made and it proceeds to operation terminating process 420. In contrast to this, if it is the abnormality inspecting period, an abnormality inspecting area is selected and it proceeds to process 402.

In process block 401, it is judged in process 440 whether it is just after the electric power switch 102 is closed. If it is after a change OFF→ON, the judgment of YES is made and it proceeds to process 441. If the electric power switch 102 is already closed or is already opened, it proceeds to process 442. Process 441 is a step for selecting a specific inspecting area as an object of an operation starting inspection. In this specific inspecting area, for example, an escaping operation control program as an important program area in safety is selected.

In process 442, it is judged whether the electric power switch 102 is closed or not. If the electric power switch 102 is closed, the judgment of YES is made and it proceeds to process 443. In contrast to this, if the electric power switch 102 is opened, the judgment of NO is made and it proceeds to process 444. In process 442, the judgment of NO is made in a state in which the electric power switch 102 once closed is opened and electricity is continuously supplied by a delay return opening-closing element 103b.

In process 443, it is judged whether it is a periodic inspecting period. If it is the periodic inspecting period, the judgment of YES is made and it proceeds to process 444. In contrast to this, if it is no periodic inspecting period, the judgment of NO is made and it proceeds to operation termination process 420. In process 443, the judgment of YES is made approximately periodically.

Process 444 is a step for selecting and updating a dividing inspection area as an object of the periodic inspection or before-stoppage inspection. In the case of the periodic inspection, area update completion is judged in process 426 described later. Thus, it once proceeds to operation termination process 420. A dividing inspection area divided into plural portions in process 444 after operation starting process 200 is again activated is updated and selected.

In the case of the before-stoppage inspection for opening the electric power switch 102, area update incompletion is judged in process 426 described later. Thus, it is again returned to process 444 through a relay terminal 4B, and the dividing inspection area divided into plural portions is subsequently updated and selected.

Process 402 executed subsequently to process 441 or process 444 is a step for designating an address of the memory cell 121 and reading-out memory contents in an address area of MRAM 120A as an inspecting object.

In subsequent process 403a, the contents of the second error flag FL2 or the second error register 125b are read out and are stored to an unillustrated temporary register. Further, the contents of the second error flag FL2 or the second error register 125b are reset. In subsequent process 404a, the judgment of YES is made and it proceeds to process 407a at a generating time of a second error according to whether the contents of the temporary register read out in process 403a are a generating state of the second error. In contrast to this, when no second error is generated, the judgment of NO is made and it proceeds to process 413a.

Process 407a is a step for designating an address generating an error and reading-out its contents. However, if the second error register 125b is read out in process 403a, the error generating address stored to the second error register 125b is designated and read out. If the second error flag FL2 is read out in process 403a, the contents of the second error register 125b are first read out in process 407a. Subsequently, the error generating address stored to the second error register 125b is designated and read out.

Accordingly, when the second error flag FL2 is used in process 403a, double time and labor are taken in process 407a. However, if it is a normal state generating no error, it can rapidly proceed to process 413a even when no contents of the second error register 125b are confirmed.

In process 403b executed subsequently to process 407a, the contents of the second error flag FL2 or the second error register 125*b* are read out and are overwritten to the unillustrated temporary register. Further, the contents of the second error flag FL2 or the second error register 125*b* are reset.

In subsequent process 404*b*, the judgment of YES is made at a generating time of a second error according to whether the contents of the temporary register read out in process 403*b* are a generating state of the second error. It then proceeds to process 427. In contrast to this, if no second error is generated, the judgment of NO is made and it proceeds to process 413*a*.

In process 413*a*, the contents of the first error flag FL1 or the first error register 125*a* are read out and are overwritten and stored to an unillustrated temporary register having priority in after-writing. Further, the contents of the first error flag FL1 or the first error register 125*a* are reset.

In subsequent step 414*a*, the judgment of YES is made and it proceeds to process 417*a* at a generating time of a first error according to whether the contents of the temporary register read out in process 413*a* are a generating state of the first error. In contrast to this, if no first error is generated, the judgment of NO is made and it proceeds to process 422.

Process 417*a* is a step for designating an address generating an error and reading-out its contents. However, if the first error register 125*a* is read out in process 413*a*, the error generating address stored to the first error register 125*a* is designated and read out. If the first error flag FL1 is read out in process 413*b*, the contents of the first error register 125*a* are first read out in process 417*a*. Subsequently, the error generating address stored to the first error register 125*a* is designated and read out.

In subsequent process 413*b*, the contents of the first error flag FL1 or the first error register 125*a* are read out and are overwritten and stored to the unillustrated temporary register having priority in after-writing. Further, the contents of the first error flag FL1 or the first error register 125*a* are reset.

In subsequent step 414*b*, the judgment of YES is made and it proceeds to process 421 at a generating time of a first error according to whether the contents of the temporary register read out in process 413*b* are a generating state of the first error. In contrast to this, if no first error is generated, the judgment of NO is made and it proceeds to process 422.

In process 421, it is judged whether correction writing of normal data is executed by the next process 418. If no correction writing is performed, the judgment of NO is made and it proceeds to process 418. In contrast to this, if the correction writing is already performed, the judgment of YES is made and it proceeds to process 429.

Process 418 is a step for restoring and writing decoding data read out in process 417*a* through the correction code adding writing circuit 122. Subsequently to this process 418, it is returned to process 413*b*. It is then judged whether normal writing is performed by process 414*b*.

In process 422, it is judged whether the inspection of an area set to an inspecting object of this time is completed. If this inspection is not completed, the judgment of NO is made and it is returned to process 402, and an inspecting address is updated. In contrast to this, if this inspection is completed, the judgment of YES is made and it proceeds to process 423.

In process 423, with respect to plural inspecting areas divided into groups for a sum check or a CRC check, it is set whether which area is checked. For example, this inspecting area may be also the same area as an inspecting area selected in process 441 or process 444, or an area further finely divided.

Subsequent process 424 is a step for making the sum check or the CRC check with respect to the inspecting area set in process 423. In subsequent process 425, it is judged whether a check result in process 424 is normal or not. If this check result is normal, the judgment of YES is made and it proceeds to process 426. In contrast to this, if no check result is normal, the judgment of NO is made and it proceeds to process 429.

In process 426, the judgment of YES is made at the time of periodic inspection for closing the electric power switch 102. At the time of before-stoppage inspection for opening the electric power switch 102, the judgment of NO is first made and it is returned to process 444. If plural inspecting areas are repeatedly inspected and all the divided inspecting areas are completely inspected, the judgment of YES is made and it proceeds to operation termination process 420.

Process 427 is executed when it is judged that the second error is generated in process 404*b*. This process 427 is a step for reading-out data correspondingly to an error generating address from the backup memory 161A and transferring and writing these data to MRAM 120A.

In subsequent process 428, it is judged whether the transfer writing in process 427 is writing of a first time. When it is writing of the first time, the judgment of YES is made and it is returned to process 407*a*. It is then inspected whether the transfer writing is correctly performed. In contrast to this, when it is no writing of the first time, the judgment of NO is made and it proceeds to process 429.

In process 429, the abnormality detecting signal ER1 or ER2 is generated, and the initial flag set in process 202 of FIG. 2 is reset. Further, after the error register and the error flag within MRAM 120A are reset, it proceeds to process 426.

In operation termination process 420, the microprocessor 110A executes another control operation, and then approximately periodically proceeds to operation starting process 200 of FIG. 2. However, when the electric power switch 102 is opened, the operation of the microprocessor 110A is stopped and the electric power relay 103*a* is de-energized and an electric supply circuit is interrupted.

The above flow chart will be schematically explained generally. Process 403*b* corresponds to a second confirmation reading-out means. This second confirmation reading-out means 403*b* is operated in accordance with storage of second error data to the second error register 125*b* (by the judgment of process 404*a*). The second confirmation reading-out means 403*b* resets the second error data and then again gets access to an error generating address (reset after reading-out in process 403*a*) (by process 407*a*), and reads out and confirms the contents of the second error register 125*b*.

Process block 432 constructed by processes 407*a*, 403*b*, 404*b* corresponds to a second overlapping abnormality judging means. When reading-out confirmation is performed by the second confirmation reading-out means 403*b*, the second overlapping abnormality judging means 432 judges that the contents of a memory of the same address are a continuation abnormality when the contents of the second error register 125*b* include the same error data.

Process 413*b* corresponds to a first confirmation reading-out means. The first confirmation reading-out means 413*b* is operated in accordance with storage of first error data to the first error register 125*a* (by the judgment of process 414*a*). The first confirmation reading-out means 413*b* resets the first error data and then again gets access to an error generating address (reset after reading-out in process 413*a*) (by process 417*a*). Thereafter, the first confirmation reading-out means 413*b* again reads out and confirms the contents of the above first error register 125*a*.

Process block 431 constructed by processes 414*b*, 421 corresponds to a first overlapping abnormality judging means. When reading-out confirmation is performed by the first confirmation reading-out means 413*b*, the first overlapping abnormality judging means 431 judges that the contents of a memory of the same address are a continuation abnormality when the contents of the first error register 125a include the same error data.

Process 418 corresponds to a correction writing means. The correction writing means 418 is operated in accordance with the storage of the first error data to the first error register 125a as before as a reading-out result using the first confirmation reading-out means 413b. The correction writing means 418 is a restoring writing means for overwriting and storing stored data of an error generating address read out through the decoding reading-out circuit 123 to the error generating address of MRAM 120A through the above correction code adding writing circuit 122.

Process 427 corresponds to a correction transfer means. The correction transfer means 427 is operated in accordance with an abnormality judgment made by the overlapping abnormality judging means 432. The correction transfer means 427 is a restoring writing means for overwriting and storing an escaping operation program stored to the backup memory 161A to the error generating address of MRAM 120A through the above correction code adding writing circuit 122.

Process block 433 constructed by processes 423, 424, 425 corresponds to a third abnormality judging means. The third abnormality judging means 433 sequentially reads out stored data of a specific interval area of MRAM 120A, and judges the existence of a code error by the sum check or the CRC check relative to data of an entire reading-out interval.

Process block 401 constructed by processes 440 to 444 corresponds to an inspecting period judging means. The inspecting period judging means 401 selects one of an operation start inspecting means, a constant period inspecting means and a before-stoppage inspecting means.

The operation start inspecting means becomes a specific inspecting means for inspecting the existence of a code error by the overlapping abnormality judging means 431, 432 or the third abnormality judging means 433 with respect to main data of a specific area stored to MRAM 120A just after the electric power switch 102 is turned on.

Further, the constant period inspecting means becomes a dividing update inspecting means for dividing all data stored to MRAM 120A into plural portions in a turning-on continuing state of the electric power switch 102, and sequentially inspecting the existence of a code error by the overlapping abnormality judging means 431, 432 or the third abnormality judging means 433 with respect to each divided data.

Further, the before-stoppage inspecting means becomes a collective inspecting means for inspecting the existence of a code error by the overlapping abnormality judging means 431, 432 or the third abnormality judging means 433 with respect to all data stored to MRAM 120A in a closing period of the delay return opening-closing element 103b just after the electric power switch 102 is interrupted.

(3) Explanation of Other Embodiment Modes

In the first embodiment device of this invention constructed as shown in FIG. 1, MRAM 120A is explained so as to have the first and second error registers 125a, 125b and the first and second error flag generating circuits 124a, 124b. However, as a basic main feature of this invention, it is sufficient to arrange at least one of the first and second error registers 125a, 125b.

For example, when both the second error flag generating circuit 124b and the second error register 125b do not exist, processes 404a, 407a, 403b, 404b, 427, 428 within the entire FIG. 3 and FIG. 4 are deleted.

Conversely, when both the first error flag generating circuit 124a and the first error register 125a do not exist, processes 203a to 212 of FIG. 2 and processes 413a to 418 within FIG. 4 are deleted and it proceeds to process 422 when the judgment of process 404b is NO.

When both the second error flag generating circuit 124b and the second error register 125b do not exist, a problem of safety unable to detect generation of an error unable to be corrected is generated. However, the third abnormality judging means 433 becomes its replacing means.

When a sum check system is adopted as the third abnormality judging means 433, a complement value of all adding values of plural data stored to each address is calculated every each area of plural dividing areas of MRAM 120A, and is stored to MRAM 120A in advance. At an inspecting time, it is judged that it is normal if all the adding values of the plural data including the above complement value become zero.

When a CRC check (Cyclic Redundancy Check) system called a cyclic redundancy inspection is adopted as the third abnormality judging means 433, the remainder provided by dividing all data of an inspecting area by a predetermined generating polynomial as a higher order polynomial is added. At the inspecting time, it is judged that it is normal if it is divided by the same generating polynomial and the remainder becomes zero.

If both the second error register 125b and the third abnormality judging means 433 are arranged, an abnormality correction writing means 1327 as described later in FIG. 13 can be arranged.

Figure 5:
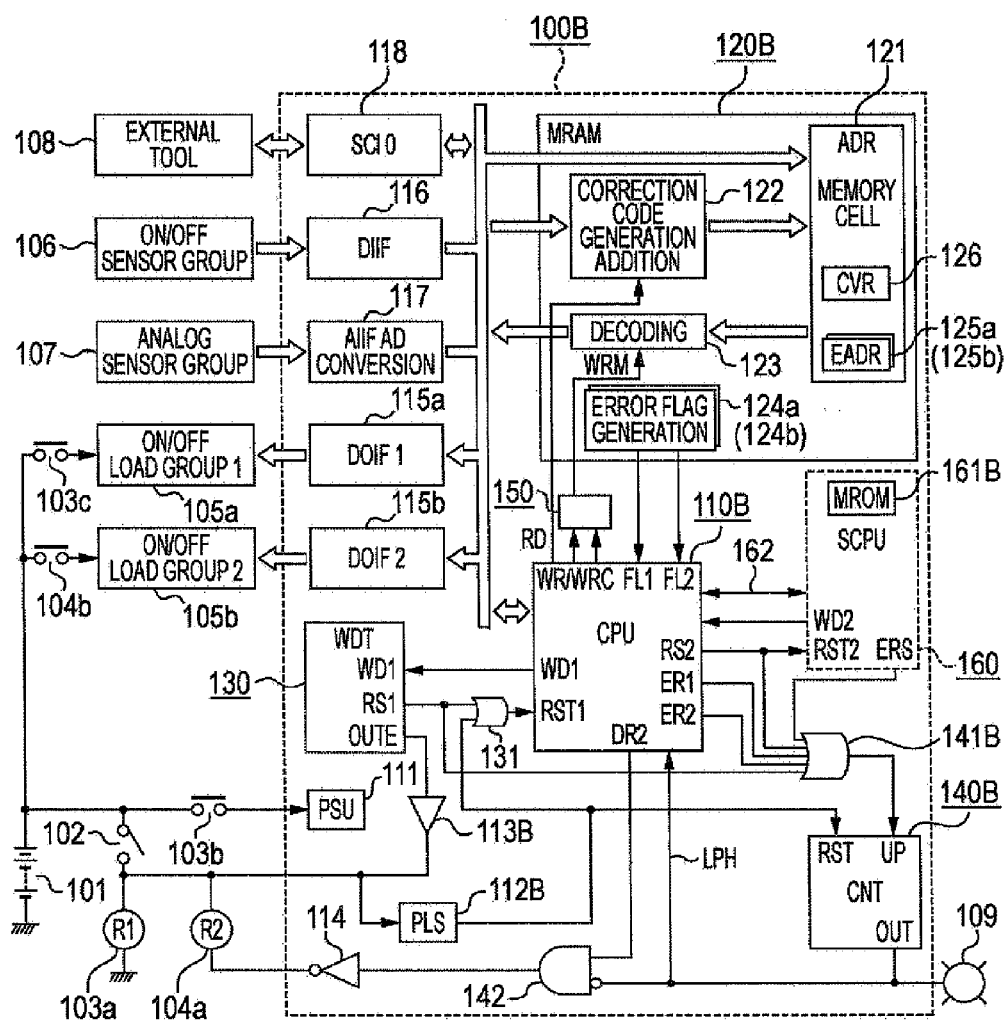
FIG. 5 is a circuit block diagram of a second embodiment device of this invention.

Further, as explained in the embodiment of FIG. 5, the first and second present value registers 126a, 126b can be also set to a common use present value register 126.

Figure 9:
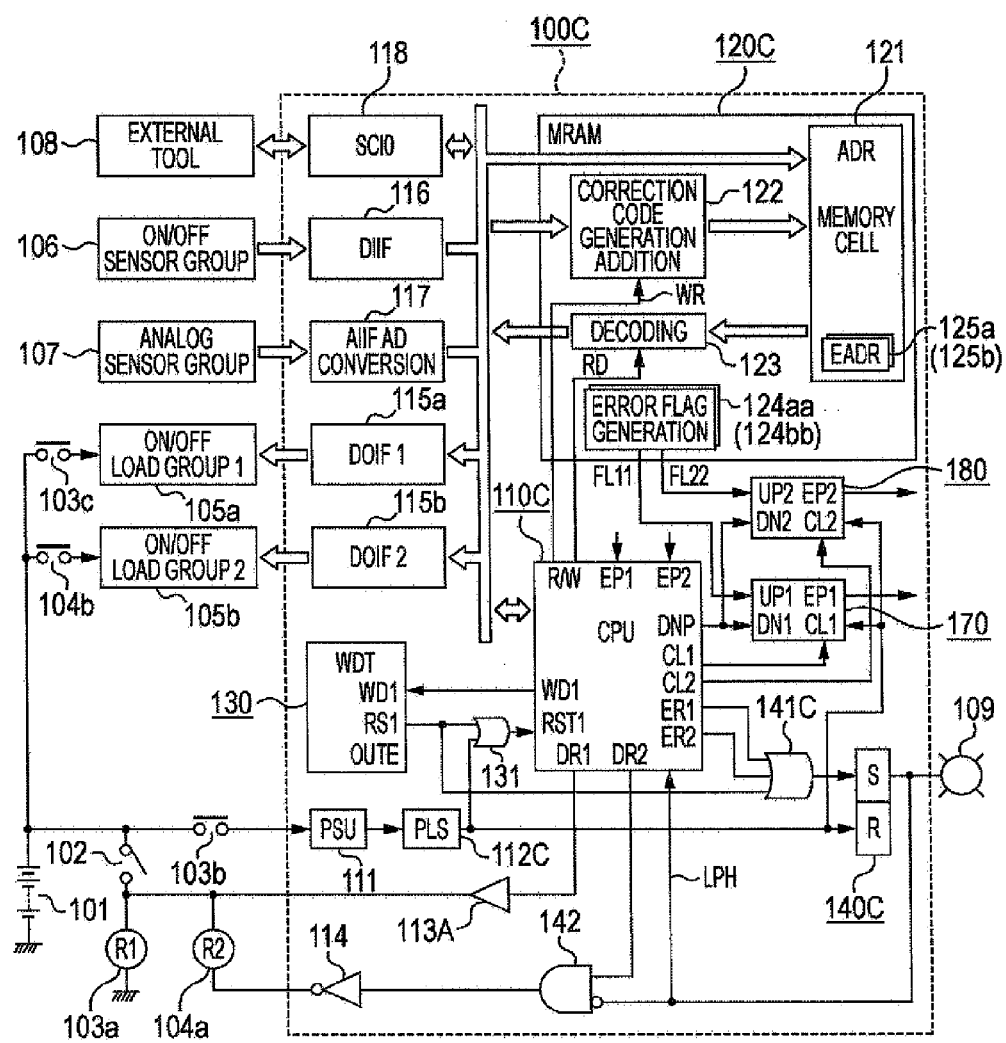
FIG. 9 is a circuit block diagram of a third embodiment device of this invention.

Further, the abnormality generation memory means shown in the counter circuit 140A can be also replaced with a flip flop circuit 140C as shown in FIG. 9.

Further, as shown in FIG. 5, the output allowance signal OUTE generated by the watch dog timer 130 can be also used instead of the electric supply holding command output DR1 for performing a self holding operation of the electric power relay 103a.

Further, the first and second error flags FL1, FL2 are constructed so as to be connected to a normal input terminal of the microprocessor 110A and approximately periodically monitor its operating state. However, each flag signal is supplied to an interruption input terminal of the microprocessor 110A, and is more frequently monitored so that adding or subtracting processing with respect to at least the first and second present value registers 126a, 126b can be performed.

In each of embodiment mode 1 and the other embodiment modes, it can be also set to a mode in which the error register within MRAM is constructed by a shift register of plural stages, and old error data are moved every generation of a new error, and are gradually overflowed and vanished.

Further, at a time point at which the contents of the error register are read out by the microprocessor, the read-out error data are transferred and stored to MRAM of another address area, and can be also practically used as information for generating hysteresis information of abnormality generation.

In each of embodiment mode 1 and the other embodiment modes, in a storing area of the abnormality generating information of MRAM, the data memory area able to freely perform reading and writing is used. The above generation hysteresis information such as classification of the first error or the second error, the error generating address, an accumulating value of an error generating time number, etc. is stored to this storing area.

However, no hysteresis information can be set to be initialized unless a specific password is inputted so as not to carelessly erase the important hysteresis information in an operation of maintaining and inspecting works using the external tool.

(4) Main Points and Features of Embodiment Mode 1

Electricity is supplied from the external electric power source 101 to the electronic controller 100A in accordance with embodiment mode 1 of this invention. The microprocessor 110A for controlling the operations of the electric load groups 105*a*, 105*b* in accordance with an operating situation of input sensor groups 106, 107 is arranged. With respect to the nonvolatile program memory 120A cooperated with the microprocessor, the electronic controller 100A for transferring and writing a control program including a control constant from the external tool 108 is set.

The above microprocessor 110A is operated on the basis of the control program stored to MRAM (Magnetic Random Access Memory) 120A as a nonvolatile program memory able to electrically perform reading and writing. This MRAM is divided into address areas different in the program memory area and the data memory area, and storage is performed. The program memory area is mainly constructed by an input-output control program not rewritten and changed during the operation of the above microprocessor 110A after data are transferred and written from the above external tool 108. The data memory area is rewritten and changed at any time during the operation of the above microprocessor 110A. The above MRAM 120A further includes the correction code adding writing circuit 122, the decoding reading-out circuit 123, the error registers 125*a*, 125*b* arranged in the above data memory area, and the control program. The correction code adding writing circuit 122 is operated in accordance with a writing command signal from the above microprocessor 110A, and writes stored data adding an error correction code to the memory cell 121 of a designation address. The decoding reading-out circuit 123 is operated in accordance with a reading-out command signal from the above microprocessor 110A, and decodes and reads-out the above stored data from the memory cell 121 of the designation address. The control program becomes confirmation reading-out means 203*b*, 303*b*, 403*b*, 413*b* and overlapping abnormality judging means 210*b*, 320*b*, 431, 432 arranged in the above program memory area. Further, the writing command signal from the above microprocessor 110A is constructed so as to be supplied to the above MRAM 120A through the writing inhibition/releasing means 150.

In the above error registers 125*a*, 125*b*, when there is a code error in the stored data of the above memory cell 121, an address number generating the error is stored as error data. The stored error data are error data first generated after these data are reset by the above microprocessor 110A. Otherwise, the stored error data are a memory of a specific address for storing error data sequentially updated if there is a code error with respect to a new address by sequentially reading-out the contents of each address of the above memory cell 121.

The above confirmation reading-out means 203*b*, 303*b*, 403*b*, 413*b* are means operated in accordance with storage of the error data to the above error registers 125*a*, 125*b*, and again reading-out and confirming the contents of the above error registers 125*a*, 125*b* after the error data are reset and the error generating address is then again accessed.

The above overlapping abnormality judging means 210*b*, 320*b*, 431, 432 are means for judging that the contents of a memory of the same address are a continuation abnormality when the contents of the error registers 125*a*, 125*b* read out by the above confirmation reading-out means 203*b*, 303*b*, 403*b*, 413*b* include the same error data.

The above writing inhibition/releasing means 150 inhibits that the writing command signal using the above microprocessor 110A is supplied to the above MRAM with respect to the program memory area of the above MRAM 120A storing the above control program. Further, the writing inhibition/releasing means 150 releases the above writing inhibition function when the external tool 108 is connected to the above microprocessor 110A, and it is a writing state of the control program with respect to the above MRAM 120A. When no external tool 108 is connected, the writing inhibition/releasing means 150 also releases the above writing inhibition function as an exception when the above control program is restored and written. Abnormality processing including at least abnormality notification is executed when the above overlapping abnormality judging means 210*b*, 320*b*, 431, 432 make the abnormality judgment, or is executed in accordance with the execution of abnormality judgments made plural times.

The above MRAM 120A further has correction writing means 208, 418. The above error register generates an error within a bit number of a range able to decode the contents of the above memory cell 121 of a designation address. When the read-out stored data are data restored and corrected by the above decoding reading-out circuit 123, the above error register becomes the first error register 125*a* for locating the address number generating the error at a first specific address stored as first error data. The above confirmation reading-out means is operated in accordance with storage of the first error data to the above first error register 125*a*. The above confirmation reading-out means becomes first confirmation reading-out means 203*b*, 413*b* for again reading-out and confirming the contents of the above first error register 125*a* after the first error data are reset and the error generating address is then again accessed.

The above correction writing means 208, 418 are operated in accordance with the storage of the first error data to the first error register 125*a* as before as a reading-out result using the above first confirmation reading-out means 203*b*, 413*b*. The above correction writing means 208, 418 become restoring writing means for overwriting and storing the stored data of the error generating address read out through the above decoding reading-out circuit 123 to the error generating address of the above MRAM 120A through the above correction code adding writing circuit 122.

The above overlapping abnormality judging means becomes first overlapping abnormality judging means 210*b*, 431 for judging that the contents of a memory of the same address are a continuation abnormality when reading-out confirmation is performed by the above first confirmation reading-out means 203*b*, 413*b*, or when the contents of the above first error register 125*a* again include the same error data in the reading-out confirmation after a correction is written by the above correction writing means 208, 418. The above writing inhibition/releasing means 150 releases the above writing inhibition function at a restoring operation time using the above correction writing means 208, 418.

Accordingly, it is characterized in that influence enlargement of an abnormality can be restrained by temporarily releasing the writing inhibition function and recovering incorrect stored data to normal data.

The above MRAM 120A has the first error flag generating circuit 124*a* in addition to the above first error register 125*a*.

In the above first error flag generating circuit 124*a*, an error is generated within a bit number of a range able to decode the contents of the above memory cell 121 of a designation address. This first error flag generating circuit 124*a* is a logic circuit for generating the first error flag FL1 as binarized logic information when read-out stored data are data restored and corrected by the above decoding reading-out circuit 123.

The above first error flag FL1 is connected to the interruption input terminal of the above microprocessor 110A. The above first confirmation reading-out means 203b, 413b, and the above correction writing means 208, 418 are operated and executed in accordance with the generation of the first error flag FL1, and an overlapping abnormality judgment is made by above first overlapping abnormality judging means 210b, 431. Further, the first error flag FL1 is reset by the above microprocessor 110A.

Accordingly, it is not necessary for the microprocessor to periodically read-out the contents of the first error register and confirm the existence of abnormality generation. After the contents of the first error register are confirmed in accordance with the generation of the first error flag, it is sufficient to write a correction and process the abnormality. Accordingly, it is characterized in that the abnormality is processed without delay, and a control burden of the microprocessor in a normal state can be reduced.

The above MRAM 120A has at least one of the above first error register 125a and the first error flag generating circuit 124a. The above MRAM 120A also has the first scattering abnormality judging means 210a constructed by the first totalizing means 205a, 212 and the first scattering abnormality detecting means 206a operated in accordance with the generation of the first error. The above MRAM 120A further has the abnormality generation memory means 140A.

In the above first error flag generating circuit 124a, an error is generated within a bit number of a range able to decode the contents of the above memory cell 121 of a designation address. The above first error flag generating circuit 124a is a logic circuit for generating the first error flag FL1 as binarized logic information when read-out stored data are data restored and corrected by the above decoding reading-out circuit 123.

The above first error is periodic information relative to the existence of an error detected by periodically monitoring whether the first error data are stored to the above first error register 125a or not, or whether the above first error flag FL1 is generated or not.

The above first totalizing means 205a, 212 have the first present value register 126a, and add or subtract the second variational value $\Delta 2$ with respect to the first present value register 126a in accordance with the generation of the above first error. The above first totalizing means 205a, 212 also reset the above first error register 125a or the first error flag FL1. If no first error is generated, the above first totalizing means 205a, 212 subtract or add the first variational value $\Delta 1$, and make adding and subtracting corrections with respect to the first present value register 126a so as to be mutually lessened. When an unoperating state of the above first error is continued, the above first totalizing means 205a, 212 stop the adding and subtracting corrections using the above first variational value $\Delta 1$ at a predetermined normal side limit value.

The above first scattering abnormality detecting means 206a generates the first abnormality detecting signal ER1 when the value of the above first present value register 126a becomes a value outside the area of a predetermined abnormal side limit value by accumulating the above first and second variational values $\Delta 1, \Delta 2$. The above second variational value $\Delta 2$ is a value greater than the first variational value $\Delta 1$, and is set as a value smaller than an allowance accumulating value as the difference between the above abnormal side limit value and the normal side limit value.

The above abnormality generation memory means 140A performs at least abnormality notification in accordance with the abnormality judgment made by the above first overlapping abnormality judging means 210b, 431, and the abnormality judgment made by the above first scattering abnormality judging means 210a.

Accordingly, when a code error is scatteringly generated at each address of MRAM, it is characterized in that it is not responsive to a temporary noise error operation, and the generation of a scattering abnormality is rapidly detected and abnormality processing can be performed when the abnormality generation is continued.

When reading-out confirmation is performed by the above first confirmation reading-out means 203b, or when an overlapping abnormality again causing the above first error is generated in the reading-out confirmation after a correction is written by the above correction writing means 208, the above first totalizing means 205b adds or subtracts the third variational value $\Delta 3$ as a value of the above second variational value $\Delta 2$ or more with respect to the above first present value register 126a.

Accordingly, it is characterized in that the scattering abnormality judgment and the overlapping abnormality judgment are unified and can be made by monitoring the present value of the first totalizing means.

The above error register generates an error exceeding the bit number of a range able to decode the contents of the above memory cell 121 of the designation address. When read-out stored data are data unable to guarantee whether these read-out stored data are conformed to the stored original data, the above error register becomes the second error register 125b for locating an address number generating the error at a second specific address stored as second error data.

The above confirmation reading-out means is operated in accordance with the storage of the second error data to the above second error register 125b. The above confirmation reading-out means becomes second confirmation reading-out means 303b, 403b for resetting the second error data, and then again getting access to the error generating address, and reading-out and confirming the contents of the above second error register 125b.

When reading-out confirmation is performed by the above second confirmation reading-out means 303b, 403b, the above overlapping abnormality judging means becomes second overlapping abnormality judging means 320b, 432 for judging that the contents of a memory of the same address are a continuation abnormality when the contents of the above second error register 125b include the same error data.

Accordingly, when a code error is generated in the read-out data, it is confirmed by reconfirmation reading-out whether this code error is not generated by a temporary noise error operation. If normal reading-out is performed by a result of the reconfirmation, control is safely continued. In contrast to this, if it is a reconfirmation abnormality, it is characterized in that abnormality processing can be rapidly executed.

The above MRAM 120A has the second error flag generating circuit 124b in addition to the above second error register 125b.

The above second error flag generating circuit 124b generates an error exceeding the bit number of a range able to decode the contents of the above memory cell 121 of the designation address. The above second error flag generating circuit 124b is a logic circuit for generating the second error flag FL2 as binarized logic information when read-out stored data are data unable to guarantee whether these read-out stored data are conformed to the stored original data.

The above second error flag FL2 is connected to the interruption input terminal of the above microprocessor 110A. The above second confirmation reading-out means 303b, 403b are operated and executed in accordance with generation of the second error flag FL2. An overlapping abnormality judgment using the above second overlapping abnormality judging means 320b, 432 is made. Further, the second error flag FL2 is reset by the above microprocessor 110A.

Accordingly, it is not necessary for the microprocessor to periodically read-out the contents of the second error register and confirm the existence of abnormality generation. It is sufficient to make the abnormality judgment after the contents of the second error register are confirmed in accordance with the generation of the second error flag. Accordingly, it is characterized in that abnormality processing is performed without delay, and a control burden of the microprocessor in a normal state can be reduced.

The above MRAM 120A has at least one of the above second error register 125b and the second error flag generating circuit 124b. Further, the above MRAM 120A has a second scattering abnormality judging means 320a constructed by second totalizing means 305a, 312 operated in accordance with the generation of the second error and also constructed by second scattering abnormality detecting means 306a. The above MRAM 120A further has the abnormality generation memory means 140A.

The above second error flag generating circuit 124b generates an error exceeding the bit number of a range able to decode the contents of the above memory cell 121 of the designation address. The above second error flag generating circuit 124b is a logic circuit for generating the second error flag FL2 as binarized logic information when read-out stored data are data unable to guarantee whether the read-out stored data are conformed to the stored original data.

The second error is periodic information relative to the existence of an error detected by periodically monitoring whether the second error data are stored to the above second error register 124b or not, or whether the above second error flag FL2 is generated or not.

The above second totalizing means 305a, 312 have the second present value register 126b, and add or subtract the fifth variational value Δ5 with respect to the second present value register 126b in accordance with the generation of the above second error. The above second totalizing means 305a, 312 also reset the above second error register 125b or the second error flag FL2. Further, if no second error is generated, the second totalizing means 305a, 312 subtract or add the fourth variational value Δ4 and make adding and subtracting corrections with respect to the second present value register 126b so as to be mutually lessened. When an unoperating state of the above second error is continued, the second totalizing means 305a, 312 stop the adding and subtracting corrections using the above fourth variational value Δ4 at a predetermined normal side limit value.

The above second scattering abnormality detecting means 306a is a means for generating the second abnormality detecting signal ER2 when the value of the above second present value register 126b becomes a value outside the area of a predetermined abnormal side limit value by accumulating the above fourth and fifth variational values Δ4, Δ5. The above fifth variational value Δ5 is a value greater than the fourth variational value Δ4, and is set as a value smaller than an allowance accumulating value as the difference between the above abnormal side limit value and the normal side limit value.

The above abnormality generation memory means 140A becomes a means for performing at least abnormality notification in accordance with the abnormality judgment made by the above second overlapping abnormality judging means 320b, 432, and the abnormality judgment made by the above second scattering abnormality judging means 306a.

Accordingly, when a code error is scatteringly generated at each address of MRAM, it is characterized in that it is not responsive to a temporary noise error operation, and the generation of a scattering abnormality is rapidly detected and abnormality processing can be performed when the abnormality generation is continued.

The above second totalizing means 305b adds or subtracts the sixth variational value Δ6 as a value of the above fifth variational value Δ5 or more with respect to the above second present value register 126b at a generating time of an overlapping abnormality again causing the above second error even when reading-out confirmation is performed by the above second confirmation reading-out means 303b.

Accordingly, it is characterized in that the scattering abnormality judgment and the overlapping abnormality judgment are unified and can be made by monitoring the present value of the second totalizing means.

The above MRAM 120A further includes a control program as third abnormality judging means 433, and has abnormality generation memory means 140A.

The above third abnormality judging means 433 is a means for sequentially reading-out stored data of a specific interval area of the above MRAM 120A, and judging the existence of a code error by the sum check or the CRC check relative to data of an entire reading-out interval.

The above abnormality generation memory means 140A becomes a means for performing at least abnormality notification in accordance with the abnormality judgment made by the above overlapping abnormality judging means 210b, 320b, 431, 432, and the abnormality judgment made by the above third abnormality judging means 431.

In the code error detection-correction function built in MRAM, it is possible to make the abnormality judgment with respect to only an address accessed for a control operation of the present time point, and no inspection is made with respect to an address not relative to the present control.

In contrast to this, the third abnormality inspecting means inspects all data of a specific address interval of MRAM irrespective of the present control operation, and can inspect all the data of MRAM while this specific interval is sequentially changed. Accordingly, it is characterized in that safety of control is further raised.

The above MRAM 120A further includes a control program as the inspecting period judging means 401 for selecting one of an operation start inspecting means, a constant period inspecting means and a before-stoppage inspecting means. The above operation start inspecting means is a specific inspecting means for inspecting the existence of a code error by the above overlapping abnormality judging means 431, 432 or the above third abnormality judging means 433 with respect to main data of a specific area stored to the above MRAM 120A just after the electric power switch 102 is turned on.

The above constant period inspecting means is a dividing update inspecting means for dividing all data stored to the above MRAM 120A into plural portions in a turning-on continuing state of the electric power switch 102, and sequentially periodically inspecting the existence of a code error by the above overlapping abnormality judging means 431, 432 or the above third abnormality judging means 433 with respect to each divided data.

The above before-stoppage inspecting means is a collective inspecting means for inspecting the existence of a code error by the above overlapping abnormality judging means 431, 432 or the above third abnormality judging means 433 with respect to all data stored to the above MRAM 120A in a closing period of the delay return opening-closing element 103b just after the electric power switch 102 is interrupted. Accordingly, it is characterized in that a specific inspection, a dividing update inspection and a collective inspection are made in accordance with an inspecting period, and the burden of the microprocessor can be reduced.

The above microprocessor 110A controls the operation of at least an intake air amount control means or a fuel injection control means in accordance with an operating state of vehicle mounting sensor groups 106, 107 for detecting an operating state of a vehicle mounting engine. The above MRAM 120A further includes a control program as an escaping operation means in addition to the control program as a normal operation means, and also has the abnormality generation memory means 140A. The above escaping operation means is a means for executing operation control for restraining an engine rotating speed by the restriction of an intake air amount using the above intake air amount control means or the restriction of a fuel supply amount using the fuel injection control means.

The above abnormality generation memory means 140A notifies an abnormality in accordance with the abnormality judgment made by at least the above overlapping abnormality judging means 210b, 320b, 431, 432, and selectively switches operating modes from a normal operation mode using the above normal operation means to an escaping operation mode using the above escaping operation means.

Accordingly, the escaping operation using a limited function is performed even when an abnormality is generated in MRAM and no operation control of a high degree can be performed. Thus, it is characterized in that safety of a vehicle operation can be maintained.

The above MRAM 120A further includes a control program as correction transfer means 427. The above microprocessor 110A has a nonvolatile backup memory 161A storing the control program as the above escaping operation means.

The above correction transfer means 427 is a restoring writing means for overwriting and storing an escaping operation program stored to the above backup memory 161A to an error generating address of the above MRAM 120A through the above correction code adding writing circuit 122 in accordance with the abnormality judgment made by the above overlapping abnormality judging means 432.

The above writing inhibition/releasing means 150 releases the above writing inhibition function at a restoring operation time using the above correction transfer means 427.

Accordingly, when an abnormality is generated in an escaping operation control program stored to a specific area of MRAM, it is characterized in that the contents of the backup memory are transferred and written to MRAM and an escaping operation can be performed.

The watch dog timer 130 and the abnormality generation memory means 140A are used together in the above microprocessor 110A.

The watch dog timer 130 is a timer circuit for generating the reset pulse signal RS1 in accordance with the matter that the pulse width of the watch dog clear signal WD1 generated by the above microprocessor 110A exceeds a predetermined value, and initializing and restarting the microprocessor 110A.

The above abnormality generation memory means 140A is operated in accordance with the generation of abnormality detecting pulse signals ER1, ER2 caused by judging abnormality generation by the above overlapping abnormality judging means 210b, 320b, 431, 432, and the reset pulse signal RS1 using the above watch dog timer 130. The above abnormality generation memory means 140A performs at least abnormality notification in accordance with the generation of the pulse signal of one time or pulse signals of plural times. Further, the above abnormality generation memory means 140A is a logic circuit constructed by a flip flop circuit or a counter circuit for selectively switching operating modes from the normal operation mode using the above normal operation means to the escaping operation mode using the above escaping operation means. A driving stopping means 142 and a memory releasing means 112A are added to the logic circuit.

The above driving stopping means 142 is operated when the above abnormality generation memory means 140A decides and stores abnormality generation. The above driving stopping means 142 is a gate circuit for inhibiting driving of a partial specific electric load within the above electric load groups 105a, 105b.

The above memory releasing means 112A becomes a means for resetting an abnormality memory signal using the above abnormality generation memory means 140A by a reset pulse signal operated in accordance with a manual operation using re-turning-on of the electric power switch 102, etc.

Accordingly, when an abnormality generating cause is a temporary cause due to a noise error operation, it is characterized in that it can be normally recovered by again turning-on the electric power switch.

Embodiment Mode 2 of the Invention (1) Detailed Explanation of Construction

FIG. 5 showing a circuit block diagram of a second embodiment device of this invention will be explained with points different from those of FIG. 1 as a center.

In each figure, common reference numerals show the same or corresponding portions.

In FIG. 5, an external electric power source 101, an electric power relay and a load electric power relay are arranged in the exterior of an electronic controller 100B. A first electric load group 105a, a second electric load group 105b, an opening-closing sensor group 106, an analog sensor group 107, an external tool 108 and an alarm indicator 109 are connected. Electricity is supplied to the first electric load group 105a from a microprocessor 110B described later through a first output interface circuit 115a so that the first electric load group 105a is operated. Electricity is supplied to the second electric load group 105b through a second output interface circuit 115b so that the second electric load group 105b is operated. A signal is inputted to the opening-closing sensor group 106 through an input interface circuit 116. A signal is inputted to the analog sensor group 107 through an analog input interface circuit 117. The external tool 108 is connected through a serial interface circuit 118. The alarm indicator 109 is operated from a comparison output terminal OUT of a counter circuit 140B as an abnormality generation memory means.

As the internal construction of the electronic controller 100B, the microprocessor 110B is bus-connected to MRAM 120B as a nonvolatile program memory, and is serially connected to a cooperating auxiliary CPU 160. The auxiliary CPU 160 has an auxiliary program memory 161B using a mask ROM memory, etc.

The microprocessor 110B is operated by a stabilizing voltage generated by a control electric power source unit 111 to which electricity is supplied from an output contact 103b of the electric power relay. Energization with respect to a magnetizing coil 103a of the electric power relay is continued through a driving circuit element 113B by an output allowance signal OUTE described later. A reset pulse generating circuit 112B generates a reset pulse signal at a turning-on time point of the electric power switch 102, and initializes the microprocessor 110B through a logical sum element 131 described later, and also initializes a counter circuit 140B as an abnormality generation memory means described later.

MRAM 120B is divided into address areas different in a program memory area and a data memory area, and storage is performed. The program memory area is mainly constructed by an input-output control program not rewritten and changed during the operation of the microprocessor 110B after data are transferred and written from the external tool 108. The data memory area is rewritten and changed at any time during the operation of the microprocessor 110B.

MRAM 120B further includes a correction code adding writing circuit 122, a decoding reading-out circuit 123, first and second error flag generating circuits 124a, 124b, first and second error registers 125a, 125b arranged in the above data memory area, a common use present value register 126, and a control program as a confirmation reading-out means and an overlapping abnormality judging means described later and arranged in the above program memory area. The correction code adding writing circuit 122 writes stored data adding an error correction code to the memory cell 121 of a designation address in accordance with a writing command signal from the microprocessor 110B. The decoding reading-out circuit 123 decodes and reads-out the above stored data from the memory cell 121 of the designation address in accordance with a reading-out command signal from the microprocessor 110B. The writing command signal from the microprocessor 110B is constructed so as to be supplied to MRAM 120B through a writing inhibition/releasing means 150.

It is convenient if the first error flag generating circuit 124a is arranged. However, even when there is no first error flag generating circuit 124a, it is possible to know whether a first error is generated by confirming the contents of the first error register 125a.

Similarly, it is convenient if the second error flag generating circuit 124b is arranged. However, even when there is no second error flag generating circuit 124b, it is possible to know whether a second error is generated by confirming the contents of the second error register 125b.

However, this embodiment mode 2 has at least one of the first error flag generating circuit 124a and the first error register 125a, at least one of the second error flag generating circuit 124b and the second error register 125b, and at least one of the first error register 125a and the second error register 125b. In the common use present value register 126, first and second present value registers 126a, 126b in embodiment mode 1 are intensively set to one present value register.

A watch dog timer 130 monitors a watch dog clear signal WD1 as a pulse series signal generated by the microprocessor 110B. When the pulse width of the watch dog clear signal WD1 exceeds a predetermined threshold value, the watch dog timer 130 generates a reset pulse signal RS1, and supplies the reset pulse signal RS1 to a reset input terminal RST1 of the microprocessor 110B through a logical sum element 131, and initializes and restarts the microprocessor 110B.

Further, the reset pulse signal RS1 is supplied to a counting input terminal UP of the counter circuit 140B as an abnormality generation memory means described later through a logical sum element 141B.

The watch dog timer 130 generates an output allowance signal OUTE when the pulse width of the watch dog clear signal WD1 is normal. Thus, it is possible to generate outputs of the first and second output interface circuits 115a, 115b.

Further, a magnetizing coil 103a of the electric power relay is personally held and operated through a driving circuit element 113B.

The counter circuit 140B as an abnormality generation memory means counts a generation time number of a logical sum output signal of the logical sum element 141B. First and second abnormality detecting signals ER1, ER2 generated by the microprocessor 110B, a reset pulse signal RS2 described later, a reset pulse signal RS1 generated by the watch dog timer 130, and an abnormality detecting signal ERS generated by the auxiliary CPU 160 are supplied to an input terminal of the logical sum element 141B.

A gate circuit 142 as a driving stopping means is connected between a load electric supply command output DR2 generated by the microprocessor 110B and an inversion driving circuit element 114. The gate circuit 142 energizes the magnetizing coil 104a of the load electric power relay when the load electric supply command output DR2 is "H" in logic level. However, the magnetizing coil 104a is de-energized when the logic level of a comparison output terminal OUT of the counter circuit 140B becomes "H".

Further, in such an abnormality deciding state, a mode switching command signal LPH is supplied to the microprocessor 110B.

The auxiliary CPU 160 is serially connected to the microprocessor 110B as a main CPU, and monitors an operating state of the microprocessor 110B, and generates an abnormality detecting signal ERS at an abnormality generating time.

Signals of one portion of an opening-closing sensor 106 as an input sensor group and one portion of an analog sensor 107 are inputted to the auxiliary CPU 160 side, and a signal is serially transmitted from the auxiliary CPU 160 to the microprocessor 110B.

Further, the microprocessor 110B monitors the pulse width of a watch dog clear signal WD2 as a pulse series generated by the auxiliary CPU 160. When the pulse width exceeds a predetermined threshold value, the microprocessor 110B generates a reset pulse signal RS2 and initializes and restarts the auxiliary CPU 160.

A backup memory area is arranged in an auxiliary program memory 161B storing a control program of the auxiliary CPU 160. An escaping operation program for the microprocessor 110B is stored to the backup memory area. When an abnormality is generated in the escaping operation program as an important control program within the memory cell 121, the contents of the backup memory area are transferred to the memory cell 121.

(2) Detailed Explanation of Action and Operation

In the second embodiment device of this invention constructed as shown in FIG. 5, when the electric power switch 102 is closed, the output contact 103b of the electric power relay is closed and electricity is supplied from the external electric power source 101 to the control electric power source unit 111. Thus, a stabilized control electric power source voltage Vcc is generated and the microprocessor 110B and the counter circuit 140B are initialized by a reset pulse signal generated by the reset pulse generating circuit 112B. Thereafter, the microprocessor 110B begins to be operated, and generates a watch dog clear signal WD1.

At a first time electric supply time before a control program is stored to MRAM 120B, the control program is transferred from the external tool 108 to MRAM 120B on the basis of a boot program stored to MRAM 120B in advance.

When the control program is written by the external tool 108, both the logic levels of a tool connecting signal TOOL and an uppermost order address signal A15 become "H". As its result, a writing command signal WR of the microprocessor 110B is supplied to MRAM 120B as a writing command input WRM as it is.

On the other hand, when the electric power switch 102 is closed after the control program is stored to MRAM 120B, the microprocessor 110B and the counter circuit 140B are initialized and the microprocessor 110B then begins to be operated. The microprocessor 110B then generates a watch dog clear signal WD1 and a load electric supply command output DR2, and the magnetizing coil 104a of the load electric power relay is energized.

In this state, the tool connecting signal TOOL becomes "L" in logic level. As its result, with respect to the program memory area in which the logic level of the uppermost order address signal A15 becomes "H" together, no writing command signal WR is supplied to MRAM 120B even if the logic level of the writing command signal WR becomes "H".

However, the writing command signal WR becomes valid with respect to the data memory area in which the logic level of the upper order address signal A15 becomes "L" together. Further, a rewriting correction command signal WRC described later always becomes valid irrespective of the memory area.

The microprocessor 110B controls the operations of first and second electric load groups 105a, 105b in accordance with the voltage level of an analog signal obtained from the analog sensor group 107, an operating state of an ON/OFF signal obtained from the opening-closing sensor group 106, a partial input signal transmitted from the auxiliary CPU 160, and an input-output control program stored to the memory cell 121 of MRAM 120B.

A counting input signal is supplied to a counting input terminal UP of the counter circuit 140B through a logical sum element 141B when the first and second abnormality detecting signals ER1, ER2 generate an abnormality detecting pulse signal by a noise error operation, etc. during the operation of the microprocessor 110B, and a reset pulse signal RS2 with respect to the auxiliary CPU 160 is generated, and the watch dog timer 130 generates a reset pulse signal RS1, and the auxiliary CPU 160 generates an abnormality detecting signal ERS. The counter circuit 140B counts an abnormality generation time number. When this abnormality generation time number exceeds a predetermined value, the counter circuit 140B is counted up and the logic level of a comparison output terminal OUT becomes "H".

As its result, the alarm indicator 109 is operated and the load electric supply command output DR2 is interrupted by the gate circuit 142, and the magnetizing coil 104a of the load electric power relay is de-energized. A mode switching command signal LPH is supplied to the microprocessor 110B.

As its result, the microprocessor 110B proceeds to an escaping operation mode for restraining an engine rotating speed.

When the electric power switch 102 is opened during the operation of the microprocessor 110B, energization with respect to magnetizing coils 103a, 104a is continued by the output allowance signal OUTE and the driving circuit element 113B. The microprocessor 110B executes confirmation storage of learning memory information, etc., and then personally stops the watch dog clear signal WD1. As its result, the output allowance signal OUTE is stopped and the magnetizing coil 103a is de-energized.

When the electric power switch 102 is again turned on, the microprocessor 110B and the counter circuit 140B are initialized by the reset pulse generating circuit 112B. Accordingly, when the counter circuit 140B is counted up by a noise error operation, it is recovered to a normal operating state.

However, when first and second abnormality detecting signals ER1, ER2 and reset pulse signal RS2 are generated by an abnormality of hardware of MRAM 120B and others, or reset pulse signal RS1 is generated by the watch dog timer 130 and abnormality detecting signal ERS is generated by the auxiliary CPU 160, the counter circuit 140B again counts these abnormal signals and rapidly performs abnormality notification, stoppage of the load electric power relay, etc.

Figure 6:
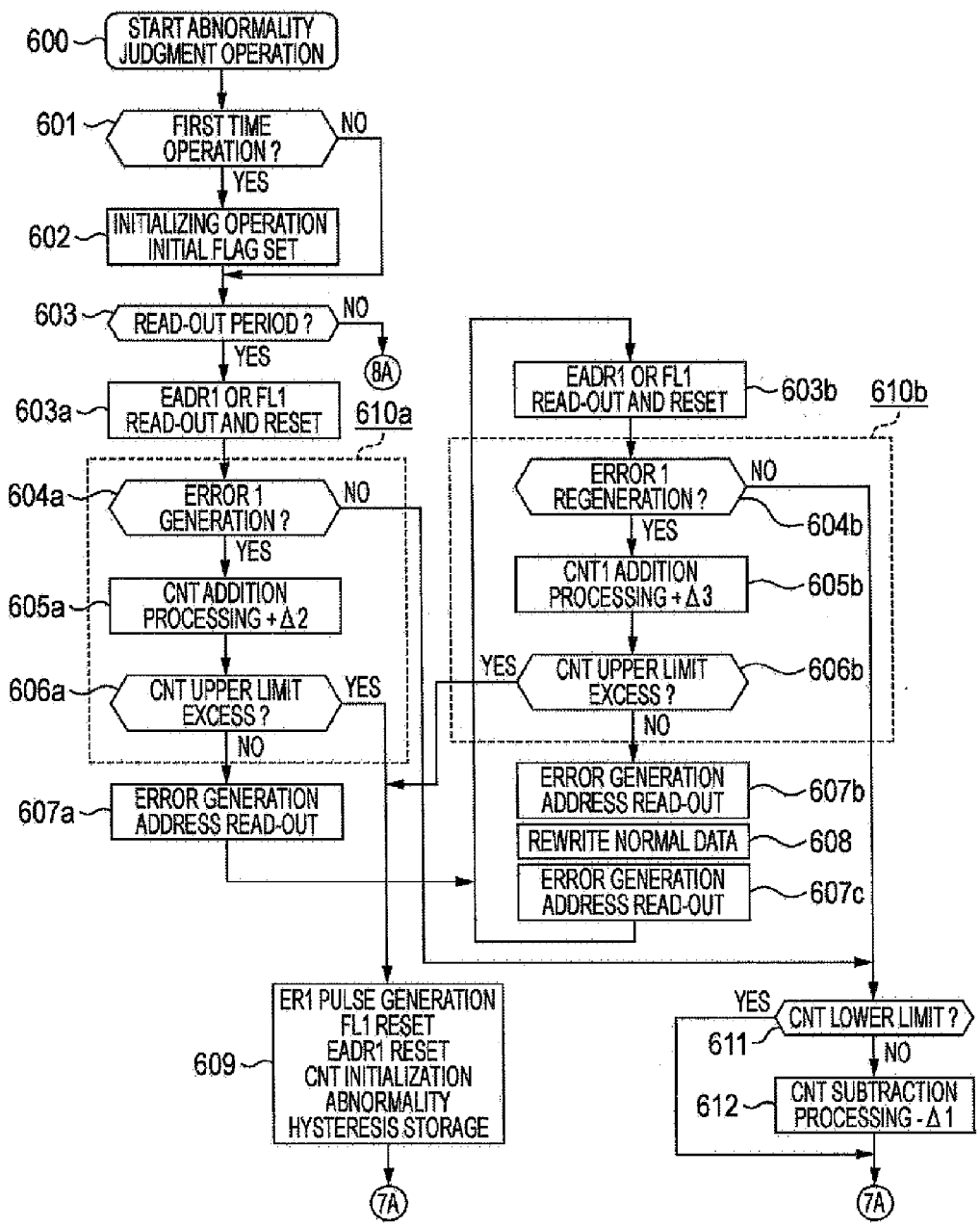
FIG. 6 is a flow chart for explaining an operation relative to a first abnormality judgment in FIG. 5.
Figure 7:
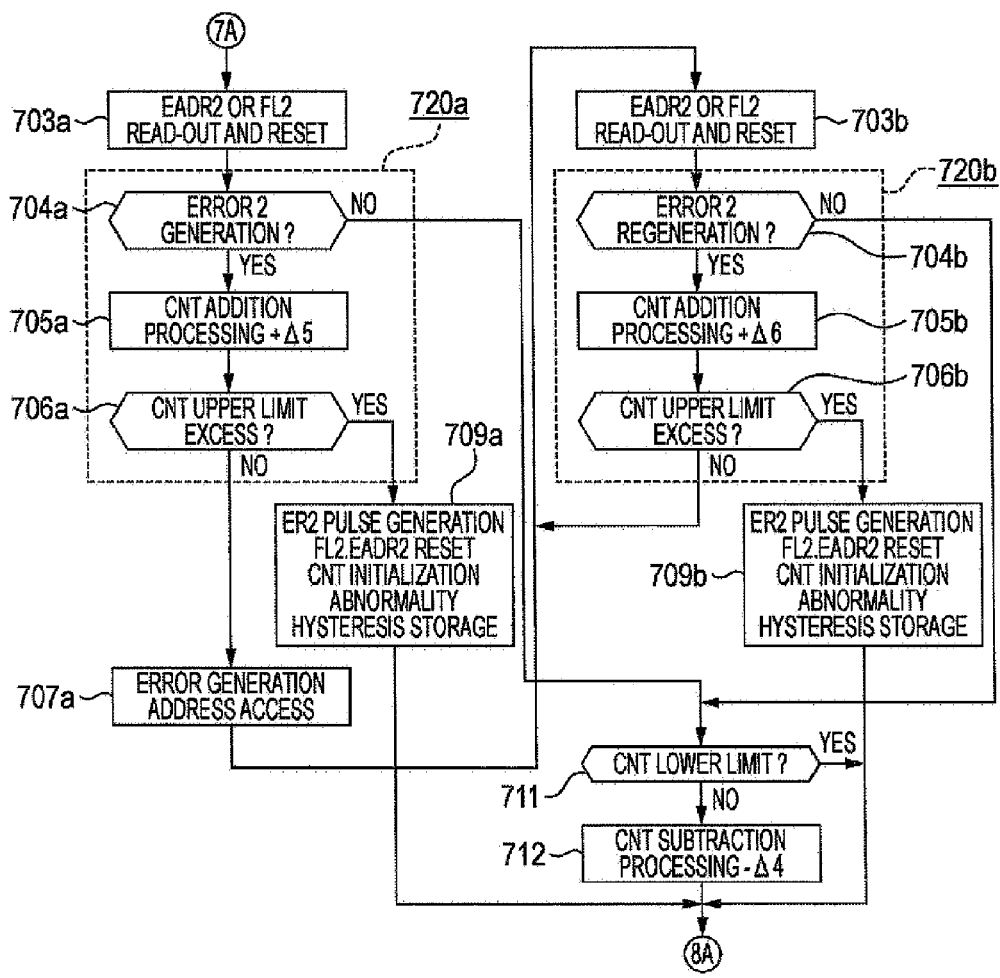
FIG. 7 is a flow chart for explaining an operation relative to a second abnormality judgment in FIG. 5.
Figure 8:
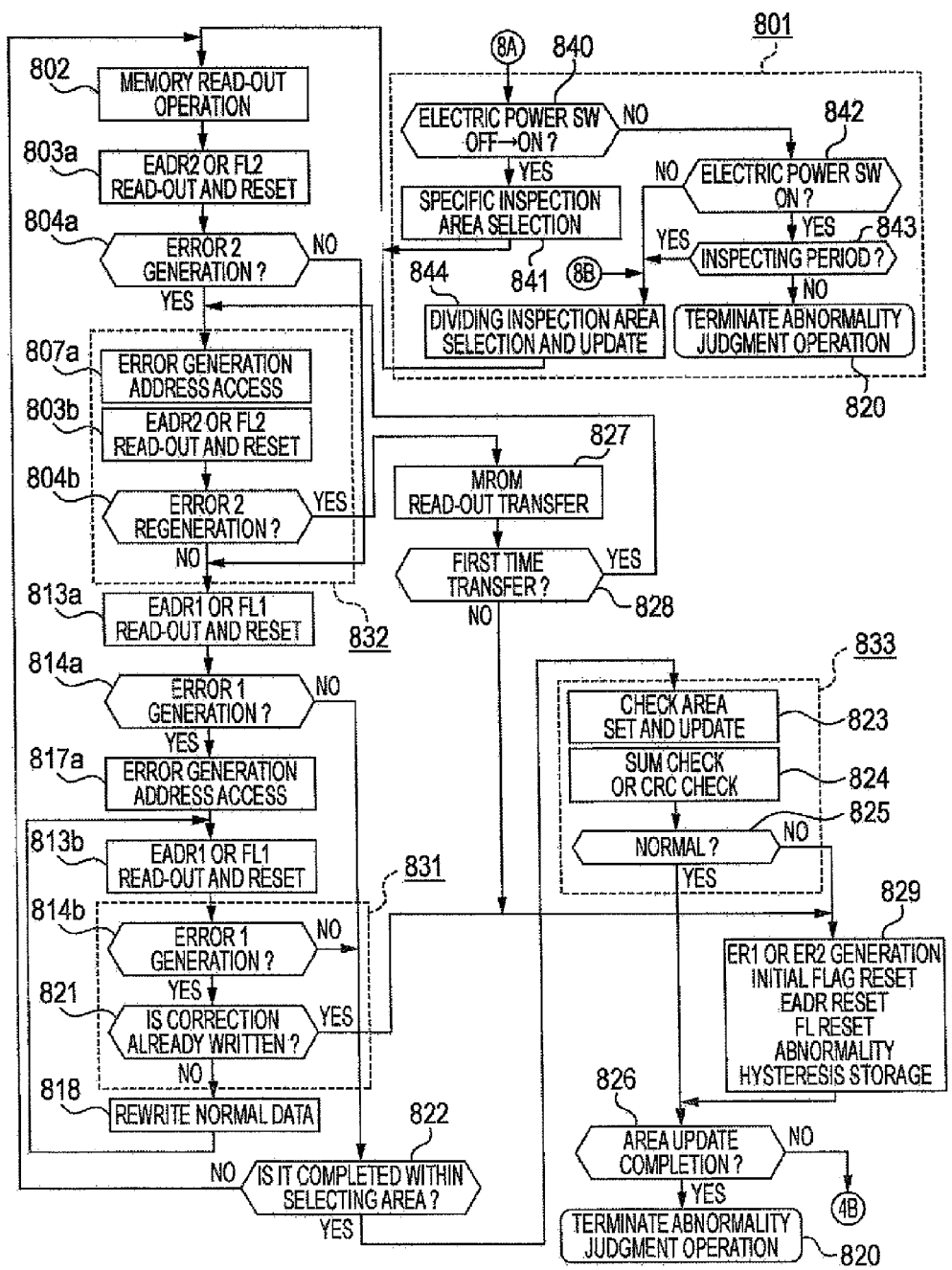
FIG. 8 is a flow chart for explaining an operation relative to an inspecting operation in FIG. 5.

Next, FIG. 6 as a flow chart for explaining an operation relative to a first abnormality judgment in FIG. 5, FIG. 7 as a flow chart for explaining an operation relative to a second abnormality judgment, and FIG. 8 as a flow chart for explaining an operation relative to an inspecting operation will be explained with points different from those of FIGS. 2, 3 and 4 as a center. The operations of FIGS. 6, 7 and 8 are the same as the operations of FIGS. 2, 3 and 4 except for the following specific processes. The level of 200 in reference numeral is merely replaced with the level of 6, and the level of 300 in reference numeral is merely replaced with the level of 700, and the level of 400 in reference numeral is merely replaced with the level of 800.

Processes 605a, 605b, 612 in FIG. 6 and processes 705a, 705b, 712 in FIG. 7 become common use totalizing means. In these common use totalizing means 605a, 605b, 612, 705a, 705b, 712, adding and subtracting corrections with respect to a common use present value register 126 are made.

Accordingly, in processes 606a, 606b in FIG. 6 and processes 706a, 706b in FIG. 7, it is judged whether the present value of the common use present value register 126 exceeds a predetermined threshold value. In process 609 in FIG. 6 and processes 709a, 709b in FIG. 7, an initial value is transferred to the common use present value register 126.

It is not necessary to particularly distinguish a first abnormality detecting signal ER1 and a second abnormality detecting signal ER2. However, these signals are divided and expressed for convenience.

Process 827 of FIG. 8 corresponds to a correction transfer means. The correction transfer means 827 becomes a restoring writing means for overwriting and storing an escaping operation program stored to the backup memory area of the auxiliary program memory 161B to an error generating address of MRAM 120B through the correction code adding writing circuit 122 in accordance with an abnormality judgment made by an overlapping abnormality judging means 832. In embodiment mode 2 having the auxiliary CPU 160, the common use totalizing means may be also divided into first and second totalizing means as in embodiment mode1. Further, the counter circuit 140B as an abnormality generation memory means can be also set to a flip flop circuit 140C as shown in FIG. 9.

(3) Explanation of Other Embodiment Modes

In the first and second embodiment devices of this invention constructed as shown in FIGS. 1 and 5, the totalizing means of an error generating state makes the adding or subtracting calculation of the present value register on the basis of periodic information relative to the existence of error generation. However, it can be also schematically set to an adding counter or a subtracting counter counted by the microprocessor.

For example, the present value register may be arithmetically added in accordance with the error generation, and an abnormality detecting output may be generated when the counting present value exceeds a predetermined set threshold value. Further, the present value may be also initialized to zero by a frequency dividing signal of a reading-out command signal with respect to MRAM or a predetermined period clock signal.

Further, the present value register may be arithmetically subtracted from a predetermined value in accordance with the error generation, and an abnormality detecting output may be generated when the counting present value reaches zero. Further, the present value may be also initialized and set to a predetermined initial value by the frequency dividing signal of a reading-out command signal with respect to MRAM or a clock signal of a predetermined period.

In the case of embodiment modes 1 and 2, the error flag generated by MRM is reset by the microprocessor at a time point read out by the microprocessor. However, the error flag may be also automatically reset by MRAM after a predetermined time.

In embodiment modes 1 and 2, when the first and second error flags FL1, FL2 are connected to the interruption input terminal of the microprocessor, and error flags FL1, FL2 are connected to the interruption input terminal of the microprocessor, and a totalizing adding calculation (or subtracting calculation) using the first and second totalizing means is made in accordance with the generation of an error flag, it is preferable to periodically make the subtracting calculation (or adding calculation) or perform initialization by the frequency dividing signal of the reading-out command signal with respect to MRAM, or the clock signal of a predetermined period. In the case of embodiment modes 1 and 2, it is also possible to perform the adding calculation or subtraction calculation processing with respect to the totalizing means of error generation in accordance with a judging result of the existence of an error of a code provided by a third abnormality judgment. Thus, the third abnormality judging means makes the abnormality judgment so that the abnormality is immediately notified and generation of confusion is avoided and the abnormality can be notified by reconfirmation.

(4) Main Points and Characters of Embodiment Mode 2

Electricity is supplied from the external electric power source 101 to the electronic controller 100B in accordance with embodiment mode 2 of this invention. The electronic controller 100B has the microprocessor 110B for controlling the operations of electric load groups 105a, 105b in accordance with an operating situation of input sensor groups 106, 107. With respect to a nonvolatile program memory cooperated with the microprocessor, a control program including a control constant is transferred and written from the external tool 108.

The above microprocessor 110B is operated on the basis of the control program stored to MRAM (Magnetic Random Access Memory) 120B as a nonvolatile program memory able to electrically perform reading and writing. This MRAM is divided into address areas different in the program memory area and the data memory area, and storage is performed. The program memory area is mainly constructed by an input-output control program not rewritten and changed during the operation of the above microprocessor 110B after data are transferred and written from the above external tool 108. The data memory area is rewritten and changed at any time during the operation of the above microprocessor 110B. The above MRAM 120B further includes the correction code adding writing circuit 122, the decoding reading-out circuit 123, the error registers 125a, 125b arranged in the above data memory area, and the control program. The correction code adding writing circuit 122 is operated in accordance with a writing command signal from the above microprocessor 110B, and writes stored data adding an error correction code to the memory cell 121 of a designation address. The decoding reading-out circuit 123 is operated in accordance with a reading-out command signal from the above microprocessor 110B, and decodes and reads-out the above stored data from the memory cell 121 of the designation address. The control program becomes confirmation reading-out means 603b, 703b, 803b, 813b and overlapping abnormality judging means 610b, 720b, 831, 832 arranged in the above program memory area. Further, the writing command signal from the above microprocessor 110B is constructed so as to be supplied to the above MRAM 120B through the writing inhibition/releasing means 150.

In the above error registers 125a, 125b, when there is a code error in the stored data of the above memory cell 121, an address number generating the error is stored as error data. The stored error data are error data first generated after these data are reset by the above microprocessor 110B. Otherwise, the stored error data are a memory of a specific address for storing error data sequentially updated if there is a code error with respect to a new address by sequentially reading-out the contents of each address of the above memory cell 121.

The above confirmation reading-out means 603b, 703b, 803b, 813b are means operated in accordance with storage of the error data to the above error registers 125a, 125b, and again reading-out and confirming the contents of the above error registers 125a, 125b after the error data are reset and the error generating address is then again accessed.

The above overlapping abnormality judging means 610b, 720b, 831, 832 are means for judging that the contents of a memory of the same address are a continuation abnormality when the contents of the error registers 125a, 125b read out by the above confirmation reading-out means 603b, 703b, 803b, 813b include the same error data.

The above writing inhibition/releasing means 150 inhibits that the writing command signal using the above microprocessor 110B is supplied to the above MRAM 120B with respect to the program memory area of the above MRAM 120B storing the above control program. Further, the writing inhibition/releasing means 150 releases the above writing inhibition function when the external tool 108 is connected to the above microprocessor 110B, and it is a writing state of the control program with respect to the above MRAM 120B. When no external tool 108 is connected, the writing inhibition/releasing means 150 also releases the above writing inhibition function as an exception when the above control program is restored and written.

Abnormality processing including at least abnormality notification is executed when the above overlapping abnormality judging means 610b, 720b, 831, 832 make the abnormality judgment, or is executed in accordance with the execution of abnormality judgments made plural times.

The above MRAM 120B further has correction writing means 608, 818.

The above error register generates an error within a bit number of a range able to decode the contents of the above memory cell 121 of a designation address. When the read-out stored data are data restored and corrected by the above decoding reading-out circuit 123, the above error register becomes the first error register 125a for locating the address number generating the error at a first specific address stored as first error data.

The above confirmation reading-out means is operated in accordance with storage of the first error data to the above first error register 125a. The above confirmation reading-out means becomes first confirmation reading-out means 603b, 813b for again reading-out and confirming the contents of the above first error register 125a after the first error data are reset and the error generating address is then again accessed.

The above correction writing means 608, 818 are operated in accordance with the storage of the first error data to the first error register 125a as before as a reading-out result using the above first confirmation reading-out means 603b, 813b. The above correction writing means 608, 818 become restoring writing means for overwriting and storing the stored data of the error generating address read out through the above decoding reading-out circuit 123 to the error generating address of the above MRAM 120A through the above correction code adding writing circuit 122.

The above overlapping abnormality judging means becomes first overlapping abnormality judging means 610b, 831 for judging that the contents of a memory of the same address are a continuation abnormality when reading-out confirmation is performed by the above first confirmation reading-out means 603b, 813b, or when the contents of the above first error register 125a again include the same error data in the reading-out confirmation after a correction is written by the above correction writing means 608, 818.

The above writing inhibition/releasing means 150 releases the above writing inhibition function at a restoring operation time using the above correction writing means 608, 818.

The above MRAM 120B has the first error flag generating circuit 124a in addition to the above first error register 125a.

In the above first error flag generating circuit 124a, an error is generated within a bit number of a range able to decode the contents of the above memory cell 121 of a designation address. This first error flag generating circuit 124a is a logic circuit for generating the first error flag FL1 as binarized logic information when read-out stored data are data restored and corrected by the above decoding reading-out circuit 123.

The above first error flag FL1 is connected to the interruption input terminal of the above microprocessor 110B. The above first confirmation reading-out means 603b, 813b, and the above correction writing means 608, 818 are operated and executed in accordance with the generation of the first error flag FL1, and an overlapping abnormality judgment is made by above first overlapping abnormality judging means 610b, 831. Further, the first error flag FL1 is reset by the above microprocessor 110B.

The above error register generates an error exceeding the bit number of a range able to decode the contents of the above memory cell 121 of the designation address. When read-out stored data are data unable to guarantee whether these read-out stored data are conformed to the stored original data, the above error register becomes the second error register 125b for locating an address number generating the error at a second specific address stored as second error data.

The above confirmation reading-out means is operated in accordance with the storage of the second error data to the above second error register 125b. The above confirmation reading-out means becomes second confirmation reading-out means 703b, 803b for resetting the second error data, and then again getting access to the error generating address, and reading-out and confirming the contents of the above second error register 125b.

When reading-out confirmation is performed by the above second confirmation reading-out means 703b, 803b, the above overlapping abnormality judging means becomes second overlapping abnormality judging means 720b, 832 for judging that the contents of a memory of the same address are a continuation abnormality when the contents of the above second error register 125b include the same error data.

The above MRAM 120B has the second error flag generating circuit 124b in addition to the above second error register 125b.

The above second error flag generating circuit 124b generates an error exceeding the bit number of a range able to decode the contents of the above memory cell 121 of the designation address. The above second error flag generating circuit 124b is a logic circuit for generating the second error flag FL2 as binarized logic information when read-out stored data are data unable to guarantee whether these read-out stored data are conformed to the stored original data.

The above second error flag FL2 is connected to the interruption input terminal of the above microprocessor 110B. The above second confirmation reading-out means 703b, 803b are operated and executed in accordance with generation of the second error flag FL2. An overlapping abnormality judgment using the above second overlapping abnormality judging means 720b, 832 is made. Further, the second error flag FL2 is reset by the above microprocessor 110B.

The above MRAM 120B has at least one of the first error register 125a and the first error flag generating means 124a, and at least one of the second error register 125b and the second error flag generating means 124b. Further, the above MRAM 120B has first and second scattering abnormality judging means 610a, 720a and abnormality generation memory means 140B operated in accordance with a first error and a second error.

In the above first error register 125a, an error is generated within a bit number of a range able to decode the contents of the above memory cell 121 of a designation address. When read-out stored data are data restored and corrected by the above decoding reading-out circuit 123, the above first error register 125a is a register for locating an address number generating the error at a first specific address stored as first error data. In the above first error flag generating circuit 124a, an error is generated within a bit number of a range able to decode the contents of the above memory cell 121 of the designation address. When the read-out stored data are data restored and corrected by the above decoding reading-out circuit 123, the above first error flag generating circuit 124a is a logic circuit for generating the first error flag FL1 as binarized logic information.

The above first error is periodic information relative to the existence of an error detected by periodically monitoring whether the first error data are stored to the above first error register 125a or not, or whether the above first error flag FL1 is generated or not.

The above second error register 125b generates an error exceeding the bit number of a range able to decode the contents of the above memory cell 121 of the designation address. When read-out stored data are data unable to guarantee whether the read-out stored data are conformed to the stored original data, the above second error register 125b is a register for locating an address number generating the error at a second specific address stored as second error data.

The above second error flag generating circuit 124b generates an error exceeding the bit number of a range able to decode the contents of the above memory cell 121 of the designation address. The above second error flag generating circuit 124b is a logic circuit for generating the second error flag FL2 as binarized logic information when read-out stored data are data unable to guarantee whether the read-out stored data are conformed to the stored original data.

The second error is periodic information relative to the existence of an error detected by periodically monitoring whether the second error data are stored to the above second error register 125b or not, or whether the above second error flag FL2 is generated or not.

The above first and second scattering abnormality judging means 610a, 720a are means for generating first and second abnormality detecting signals ER1, ER2 when generating frequencies of the above first error and the second error exceed predetermined threshold values.

The above abnormality generation memory means 140B is a means for performing at least abnormality notification in accordance with an abnormality judgment made by the above overlapping abnormality judging means 610b, 720b, 831, 832, and an abnormality judgment made by the above first and second scattering abnormality judging means 610a, 720a.

Accordingly, it is characterized in that composite error generation is monitored together and safety of control can be improved.

The above first and second scattering abnormality judging means 610a, 720a are constructed by common use totalizing means 605a, 612, 705a, 712, and first and second scattering abnormality detecting means 606a, 706a.

The above common use totalizing means 605a, 612, 705a, 712 have a common use present value register 126, and add or subtract the second variational value Δ2 with respect to the common use present value register 126 if the above first error is generated. The above common use totalizing means 605a, 612, 705a, 712 also reset the above first error register 125a or the first error flag FL1. Further, if no first error is generated, the above common use totalizing means 605a, 612, 705a, 712 subtract or add the first variational value Δ1, and make adding and subtracting corrections with respect to the common use present value register 126 so as to be mutually lessened. If the above second error is generated, the above common use totalizing means 605a, 612, 705a, 712 add or subtract the fifth variational value Δ5 with respect to the above common use present value register 126, and reset the above second error register 125b or the second error flag FL2. In contrast to this, if no second error is generated, the above common use totalizing means 605a, 612, 705a, 712 subtractor add the fourth variational value Δ4, and make adding and subtracting corrections with respect to the common use present value register 126 so as to be mutually lessened. When an unoperating state of the above first or second error is continued, the above common use totalizing means 605a, 612, 705a, 712 are means for stopping the adding and subtracting corrections using the above first variational value Δ1 or the above fourth variational value Δ4 at a predetermined normal side limit value.

The above first and second scattering abnormality detecting means 610a, 720a are means for generating the first abnormality detecting signal ER1 or the second abnormality detecting signal ER2 when the value of the above common use present value register 126 becomes a value outside the area of a predetermined abnormal side limit value by accumulating the above first, second, fourth and fifth variational values. The above second variational value Δ2 is a value greater than the first variational value Δ1. The above fifth variational value Δ5 is a value greater than the fourth variational value Δ4. Further, the second variational value Δ2 and the fifth variational value Δ5 are set as values smaller than an allowance accumulating value as the difference between the above abnormal side limit value and the normal side limit value.

Accordingly, it is characterized in that weighting of the first error and the second error is changed, and an adding-up calculation is compositely made and the generation of a scattering abnormality can be unitarily detected.

The above MRAM 120B further includes a control program as third abnormality judging means 833, and has abnormality generation memory means 140B.

The above third abnormality judging means 833 is a means for sequentially reading-out stored data of a specific interval area of the above MRAM 120B, and judging the existence of a code error by the sum check or the CRC check relative to data of an entire reading-out interval.

The above abnormality generation memory means 140B is a means for performing at least abnormality notification in accordance with the abnormality judgment made by the above overlapping abnormality judging means 610b, 720b, 831, 832, and the abnormality judgment made by the above third abnormality judging means 831.

The above MRAM 120B further includes a control program as an inspecting period judging means 801 for selecting one of an operation start inspecting means, a constant period inspecting means and a before-stoppage inspecting means. The above operation start inspecting means is a specific inspecting means for inspecting the existence of a code error by the above overlapping abnormality judging means 831, 832 or the above third abnormality judging means 833 with respect to main data of a specific area stored to the above MRAM 120B just after the electric power switch 102 is turned on.

The above constant period inspecting means is a dividing update inspecting means for dividing all data stored to the above MRAM 120B into plural portions in a turning-on continuing state of the electric power switch 102, and sequentially periodically inspecting the existence of a code error by the above overlapping abnormality judging means 831, 832 or the above third abnormality judging means 833 with respect to each divided data.

The above before-stoppage inspecting means is a collective inspecting means for inspecting the existence of a code error by the above overlapping abnormality judging means 831, 832 or the above third abnormality judging means 833 with respect to all data stored to the above MRAM 120B in a closing period of the delay return opening-closing element 103b just after the electric power switch 102 is interrupted.

The above microprocessor 110B controls the operation of at least an intake air amount control means or a fuel injection control means in accordance with an operating state of vehicle mounting sensor groups 106, 107 for detecting an operating state of a vehicle mounting engine.

The above MRAM 120B further includes a control program as an escaping operation means in addition to the control program as a normal operation means, and also has the abnormality generation memory means 140B.

The above escaping operation means is a means for executing operation control for restraining an engine rotating speed by the restriction of an intake air amount using the above intake air amount control means or the restriction of a fuel supply amount using the fuel injection control means.

The above abnormality generation memory means 140B notifies an abnormality in accordance with the abnormality judgment made by at least the above overlapping abnormality judging means 610b, 720b, 831, 832, and selectively switches operating modes from a normal operation mode using the above normal operation means to an escaping operation mode using the above escaping operation means.

The above MRAM 120B further includes a control program as correction transfer means 827. The above microprocessor 110B has a nonvolatile backup memory 161B storing the control program as the above escaping operation means.

The above correction transfer means 827 is a restoring writing means for overwriting and storing an escaping operation program stored to the above backup memory 161B to an error generating address of the above MRAM 120B through the above correction code adding writing circuit 122 in accordance with the abnormality judgment made by the above overlapping abnormality judging means 832.

The above writing inhibition/releasing means 150 releases the above writing inhibition function at a restoring operation time using the above correction transfer means 827.

The above microprocessor 120B is serially connected to the cooperating auxiliary CPU 160. The auxiliary CPU 160 is a microprocessor cooperated with a nonvolatile auxiliary program memory 161 and communicating a monitor control signal between this auxiliary CPU 160 and the above microprocessor 120B.

The above auxiliary program memory 161 includes a nonvolatile backup memory storing the control program as the above escaping operation means.

Accordingly, it is characterized in that no excessive backup memory is required, and the control program for the escaping operation can be stored by using a partial area of the auxiliary program memory.

The watch dog timer 130 and the abnormality generation memory means 140B are used together in the above microprocessor 110B.

The watch dog timer 130 is a timer circuit for generating the reset pulse signal RS1 in accordance with the matter that the pulse width of the watch dog clear signal WD1 generated by the above microprocessor 110B exceeds a predetermined value, and initializing and restarting the microprocessor 110B.

The above abnormality generation memory means 140B is operated in accordance with the generation of abnormality detecting pulse signals ER1, ER2 caused by judging abnormality generation by the above overlapping abnormality judging means 610b, 720b, 831, 832, and the reset pulse signal RS1 using the above watch dog timer 130. The above abnormality generation memory means 140B performs at least abnormality notification in accordance with the generation of the pulse signal of one time or pulse signals of plural times. Further, the above abnormality generation memory means 140B is a logic circuit constructed by a flip flop circuit or a counter circuit for selectively switching operating modes from the normal operation mode using the above normal operation means to the escaping operation mode using the above escaping operation means. A driving stopping means 142 and a memory releasing means 112B are added to the logic circuit.

The above driving stopping means 142 is operated when the above abnormality generation memory means 140B decides and stores abnormality generation. The above driving stopping means 142 is a gate circuit for inhibiting driving of a partial specific electric load within the above electric load groups 105a, 105b.

The above memory releasing means 112B is a means for resetting an abnormality memory signal using the above abnormality generation memory means 140B by a reset pulse signal operated in accordance with a manual operation using re-turning-on of the electric power switch 102, etc.

Embodiment Mode 3 of the Invention (1) Detailed Explanation of Construction

FIG. 9 showing a circuit block diagram of a third embodiment device of this invention will be explained with points different from those of FIG. 1 as a center. In each figure, common reference numerals show the same or corresponding portions.

In FIG. 9, an external electric power source 101, an electric power relay and a load electric power relay are arranged in the exterior of an electronic controller 100C. A first electric load group 105a, a second electric load group 105b, an opening-closing sensor group 106, an analog sensor group 107, an external tool 108 and an alarm indicator 109 are connected. Electricity is supplied to the first electric load group 105a from a microprocessor 110C described later through a first output interface circuit 115a so that the first electric load group 105a is operated. Electricity is supplied to the second electric load group 105b through a second output interface circuit 115b so that the second electric load group 105b is operated. A signal is inputted to the opening-closing sensor group 106 through an input interface circuit 116. A signal is inputted to the analog sensor group 107 through an analog input interface circuit 117. The external tool 108 is connected through a serial interface circuit 118. The alarm indicator 109 is operated from a set output terminal of a flip flop circuit 140C as an abnormality generation memory means.

As the internal construction of the electronic controller 100C, the microprocessor 110C is bus-connected to MRAM 120C as a nonvolatile program memory.

The microprocessor 110C is operated by a stabilizing voltage generated by a control electric power source unit 111 to which electricity is supplied from an output contact 103b of the electric power relay. Energization with respect to a magnetizing coil 103a of the electric power relay is continued through a driving circuit element 113A by an electric supply holding command output DR1. A reset pulse generating circuit 112C generates a reset pulse signal at a rising time point of a control electric power source unit 111, and initializes the microprocessor 110C through a logical sum element 131 described later, and also resets a flip flop circuit 140C as an abnormality generation memory means described later.

MRAM 120C is divided into address areas different in a program memory area and a data memory area, and storage is performed. The program memory area is mainly constructed by an input-output control program not rewritten and changed during the operation of the microprocessor 110C after data are transferred and written from the external tool 108. The data memory area is rewritten and changed at any time during the operation of the microprocessor 110C.

MRAM 120C further includes a correction code adding writing circuit 122, a decoding reading-out circuit 123, first and second error flag generating circuits 124aa, 124bb, first and second error registers 125a, 125b arranged in the above data memory area, and a control program as a confirmation reading-out means and an overlapping abnormality judging means described later and arranged in the above program memory area. The correction code adding writing circuit 122 writes stored data adding an error correction code to the memory cell 121 of a designation address in accordance with a writing command signal from the microprocessor 110C. The decoding reading-out circuit 123 decodes and reads-out the above stored data from the memory cell 121 of the designation address in accordance with a reading-out command signal from the microprocessor 110C. The writing command signal from the microprocessor 110C is constructed so as to be supplied to MRAM 120C through a writing inhibition/releasing means 1410 described later.

In the above first error flag generating circuit 124aa, an error is generated within a bit number of a range able to decode the contents of the above memory cell 121 of the designation address. When read-out stored data are data restored and corrected by the above decoding reading-out circuit, the above first error flag generating circuit 124a is a logic circuit for generating a first error flag FL11 as binarized logic information. However, an operating state of the first error flag FL11 is changed in accordance with the existence of error generation every access address of MRAM 120C.

The above second error flag generating circuit 124bb generates an error exceeding a bit number of a range able to decode the contents of the above memory cell 121 of the designation address. When read-out stored data are data unable to guarantee whether these read-out stored data are conformed to stored original data, the second error flag generating circuit 124bb is a logic circuit for generating a second error flag FL22 as binarized logic information. However, an operating state of the second error flag FL22 is changed in accordance with the existence of error generation every access address of MRAM 120C.

A watch dog timer 130 monitors a watch dog clear signal WD1 as a pulse series signal generated by the microprocessor 110C. When the pulse width of the watch dog clear signal WD1 exceeds a predetermined threshold value, the watch dog timer 130 generates a reset pulse signal RS1, and supplies the reset pulse signal RS1 to a reset input terminal RST1 of the microprocessor 110C through a logical sum element 131, and initializes and restarts the microprocessor 110C.

Further, the reset pulse signal RS1 is supplied to a set input terminal of the counter circuit 140C as an abnormality generation memory means described later through a logical sum element 141C.

The watch dog timer 130 generates an output allowance signal OUTE when the pulse width of the watch dog clear signal WD1 is normal. Thus, it is possible to generate the outputs of first and second output interface circuits 115a, 115b.

The flip flop circuit 140C as an abnormality generation memory means is set by a logical sum output signal of the logical sum element 141C. First and second abnormality detecting signals ER1, ER2 generated by the microprocessor 110C and a reset pulse signal RS1 generated by the watch dog timer 130 are supplied to an input terminal of the logical sum element 141C.

A gate circuit 142 as a driving stopping means is connected between a load electric supply command output DR2 generated by the microprocessor 110C and an inversion driving circuit element 114. The gate circuit 142 energizes the magnetizing coil 104a of the load electric power relay when the load electric supply command output DR2 is "H" in logic level. However, the magnetizing coil 104a is de-energized when the logic level of a set output terminal of the flip flop circuit 140C becomes "H".

Further, in such an abnormality deciding state, a mode switching command signal LPH is supplied to the microprocessor 110C.

An abnormality counting circuit 170 constructed by hardware adds or subtracts a generation time number of the first error flag FL11. The subtracting calculation or the adding calculation is made by a frequency dividing signal DNP of a reading-out command signal supplied from the microprocessor 110C. The abnormality counting circuit 170 is initialized such that, e.g., the present value becomes zero by a reset pulse signal generated by a reset pulse generating circuit 112C at an electric power turning-on time, or a clear signal CL1 generated by the microprocessor 110C. When the present value of the abnormality counting circuit 170 reaches a predetermined limit threshold value, a count-up output EP1 is generated and is inputted to the microprocessor 110C.

An abnormality counting circuit 180 constructed by hardware adds or subtracts a generation time number of the second error flag FL22. The subtracting calculation or the adding calculation is made by a frequency dividing signal DNP of a reading-out command signal supplied from the microprocessor 110C. The abnormality counting circuit 180 is initialized such that, e.g., the present value becomes zero by the reset pulse signal generated by the reset pulse generating circuit 112C at an electric power turning-on time, or a clear signal CL2 generated by the microprocessor 110C. When the present value of the abnormality counting circuit 180 reaches a predetermined limit threshold value, a count-up output EP2 is generated and is inputted to the microprocessor 110C.

The microprocessor 110C generates first and second abnormality detecting signals ER1, ER2 in accordance with the input of count-up outputs EP1, EP2, and generates first and second clear signals CL1, CL2 and initializes the abnormality counting circuits 170, 180.

(2) Detailed Explanation of Action and Operation

In the third embodiment device of this invention constructed as shown in FIG. 9, when the electric power switch 102 is closed, the output contact 103b of the electric power relay is closed and electricity is supplied from the external electric power source 101 to the control electric power source unit 111. Thus, a stabilized control electric power source voltage Vcc is generated and the microprocessor 110C, the flip flop circuit 140C and the abnormality counting circuits 170, 180 are initialized by a reset pulse signal generated by the reset pulse generating circuit 112C. Then, the microprocessor 110C begins to be operated, and generates a watch dog clear signal WD1.

At a first time electric supply time before a control program is stored to MRAM 120C, the control program is transferred from the external tool 108 to MRAM 120C on the basis of a boot program stored to MRAM 120C in advance.

When the control program is written by the external tool 108, both the logic levels of a tool connecting signal TOOL and an uppermost order address signal A15 become "H". A writing command signal WR of the microprocessor 110C is supplied to MRAM 120C as a writing command input WRM as it is.

On the other hand, when the electric power switch 102 is closed after the control program is stored to MRAM 120C, the microprocessor 110C, the flip flop circuit 140C and the abnormality counting circuits 170, 180 are initialized and the microprocessor 110C then begins to be operated. The microprocessor 110C then generates a watch dog clear signal WD1 and also generates an electric supply holding command output DR1 and a load electric supply command output DR2. The magnetizing coil 104a of the load electric power relay is energized.

In this state, the tool connecting signal TOOL becomes "L" in logic level. As its result, with respect to the program memory area in which the logic level of the uppermost order address signal A15 becomes "H" together, no writing command signal WR is supplied to MRAM 120C even if the logic level of the writing command signal WR becomes "H".

However, the writing command signal WR becomes valid with respect to the data memory area in which the logic level of the upper order address signal A15 becomes "L" together.

Further, a rewriting correction command signal WRC described later always becomes valid irrespective of the memory area, and its details will be described later by FIG. 14.

The microprocessor 110C controls the operations of first and second electric load groups 105a, 105b in accordance with the voltage level of an analog signal obtained from the analog sensor group 107, an operating state of an ON/OFF signal obtained from the opening-closing sensor group 106, and an input-output control program stored to the memory cell 121 of MRAM 120C.

A set input signal is supplied to a set input terminal of the flip flop circuit 140C through a logical sum element 141C when the first and second abnormality detecting signals ER1, ER2 generate an abnormality detecting pulse signal by a noise error operation, etc. during the operation of the microprocessor 110C and the watch dog timer 130 generates a reset pulse signal RS1. The flip flop circuit 140C stores an abnormality generating state and the logic level of a set output terminal becomes "H".

As its result, the alarm indicator 109 is operated and the load electric supply command output DR2 is interrupted by the gate circuit 142, and the magnetizing coil 104a of the load electric power relay is de-energized. A mode switching command signal LPH is supplied to the microprocessor 110C. As its result, the microprocessor 110C proceeds to an escaping operation mode for restraining an engine rotating speed.

When the electric power switch 102 is opened during the operation of the microprocessor 110C, energization with respect to magnetizing coils 103a, 104a is continued by the electric supply holding command output DR1 and the driving circuit element 113A. The microprocessor 110C executes confirmation storage of learning memory information, etc., and then personally stops the electric supply holding command output DR1. As its result, the magnetizing coil 103a is de-energized.

When the electric power switch 102 is again turned on, the microprocessor 110C and the flip flop circuit 140C are initialized by the reset pulse generating circuit 112C. Accordingly, when abnormal storage using the flip flop circuit 140C is provided by a noise error operation, it is recovered to a normal operating state.

However, when first and second abnormality detecting signals ER1, ER2 or the watch dog timer 130 generate the reset pulse signal RS1 by an abnormality of hardware of MRAM 120C and others, the flip flop circuit 140C again stores these abnormal signals and rapidly performs abnormality notification, stoppage of the load electric power relay, etc.

In the abnormality counting circuits 170, 180, the adding calculation of one count is made if a first or second error is generated every reading-out timing of MRAM 120C. For example, subtraction processing of one time is performed per reading-out command signals of 100 times, and the present value is limited so as not to be zero or less.

Further, for example, when the present values of the abnormality counting circuits 170, 180 become 10 or 4, count-up outputs EP1, EP2 are generated.

Accordingly, the abnormality counting circuit 170 generates the count-up output EP1 when scattering abnormalities of 10 times are generated with respect to reading-out of 100 times. The abnormality counting circuit 180 generates the count-up output EP2 when scattering abnormalities of four times are generated with respect to reading-out of 100 times.

Next, FIGS. 10A and 10B as flow charts for explaining an operation relative to a first abnormality judgment in FIG. 9 will be explained.

Figure 10A:
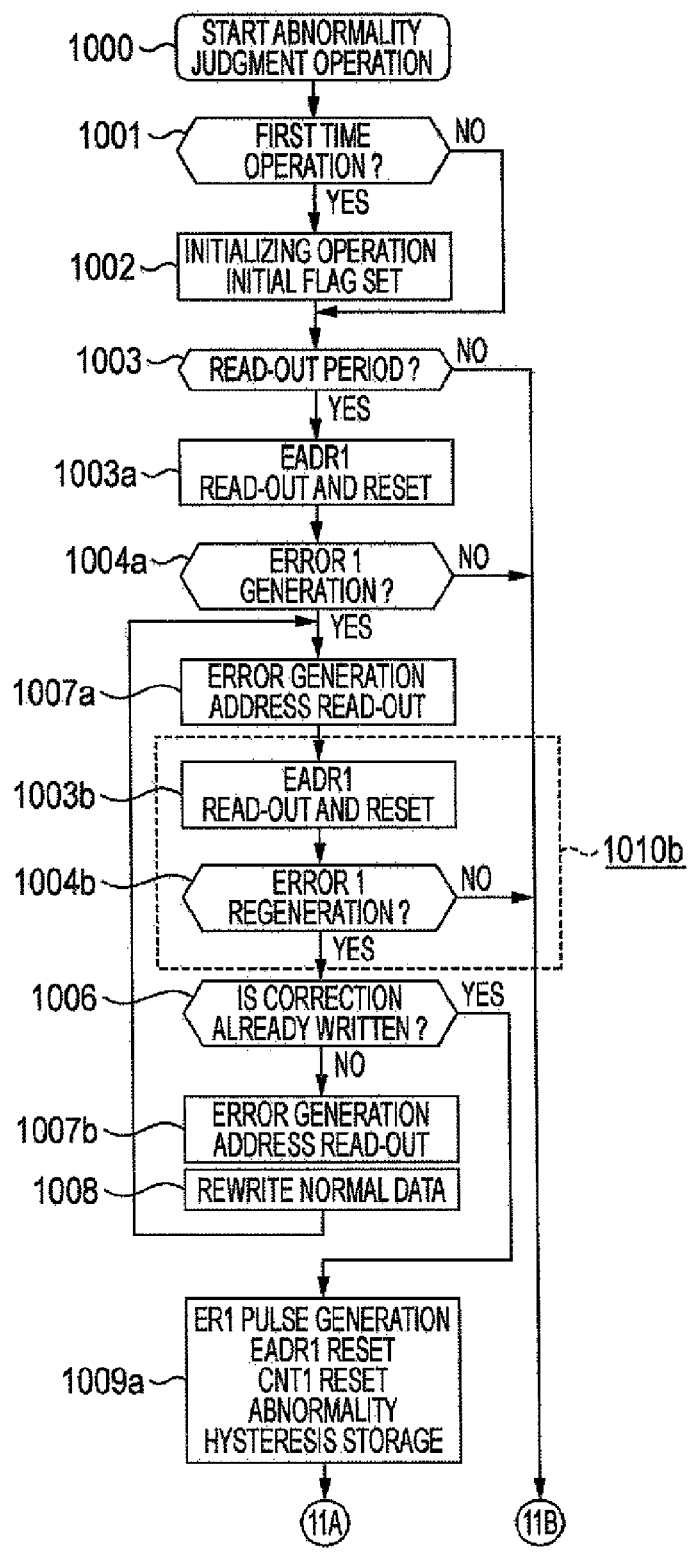
FIGS. 10A and 10B are flow charts for explaining an operation relative to a first abnormality judgment in FIG. 9.

In FIG. 10A as a flow chart for explaining the operation of the microprocessor 110C, process 1000 is a step for starting an abnormality judging operation of MRAM 120C by the microprocessor 110C. In subsequent process 1001, it is judged whether it is a first time operation according to whether an initial flag is set in subsequent process 1002. If it is the first time operation, the judgment of YES is made and it proceeds to process 1002. In contrast to this, if it is no first time operation, the judgment of NO is made and it proceeds to process 1003.

Process 1002 is a step for initializing the present values of the above first and second error flag generating circuits 124aa, 124bb, the first and second error registers 125a, 125b and the abnormality counting circuits 170, 180, and setting the unillustrated initial flag. The initial flag is reset when the electric power switch 102 is turned on.

In process 1003, it is judged whether it is timing for reading-out the contents of the first error register 125a. If it is a reading-out period, the judgment of YES is made and it proceeds to process 1003a. In contrast to this, if it is no reading-out period, the judgment of NO is made and it proceeds to process 1111a of FIG. 11A through a relay terminal 11B. The judgment as to whether it is the reading-out period or not is measured by an unillustrated timer. For example, the judgment of YES is made in a ratio of one time for about 10 msec.

Process 1003a is a step for reading-out the contents of the first error register 125a, and overwriting and storing these contents to an unillustrated temporary register having priority in after-writing, and resetting the contents of the first error register 125a.

In subsequent process 1004a, the judgment of YES is made and it proceeds to process 1007a at a generating time of the first error according to whether the contents of the temporary register read out in process 1003a are a generating state of the first error. In contrast to this, if no first error is generated, the judgment of NO is made and it proceeds to process 1111a of FIG. 11A through the relay terminal 11B.

The first error is an error able to correct a code. When the contents of the first error register 125a are an address of the memory cell 121, it is judged that the first error is generated.

Process 1007a is a step for designating the address generating the error and reading-out its contents, but the error generating address is an address detected in process 1003a.

Process 1003b executed subsequently to process 1007a is a step for reading-out the contents of the first error register 125a and overwriting these contents to the unillustrated temporary register, and resetting the contents of the first error register 125a.

In subsequent process 1004b, the judgment of YES is made and it proceeds to process 1007b at a generating time of a first error according to whether the contents of the temporary register read out in process 1003b are a generating state of the first error. In contrast to this, if no first error is generated, the judgment of NO is made and it proceeds to process 1111a of FIG. 11A through the relay terminal 11B.

Process 1007b is a step for designating an address generating the error and reading-out its contents, but the error generating address is an address detected in process 1003b.

Subsequent process 1008 is a step for restoring and writing decoding data read out in process 1007b through the correction code adding writing circuit 122.

In process 1009a executed subsequently to process 1008, a pulse of the first abnormality detecting signal ER1 is generated, and the contents of the first error register 125a are reset. After a clear signal CL1 is generated and the abnormality counting circuit 170 is reset, it proceeds to process 1103a of FIG. 11A via the relay terminal 11A.

Figure 10B:
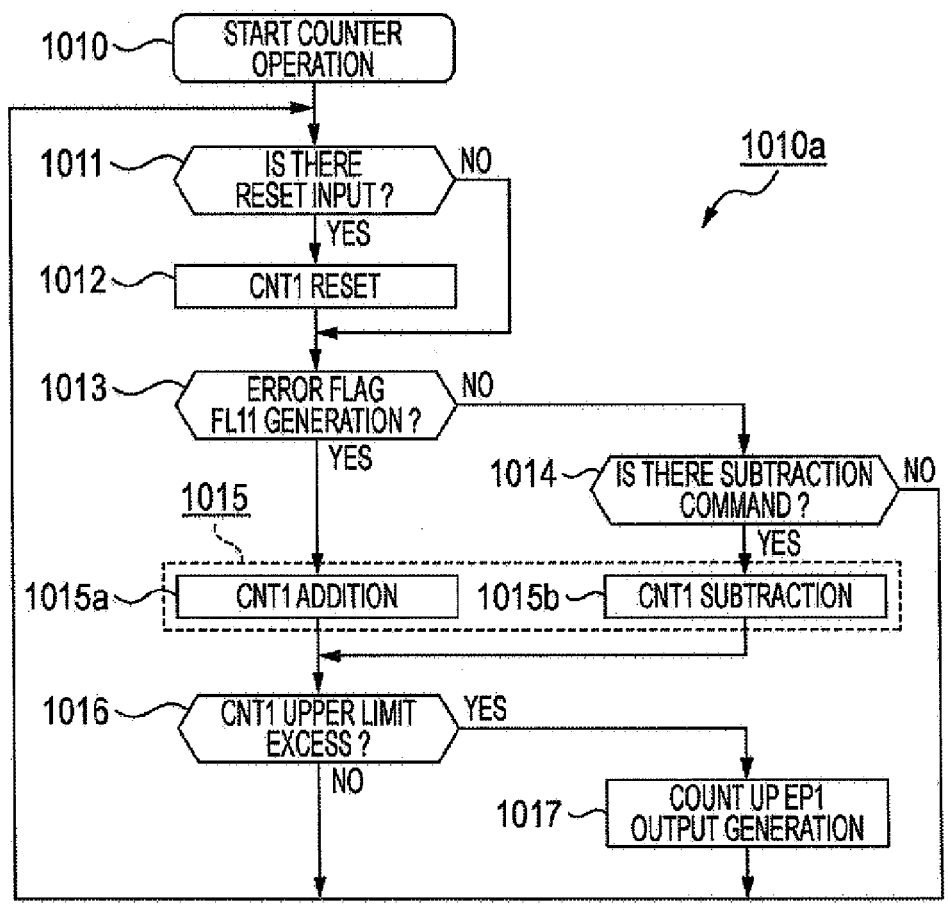

In FIG. 10B as a flow chart for an operating explanation equivalently expressing a counting operation of the abnormality counting circuit 170, process 1010 is an operation starting process of the abnormality counting circuit 170. In subsequent process 1011, the logic level of the clear signal CL1 is judged. If the logic level is "H", the judgment of YES is made and it proceeds to process 1012. In contrast to this, if the logic level is "L", the judgment of NO is made and it proceeds to process 1013. Process 1012 is a step for resetting the present value of the abnormality counting circuit 170 to zero and then proceeding to process 1013. In subsequent process 1013, the logic level of the first error flag FL11 is judged. If the logic level is "H", the judgment of YES is made and it proceeds to process 1015a. In contrast to this, if the logic level is "L", the judgment of NO is made and it proceeds to process 1014.

In process 1014, the logic level of a frequency dividing signal DNP generated by the microprocessor 110C is judged.

If the logic level is "H", the judgment of YES is made and it proceeds to process 1015b. In contrast to this, if the logic level is "L", the judgment of NO is made and it is returned and proceeds to process 1011.

Process 1015a is a step for adding 1 to the present value of the abnormality counting circuit 170. Process 1015b is a step for subtracting 1 from the present value of the abnormality counting circuit 170. However, the present value of the abnormality counting circuit 170 is set so as not to become zero or less.

Process block 1015 constructed by process 1015a and process 1015b becomes a first totalizing means.

In process 1016 executed subsequently to process 1015a or process 1015b, it is judged whether the present value of the abnormality counting circuit 170 exceeds "10". If no present value exceeds "10", the judgment of NO is made and it is returned and proceeds to process 1011. In contrast to this, if the present value exceeds "10", the judgment of YES is made and it proceeds to process 1017.

In process 1017, it is returned and proceeds to process 1011 after the count-up output EP1 is generated.

Process block 1010a is a process group constituting a first scattering abnormality judging means constructed by processes 1011 to 1017. Process block 1010b is a process group constituting a first overlapping abnormality judging means constructed by processes 1003b, 1004b.

In process block 1010a, generating frequency of the first error generated at many unspecific addresses is detected, and the generation of a first scattering abnormality is judged. In contrast to this, in process block 1010b, the generation of a first overlapping abnormality is judged by a reconfirming operation with respect to a specific address during abnormality generation designated by process 1007a.

The above flow chart will be schematically explained generally.

Process 1015 corresponds to a first adding-subtracting circuit. The first adding-subtracting circuit 1015 is the abnormality counting circuit 170 constructed by hardware, and adds (or subtracts) a generation time number of the first error flag FL11 generated by MRAM 120C. The subtracting calculation (or the adding calculation) is made by the frequency dividing signal DNP of a reading-out command signal supplied from the microprocessor 110C.

Process 1016 corresponds to a first scattering abnormality detecting means. The first scattering abnormality detecting means 1016 generates a count-up output EP1 as a first abnormality detecting signal when the present value of the abnormality counting circuit 170 exceeds a predetermined set threshold value.

Accordingly, when a first error is scatteringly generated by a noise error operation, etc., no count-up output EP1 is immediately generated. When the first error is continuously generated by a hardware abnormality, the count-up output EP1 is rapidly generated.

Process block 1010a becomes a first scattering abnormality judging means including the first totalizing means 1015 and the first scattering abnormality detecting means 1016.

Process 1003b corresponds to a first confirmation reading-out means. The first confirmation reading-out means 1003b is operated in accordance with storage of first error data to the first error register 125a, and resets the first error data (by process 1003a). Then, the first confirmation reading-out means 1003b again gets access to an error generating address (by process 1007a). Thereafter, the first confirmation reading-out means 1003b again reads-out and confirms the contents of the first error register 125a.

Process 1008 corresponds to a correction writing means. The correction writing means 1008 is operated in accordance with the storage of the first error data to the first error register 125a as before as a reading-out result using the first confirmation reading-out means 1003b. The correction writing means 1008 becomes a restoring writing means for overwriting and storing stored data of the error generating address read out through the decoding reading-out circuit 123 to the error generating address of MRAM 120C through the correction code adding writing circuit 122.

Process block 1010b corresponds to a first overlapping abnormality judging means. The first overlapping abnormality judging means 1010b is a means for judging that the contents of a memory of the same address are a continuation abnormality when the contents of the first error register 125a read out by the confirmation reading-out means 1003b include the same error data.

Next, FIGS. 11A and 11B as a flow chart for explaining an operation relative to a second abnormality judgment in FIG. 9 will be explained.

Figure 11A:
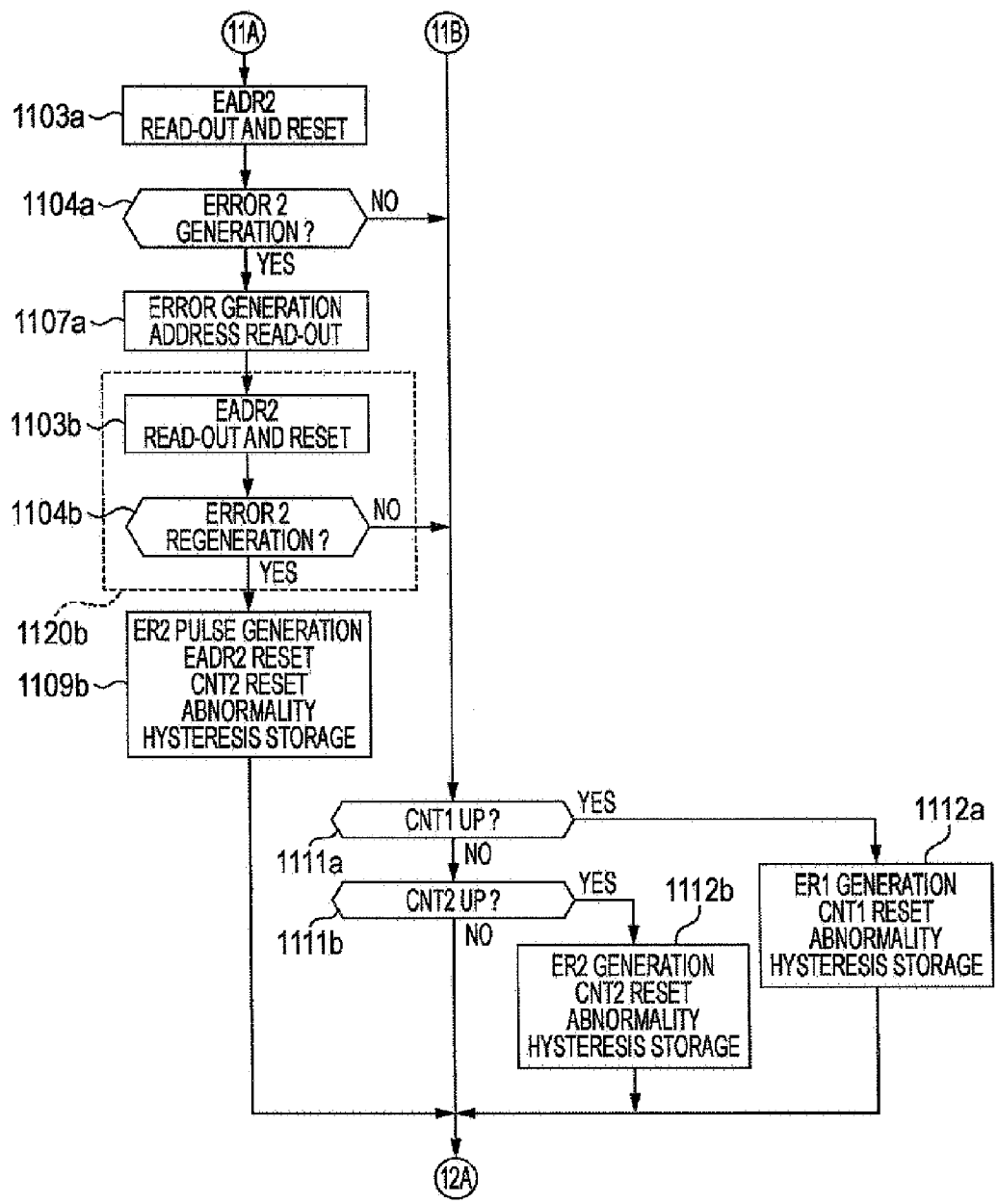
FIGS. 11A and 11B are flow charts for explaining an operation relative to a second abnormality judgment in FIG. 9.

In FIG. 11A as a flow chart for explaining the operation of the microprocessor 110C, process 1103a executed subsequently to the relay terminal 11A of FIG. 10A is a step for reading-out the contents of the second error register 125b and overwriting and storing these contents to an unillustrated temporary register having priority in after-writing, and resetting the contents of the second error register 125b.

In subsequent step 1104a, the judgment of YES is made and it proceeds to process 1107a at a generating time of a second error according to whether the contents of the temporary register read out in process 1103a are a generating state of the second error. In contrast to this, when no second error is generated, the judgment of NO is made and it proceeds to process 1111a.

The second error is an error unable to correct a code. When the contents of the second error register 125b are an address of the memory cell 121, it is judged that the second error is generated.

Process 1107a is a step for designating an address generating the error and reading-out its contents. However, the error generating address is an address detected in process 1103a.

Process 1103b executed subsequently to process 1107a is a step for reading-out the contents of the second error register 125b and overwriting these contents to an unillustrated temporary register, and resetting the contents of the second error register 125b.

In subsequent process 1104b, the judgment of YES is made and it proceeds to process 1109b at the generating time of the second error according to whether the contents of the temporary register read out in process 1103b are a generating state of the second error. In contrast to this, if no second error is generated, the judgment of NO is made and it proceeds to process 1111a.

In process 1109b, a pulse of the second abnormality detecting signal ER2 is generated, and the contents of the second error register 125b are reset. After a clear signal CL2 is generated and the abnormality counting circuit 180 is reset, it proceeds to process 1240 of FIG. 12 via a relay terminal 12A.

Figure 11B:
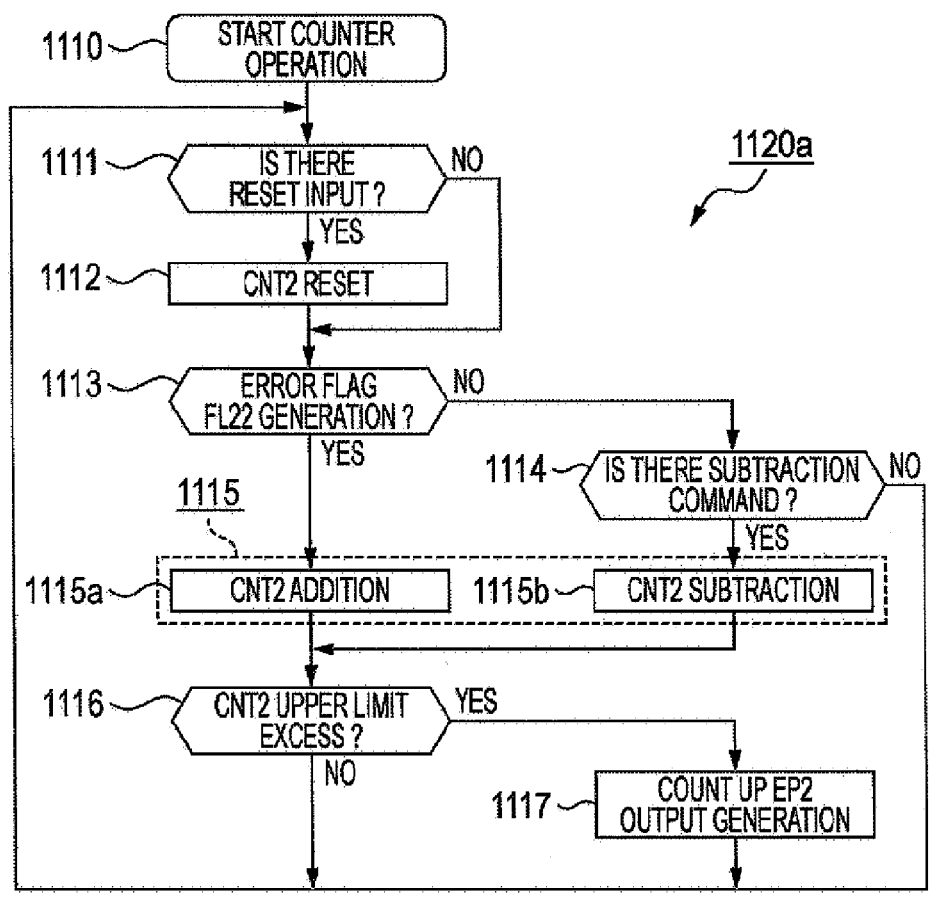

In process 1111a executed when each of the judgments of processes 1003, 1004a, 1004b of FIGS. 10A and 10B and processes 1104a, 1104b of FIGS. 11A and 11B is NO and it is no abnormality inspecting period, or when an abnormality inspecting result is normal, the logic level of the count-up output EP1 of the abnormality counting circuit 170 is judged. If it is not counted up, the judgment of NO is made and it proceeds to process 1111*b*. In contrast to this, if it is counted up, the judgment of YES is made and it proceeds to process 1112*a*.

In process 1112*a*, the first abnormality detecting signal ER1 is generated. After the clear signal CL1 is generated and the abnormality counting circuit 170 is reset, it proceeds to process 1240 of FIG. 12 via the relay terminal 12A.

In process 1111*b*, the logic level of the count-up output EP2 of the abnormality counting circuit 180 is judged. If it is not counted up, the judgment of NO is made and it proceeds to process 1240 of FIG. 12 via the relay terminal 12A. In contrast to this, if it is counted up, the judgment of YES is made and it proceeds to process 1112*b*.

In process 1112*b*, the second abnormality detecting signal ER2 is generated. After the clear signal CL2 is generated and the abnormality counting circuit 180 is reset, it proceeds to process 1240 of FIG. 12 via the relay terminal 12A.

In FIG. 11B as a flow chart for an operating explanation equivalently expressing a counting operation of the abnormality counting circuit 180, process 1110 is an operation starting process of the abnormality counting circuit 180. In subsequent process 1111, the logic level of the clear signal CL2 is judged. If the logic level is "H", the judgment of YES is made and it proceeds to process 1112. In contrast to this, if the logic level is "L", the judgment of NO is made and it proceeds to process 1113. Process 1112 is a step for resetting the present value of the abnormality counting circuit 180 to zero, and then proceeding to process 1113. In subsequent process 1113, the logic level of the second error flag FL22 is judged. If the logic level is "H", the judgment of YES is made and it proceeds to process 1115*a*. In contrast to this, if the logic level is "L", the judgment of NO is made and it proceeds to process 1114.

In process 1114, the logic level of the frequency dividing signal DNP generated by the microprocessor 111C is judged. If the logic level is "H", the judgment of YES is made and it proceeds to process 1115*b*. In contrast to this, if the logic level is "L", the judgment of NO is made and it is returned and proceeds to process 1111.

Process 1115*a* is a step for adding 1 to the present value of the abnormality counting circuit 180. Process 1115*b* is a step for subtracting 1 from the present value of the abnormality counting circuit 180. However, the present value of the abnormality counting circuit 180 is set so as not to become zero or less.

Process block 1115 constructed by process 1115*a* and process 1115*b* becomes a second totalizing means.

In process 1116 executed subsequently to process 1115*a* or process 1115*b*, it is judged whether the present value of the abnormality counting circuit 180 exceeds "4". If no present value exceeds "4", the judgment of NO is made and it is returned and proceeds to process 1111. In contrast to this, if the present value exceeds "4", the judgment of YES is made and it proceeds to process 1117.

In process 1117, the count-up output EP2 is generated, and it is then returned and proceeds to process 1111.

Process block 1120*a* is a process group constituting a second scattering abnormality judging means constructed by processes 1111 to 1117. Process block 1120*b* is a process block constituting a second overlapping abnormality judging means constructed by processes 1103*b*, 1104*b*.

In process block 1120*a*, the generating frequency of the second error generated at many unspecific addresses is detected, and the generation of a second scattering abnormality is judged. In contrast to this, in process block 1120*b*, the generation of a second overlapping abnormality is judged by a reconfirming operation with respect to a specific address during abnormality generation designated by process 1107*a*.

The above flow chart will be schematically explained generally.

Process 1115 corresponds to a second adding-subtracting circuit. The second adding-subtracting circuit 1115 is the abnormality counting circuit 180 constructed by hardware, and adds (or subtracts) a generation time number of the second error flag FL22 generated by MRAM 120C. The subtracting calculation (or the adding calculation) is made by the frequency dividing signal DNP of a reading-out command signal supplied from the microprocessor 110C.

Process 1116 corresponds to a second scattering abnormality detecting means. The second scattering abnormality detecting means 1116 generates a count-up output EP2 as a second abnormality detecting signal when the present value of the abnormality counting circuit 180 exceeds a predetermined set threshold value.

Accordingly, when a second error is scatteringly generated by a noise error operation, etc., no count-up output EP2 is immediately generated. When the second error is continuously generated by a hardware abnormality, the count-up output EP2 is rapidly generated.

Process block 1120*a* becomes a second scattering abnormality judging means including the second totalizing means 1115 and the second scattering abnormality detecting means 1116.

Process 1103*b* corresponds to a second confirmation reading-out means. The second confirmation reading-out means 1103*b* is operated in accordance with storage of second error data to the second error register 125*b*, and resets the second error data (by process 1103*a*). Then, the second confirmation reading-out means 1103*b* again gets access to an error generating address (by process 1107*a*). Thereafter, the second confirmation reading-out means 1103*b* again reads-out and confirms the contents of the second error register 125*b*.

Process block 1120*b* corresponds to a second overlapping abnormality judging means. The second overlapping abnormality judging means 1120*b* is a means for judging that the contents of a memory of the same address are a continuation abnormality when the contents of the second error register 125*b* read out by the confirmation reading-out means 1103*b* include the same error data.

Next, FIGS. 12 and 13 as a flow chart for an operating explanation relative to an inspecting operation in FIG. 9 will be explained.

Figure 12:
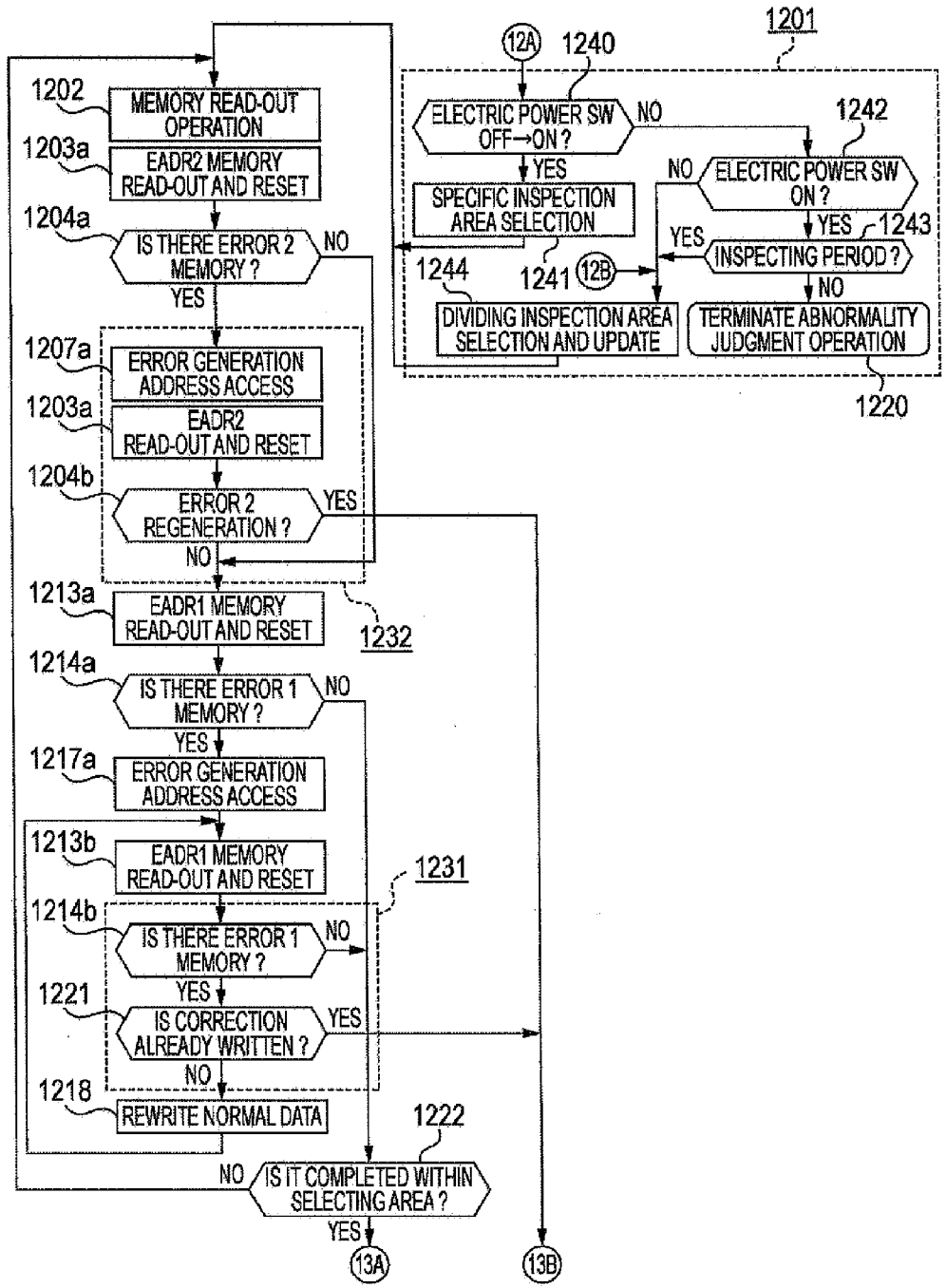
FIG. 12 is a flow chart for explaining a former half operation relative to an inspecting operation in FIG. 9.

In FIG. 12 as a first half flow chart of the inspecting operation, in a process group of process block 1201 executed subsequently to the above processes 1109*b*, 1112*a*, 1112*b*, 1111*b*, it is judged whether it is an abnormality inspecting period. If it is no abnormality inspecting period, the judgment of NO is made and it proceeds to operation termination process 1220. In contrast to this, if it is the abnormality inspecting period, an abnormality inspecting area is selected and it proceeds to process 1202.

In process block 1201, it is judged in process 1240 whether it is just after the electric power switch 102 is closed. If it is after a change OFF→ON, the judgment of YES is made and it proceeds to process 1241. If the electric power switch 102 is already closed or is already opened, it proceeds to process 1242. Process 1241 is a step for selecting a specific inspecting area as an object of an operation starting inspection. In this specific inspecting area, for example, an escaping operation control program as an important program area of safety is selected.

In process 1242, it is judged whether the electric power switch 102 is closed or not. If the electric power switch 102 is closed, the judgment of YES is made and it proceeds to process 1243. In contrast to this, if the electric power switch 102 is opened, the judgment of NO is made and it proceeds to process 1244. In process 1242, the judgment of NO is made in a state in which the electric power switch 102 once closed is opened and electricity is continuously supplied by a delay return opening-closing element 103b.

In process 1243, it is judged whether it is a periodic inspecting period. If it is the periodic inspecting period, the judgment of YES is made and it proceeds to process 1244. In contrast to this, if it is no periodic inspecting period, the judgment of NO is made and it proceeds to operation termination process 1220. In process 1243, the judgment of YES is made approximately periodically.

Process 1244 is a step for selecting and updating a dividing inspection area as an object of the periodic inspection or the before-stoppage inspection. In the case of the periodic inspection, area update completion is judged in process 1326 described later. Thus, it once proceeds to operation termination process 1220. A dividing inspection area divided into plural portions in process 1244 after operation starting process 1000 is again activated is updated and selected.

In the case of the before-stoppage inspection for opening the electric power switch 102, area update incompletion is judged in process 1326 described later. Thus, it is again returned to process 1244 through a relay terminal 12B, and the dividing inspection area divided into plural portions is subsequently updated and selected.

Process 1202 executed subsequently to process 1241 or process 1244 is a step for designating an address of the memory cell 121 and reading-out memory contents in an address area of MRAM 120C as an inspecting object.

In subsequent process 1203a, the contents of the second error register 125b are read and are stored to an unillustrated temporary register. Further, the contents of the second error register 125b are reset. In subsequent process 1204a, the judgment of YES is made and it proceeds to process 1207a at a generating time of a second error according to whether the contents of the temporary register read out in process 1203a are a generating state of the second error. In contrast to this, when no second error is generated, the judgment of NO is made and it proceeds to process 1213a.

Process 1207a is a step for designating an address generating the error and reading-out its contents. The error generating address is an address read out by process 1203a.

In process 1203b executed subsequently to process 1207a, the contents of the second error register 125b are read out and are stored to the unillustrated temporary register. Further, the contents of the second error register 125b are reset.

In subsequent process 1204b, the judgment of YES is made at a generating time of a second error according to whether the contents of the temporary register read out in process 1203b are a generating state of the second error. It then proceeds to process 1332 of FIG. 13 through a relay terminal 13B. In contrast to this, if no second error is generated, the judgment of NO is made and it proceeds to process 1213a.

In process 1213a, the contents of the first error register 125a are read and are overwritten and stored to an unillustrated temporary register having priority in after-writing. Further, the contents of the first error register 125a are reset.

In subsequent step 1214a, the judgment of YES is made and it proceeds to process 1217a at a generating time of a first error according to whether the contents of the temporary register read out in process 1213a are a generating state of the first error. In contrast to this, if no first error is generated, the judgment of NO is made and it proceeds to process 1222.

Process 1217a is a step for designating an address generating the error and reading-out its contents. The error generating address is an address read out by process 1213a.

Subsequent process 1213b is a step for reading-out the contents of the first error register 125a, and overwriting and storing these contents to an unillustrated temporary register having priority in after-writing, and resetting the contents of the first error register 125a.

In subsequent process 1214b, the judgment of YES is made and it proceeds to process 1221 at a generating time of a first error according to whether the contents of the temporary register read out in process 1213b are a generating state of the first error. In contrast to this, if no first error is generated, the judgment of NO is made and it proceeds to process 1222.

In process 1221, it is judged whether correction writing of normal data is executed by the next process 1218. If no correction is written, the judgment of NO is made and it proceeds to process 1218. In contrast to this, if the correction is already written, the judgment of YES is made and it proceeds to process 1332 of FIG. 13 through the relay terminal 13B.

Process 1218 is a step for restoring and writing decoding data read out in process 1217a through the correction code adding writing circuit 122. Subsequently to process 1218, it is returned to process 1213b. It is then judged by process 1214b whether the normal writing is performed.

In process 1222, it is judged whether the inspection of an area set to an inspecting object of this time is completed. If no inspection is completed, the judgment of NO is made and it is returned to process 1202, and an inspecting address is updated. In contrast to this, if the inspection is completed, the judgment of YES is made and it proceeds to process 1323 of FIG. 13 through the relay terminal 13A.

Figure 13:
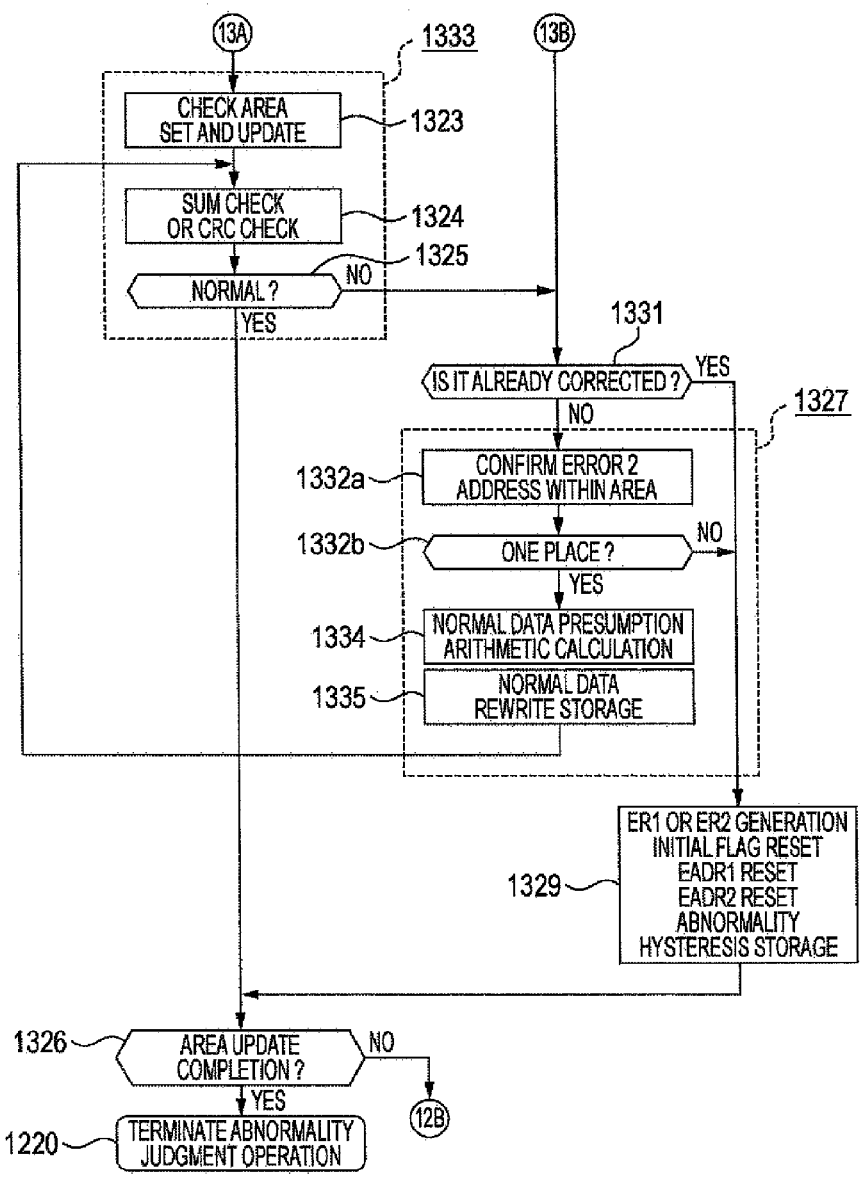
FIG. 13 is a flow chart for explaining a latter half operation relative to the inspecting operation in FIG. 9.

In FIG. 13 as a latter half flow chart of the inspecting operation, process 1323 subsequent to the relay terminal 13A is a step for setting whether which area is checked with respect to plural inspecting areas divided into groups for the sum check or the CRC check. For example, the inspecting area may be the same area as the inspecting area selected in process 1241 or process 1244, or may be also an area further finely divided.

Subsequent process 1324 is a step for performing the sum check or the CRC check with respect to the inspecting area set in process 1323. In subsequent process 1325, it is judged whether a check result using process 1324 is normal or not. If the check result is normal, the judgment of YES is made and it proceeds to process 1326. In contrast to this, if no check result is normal, the judgment of NO is made and it proceeds to process 1332.

In process 1326, the judgment of YES is made at the time of the periodic inspection for closing the electric power switch 102. At the time of the before-stoppage inspection for opening the electric power switch 102, the judgment of NO is first made and it is returned to process 1244. The plural inspecting areas are repeatedly inspected. If the inspection of all the divided inspecting areas is completed, the judgment of YES is made and it proceeds to operation termination process 1220.

Process 1332 executed at the time of an abnormality judgment in processes 1204b, 1221 of FIG. 12 and process 1325 of FIG. 13 is a step for confirming an address generating a second error within the inspecting area. In this process 1332, while the address of MRAM 120C within the inspecting area is sequentially accessed, the contents of the second error register 125b are confirmed. Thus, it is retrieved whether abnormality addresses of two places or more exist.

In subsequent process 1333, it is judged whether an abnormality generating address is located within one place as a retrieving result using process 1332. If the abnormality generating address is located within one place, the judgment of YES is made and it proceeds to process 1334. In contrast to this, if there is abnormality generation of places exceeding one place, the judgment of NO is made and it proceeds to process 1329.

In process 1334, sum data stored to MRAM 120C as control data in advance, and sum data calculated by process 1334 are compared. A reverse calculation is made from a difference between these sum data, and correct data at an abnormality generating address are presumed.

Subsequent process 1335 is a step for writing and storing the correct data presumed in process 1334 to the abnormality generating address and then proceeding to process 1329.

In subsequent process 1329, the abnormality detecting signal ER1 or ER2 is generated, and the initial flag set in process 1002 of FIGS. 10A and 10B is reset. Further, the first and second error registers 125a, 125b within MRAM 120C are reset, and it then proceeds to process 1326.

In operation termination process 1220, the microprocessor 110C executes another control operation and then approximately periodically proceeds to operation starting process 1000 of FIGS. 10A and 10B. However, when the electric power switch 102 is opened, the operation of the microprocessor 110C is once stopped, and the electric power relay 103a is de-energized and an electric supply circuit is interrupted.

The above flow chart will be schematically explained generally. Process 1203b corresponds to a second confirmation reading-out means. The second confirmation reading-out means 1203b is operated in accordance with storage of second error data to the second error register 125b (by the judgment of process 1204a). The second confirmation reading-out means 1203b resets the second error data and then again gets access to an error generating address (reset after reading-out in process 1203a) (by process 1207a), and reads-out and confirms the contents of the second error register 125b.

Process block 1232 constructed by processes 1207a, 1203b, 1204b corresponds to a second overlapping abnormality judging means. When reading-out confirmation is performed by the second confirmation reading-out means 1203b, the second overlapping abnormality judging means 1232 judges that the contents of a memory of the same address are a continuation abnormality when the contents of the second error register 125b include the same error data.

Process 1213b corresponds to a first confirmation reading-out means. The first confirmation reading-out means 1213b is operated in accordance with storage of first error data to the first error register 125a (by the judgment of process 1214a). The first confirmation reading-out means 1213b resets the first error data, and then again gets access to an error generating address (reset after reading-out in process 1213a) (by process 1217a). Thereafter, the first confirmation reading-out means 1213b again reads-out and confirms the contents of the above first error register 125a.

Process block 1231 constructed by processes 1214b, 1221 corresponds to a first overlapping abnormality judging means. When reading-out confirmation is performed by the first confirmation reading-out means 1213b, the first overlapping abnormality judging means 1231 judges that the contents of a memory of the same address are a continuation abnormality when the contents of the first error register 125a include the same error data.

Process 1218 corresponds to a correction writing means. The correction writing means 1218 is operated in accordance with the storage of the first error data to the first error register 125a as before as a reading-out result using the first confirmation reading-out means 1213b. The correction writing means 1218 is a restoring writing means for overwriting and storing stored data of the error generating address read out through the decoding reading-out circuit 123 to the error generating address of MRAM 120C through the above correction code adding writing circuit 122.

Process block 1333 constructed by processes 1323, 1324, 1325 corresponds to a third abnormality judging means. The third abnormality judging means 1333 sequentially reads-out stored data of a specific interval area of MRAM 120C, and judges the existence of a code error by the sum check or the CRC check relative to data of an entire reading-out interval.

Process 1327 corresponds to an abnormality correction transfer means. When the third abnormality judging means 1333 judges that there is a code error in the stored data of MRAM 120C at the specific interval, and the second overlapping abnormality judging means 1232 judges that there is a code error in one stored data within the specific interval, the abnormality correction transfer means 1327 makes a reverse calculation from sum check data or CRC check data, and presumes and arithmetically calculates correct stored data. The abnormality correction transfer means 1327 is a restoring writing means for overwriting and storing the presumed data to the error generating address of MRAM 120C through the correction code adding writing circuit 122.

Process block 1201 constructed by processes 1240 to 1244 corresponds to an inspecting period judging means. The inspecting period judging means 1201 selects one of an operation start inspecting means, a constant period inspecting means and a before-stoppage inspecting means.

The operation start inspecting means becomes a specific inspecting means for inspecting the existence of a code error by the overlapping abnormality judging means 1231, 1232 or the third abnormality judging means 1233 with respect to main data of the specific area stored to MRAM 120C just after the electric power switch 102 is turned on.

Further, the constant period inspecting means becomes a dividing update inspecting means for dividing all data stored to MRAM 120C into plural portions in a turning-on continuing state of the electric power switch 102. The dividing update inspecting means sequentially inspects the existence of a code error by the overlapping abnormality judging means 1231, 1232 or the third abnormality judging means 1233 with respect to each divided data.

Further, the before-stoppage inspecting means becomes a collective inspecting means for inspecting the existence of a code error by the overlapping abnormality judging means 1231, 1232 or the third abnormality judging means 1233 with respect to all data stored to MRAM 120C in a closing period of the delay return opening-closing element 103b just after the electric power switch 102 is interrupted.

Next, FIG. 14 as a flow chart for an operating explanation relative to a writing inhibition/releasing operation in FIG. 9 will be explained.

Figure 14:
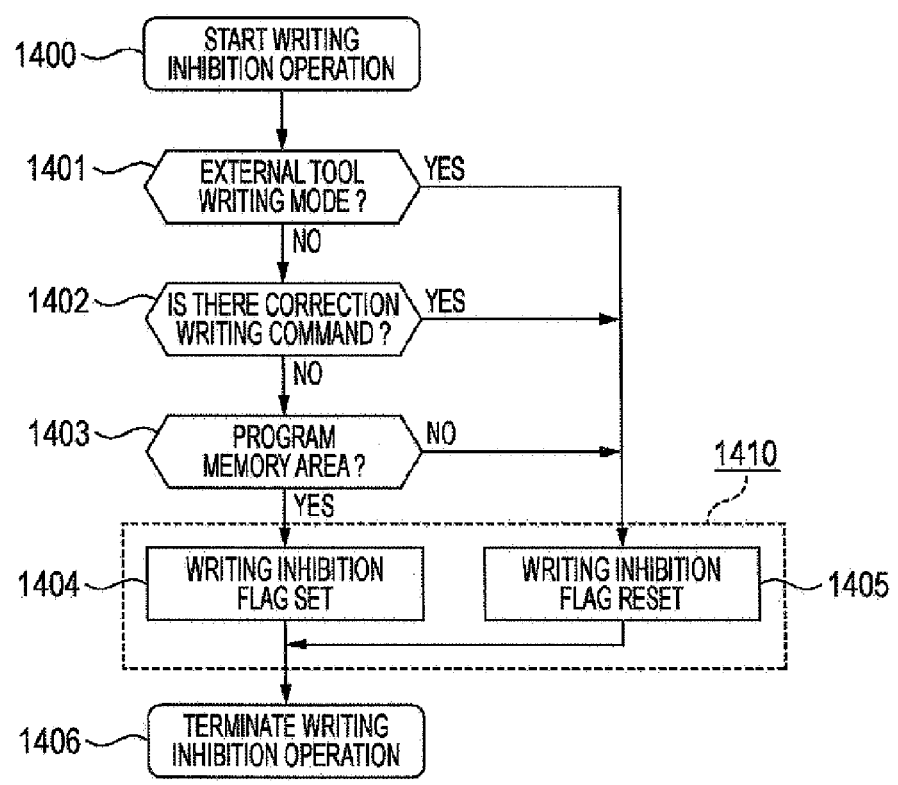
FIG. 14 is a flow chart for explaining an operation relative to a writing inhibition/releasing operation in FIG. 9.

In FIG. 14, process 1400 is a starting process of a writing inhibition operation of the microprocessor 110C. In subsequent process 1401, it is judged whether the external tool 108 is connected and a writing mode of a control program is attained. If it is the writing mode, the judgment of YES is made and it proceeds to process 1405. In contrast to this, when no external tool 108 is connected or a reading-out mode is attained, the judgment of NO is made and it proceeds to process 1402.

In process 1402, the existence of a correction writing command is judged. When correction writing is required, the judgment of YES is made and it proceeds to process 1405. In contrast to this, when no correction writing is required, the judgment of NO is made and it proceeds to process 1403.

The correction writing said here corresponds to the correction writing and the abnormality correction writing in process 1008 of FIGS. 10A and 10B, process 1218 of FIG. 12 and process 1335 of FIG. 13.

In process 1403, it is judged whether an address area desirously written is the program memory area or the data memory area. If the address area is the program memory area, the judgment of YES is made and it proceeds to process 1404. In contrast to this, if no address area is the program memory area, the judgment of NO is made and it proceeds to process 1405.

Process 1404 is a step for setting a writing inhibition flag, and inhibiting generation of a writing command signal with respect to the program memory area of MRAM 120C.

Process 1405 is a step for resetting the writing inhibition flag and allowing the generation of the writing command signal with respect to the program memory area and the data memory area of MRAM 120C.

Process 1406 subsequent to processes 1404, 1405 is an operation termination process. Subsequently to operation termination process 1406, the microprocessor 110C executes another control operation and is then approximately periodically returned to operation starting process 1400.

When process 1008 of FIGS. 10A and 10B, process 1218 of FIG. 12 and process 1335 of FIG. 13 are executed, the writing inhibition flag is reset. The writing inhibition flag is instantly set in accordance with the execution of processes 1008, 1218, 1335.

Process block 1410 constructed by processes 1404, 1405 becomes a writing inhibition/releasing means. The writing inhibition/releasing means 1410 corresponds to the writing inhibition/releasing means 150 in FIGS. 1 and 5.

Accordingly, in FIGS. 1 and 5, the writing inhibition/releasing means 150 using a hardware circuit can be replaced with the writing inhibition/releasing means 1410 using a software means. In FIG. 9, no writing inhibition/releasing means 1410 is required if the writing inhibition/releasing means 150 is used.

In the writing inhibition/releasing means 150 of FIG. 1, the program memory area and the data memory area are divided by the uppermost order address signal A15. However, accurate area division can be performed by logically connecting other address signals of low orders. In process 1403 in FIG. 14, an area judgment is made on the basis of plural address signals.

(3) Explanation of Other Embodiment Modes

In the third embodiment device of this invention constructed as shown in FIG. 9, MRAM 120C is explained so as to have the first and second error registers 125a, 125b and the first and second error flag generating circuits 124aa, 124bb. However, it is sufficient to arrange at least one of the first and second error registers 125a, 125b and one of the first and second error flag generating circuits 124aa, 124bb as a basic main feature of this invention.

For example, when no second error register 125b exists, processes 1103a to 1109b of FIG. 11A, processes 1203a to 1204b within FIG. 12 and process block 1327 of FIG. 13 are deleted.

Conversely, when no first error register 125a exists, processes 1003a to 1009a of FIG. 10A and processes 1213a to 1218 within FIG. 12 are deleted, and it proceeds to process 1222 when the judgment of process 1204b is NO.

When one of the first error flag generating circuit 124aa and the second error flag generating circuit 124bb does not exist, the abnormality counting circuit 170 or the abnormality counting circuit 180 is deleted, and FIG. 10B or FIG. 11B is deleted, and processes 1111a, 1112a or processes 1111b, 1112b of FIG. 11A are deleted.

When the second error register 125b and the third abnormality judging means are arranged in the first and second embodiment devices of this invention, the abnormality correction writing means 1327 explained in the third embodiment device can be introduced.

Conversely, when the backup memory 161A or 161B is arranged in the third embodiment device, the correction transfer means 427, 827 in the first and second embodiment devices can be introduced.

Further, the abnormality generation memory means shown in the flip flop circuit 140C can be also replaced with the counter circuit 140A as shown in FIG. 1.

Further, the output allowance signal OUTE generated by the watch dog timer 130 as shown in FIG. 5 can be also used instead of the electric supply holding command output DR1 for performing the self holding operation of the electric power relay 103a.

In the third embodiment device of this invention constructed as shown in FIG. 9, the totalizing means of an error generating state adds and counts error generating information using an error flag by a reversible counter as the totalizing means, and makes a subtracting calculation by a frequency dividing signal of a reading-out command signal. The subtracting calculation may be also simply schematically made by a clock signal of a predetermined period instead of the frequency dividing signal of the reading-out command signal.

Further, the reversible counter as the totalizing means can be also simply schematically set to an adding counter or a subtracting counter constructed by hardware.

For example, an adding calculation of a present value register may be made in accordance with error generation, and an abnormality detecting output may be generated when the counting present value exceeds a predetermined set threshold value. Further, the present value may be also initialized to zero by the frequency dividing signal of the reading-out command signal with respect to MRAM or the clock signal of a predetermined period.

Further, the subtracting calculation of the present value register may be made from a predetermined value in accordance with error generation. When the counting present value reaches zero, the abnormality detecting output may be generated. Further, the present value may be initialized and set to a predetermined initial value by the frequency dividing signal of the reading-out command signal with respect to MRAM, or the clock signal of a predetermined period.

(4) Main Points and Characters of Embodiment Mode 3

Electricity is supplied from the external electric power source 101 to the electronic controller 100C in accordance with embodiment mode 3 of this invention. The electronic controller 100C has the microprocessor 110C for controlling the operations of electric load groups 105a, 105b in accordance with an operating situation of input sensor groups 106, 107. With respect to a nonvolatile program memory cooperated with the microprocessor, a control program including a control constant is transferred and written from the external tool 108.

The above microprocessor 110C is operated on the basis of the control program stored to MRAM (Magnetic Random Access Memory) 120C as a nonvolatile program memory able to electrically perform reading and writing. This MRAM is divided into address areas different in the program memory area and the data memory area, and storage is performed. The program memory area is mainly constructed by an input-output control program not rewritten and changed during the operation of the above microprocessor 110C after data are transferred and written from the above external tool 108. The data memory area is rewritten and changed at any time during the operation of the above microprocessor 110C. The above MRAM 120C further includes the correction code adding writing circuit 122, the decoding reading-out circuit 123, the error registers 125*a*, 125*b* arranged in the above data memory area, and the control program. The correction code adding writing circuit 122 is operated in accordance with a writing command signal from the above microprocessor 110C, and writes stored data adding an error correction code to the memory cell 121 of a designation address. The decoding reading-out circuit 123 is operated in accordance with a reading-out command signal from the above microprocessor 110C, and decodes and reads-out the above stored data from the memory cell 121 of the designation address. The control program becomes confirmation reading-out means 1003*b*, 1103*b*, 1203*b*, 1213*b* and overlapping abnormality judging means 1010*b*, 1120*b*, 1231, 1232 arranged in the above program memory area. Further, the writing command signal from the above microprocessor 110C is constructed so as to be supplied to the above MRAM 120C through the writing inhibition/releasing means 1410.

In the above error registers 125*a*, 125*b*, when there is a code error in the stored data of the above memory cell 121, an address number generating the error is stored as error data. The stored error data are error data first generated after these data are reset by the above microprocessor 110C. Otherwise, the stored error data are a memory of a specific address for storing error data sequentially updated if there is a code error with respect to a new address by sequentially reading-out the contents of each address of the above memory cell 121.

The above confirmation reading-out means 1003*b*, 1103*b*, 1203*b*, 1213*b* are means operated in accordance with storage of the error data to the above error registers 125*a*, 125*b*, and again reading-out and confirming the contents of the above error registers 125*a*, 125*b* after the error data are reset and the error generating address is then again accessed.

The above overlapping abnormality judging means 1010*b*, 1120*b*, 1231, 1232 are means for judging that the contents of a memory of the same address are a continuation abnormality when the contents of the error registers 125*a*, 125*b* read out by the above confirmation reading-out means 1003*b*, 1103*b*, 1203*b*, 1213*b* include the same error data.

The above writing inhibition/releasing means 1410 inhibits that the writing command signal using the above microprocessor 110C is supplied to the above MRAM 120C with respect to the program memory area of the above MRAM 120C storing the above control program. Further, the writing inhibition/releasing means 1410 releases the above writing inhibition function when the external tool 108 is connected to the above microprocessor 110C, and it is a writing state of the control program with respect to the above MRAM 120C. When no external tool 108 is connected, the writing inhibition/releasing means 1410 also releases the above writing inhibition function as an exception when the above control program is restored and written.

Abnormality processing including at least abnormality notification is executed when the above overlapping abnormality judging means 1010*b*, 1120*b*, 1231, 1232 make the abnormality judgment, or is executed in accordance with the execution of abnormality judgments made plural times.

The above MRAM 120C further includes a control program as correction writing means 1008, 1218. The above error register generates an error within a bit number of a range able to decode the contents of the above memory cell 121 of a designation address. When the read-out stored data are data restored and corrected by the above decoding reading-out circuit 123, the above error register becomes the first error register 125*a* for locating the address number generating the error at a first specific address stored as first error data.

The above confirmation reading-out means is operated in accordance with storage of the first error data to the above first error register 125*a*. The above confirmation reading-out means becomes first confirmation reading-out means 1003*b*, 1213*b* for again reading-out and confirming the contents of the above first error register 125*a* after the first error data are reset and the error generating address is then again accessed.

The above correction writing means 1008, 1218 are operated in accordance with the storage of the first error data to the first error register 125*a* as before as a reading-out result using the above first confirmation reading-out means 1003*b*, 1213*b*. The above correction writing means 1008, 1218 are restoring writing means for overwriting and storing the stored data of the error generating address read out through the above decoding reading-out circuit 123 to the error generating address of the above MRAM 120C through the above correction code adding writing circuit 122.

The above overlapping abnormality judging means becomes first overlapping abnormality judging means 1010*b*, 1231 for judging that the contents of a memory of the same address are a continuation abnormality when reading-out confirmation is performed by the above first confirmation reading-out means 1003*b*, 1213*b*, or when the contents of the above first error register 125*a* again include the same error data in the reading-out confirmation after a correction is written by the above correction writing means 1008, 1218.

The above writing inhibition/releasing means 1410 releases the above writing inhibition function at a restoring operation time using the above correction writing means 1008, 1218.

The above MRAM 120C has a first error flag generating circuit 124*aa* in addition to the above first error register 125*a*, and also has a first scattering abnormality judging means 1010*a* constructed by a first totalizing means 1015 and a first scattering abnormality detecting means 1016. The above MRAM 120C further has an abnormality generation memory means 140C. In the above first error flag generating circuit 124*aa*, an error is generated within a bit number of a range able to decode the contents of the above memory cell 121 of a designation address. This first error flag generating circuit 124*aa* is a logic circuit for generating the first error flag FL11 as binarized logic information when read-out stored data are data restored and corrected by the above decoding reading-out circuit.

In the above first error flag FL11, an operating state is changed in accordance with the existence of error generation every access address of the above MRAM 120C.

The above first adding-subtracting circuit 1015 is an abnormality counting circuit 170 constructed by hardware. The first adding-subtracting circuit 1015 adds or subtracts a generation time number of the above first error flag FL11. The subtracting calculation or the adding calculation is made by the frequency dividing signal DNP of a reading-out command signal supplied from the above microprocessor 110C.

The above first scattering abnormality detecting means 1016 generates a count-up output EP1 as a first abnormality detecting signal when the present value of the above abnormality counting circuit 170 exceeds a predetermined set threshold value.

The above abnormality generation memory means 140C is a means for performing at least abnormality notification in accordance with an abnormality judgment made by the above first overlapping abnormality judging means 1010b, 1231, and the generation of the above count-up output EP1.

Accordingly, it is characterized in that a scattering abnormality can be accurately detected in accordance with generation frequency of the first error flag, and high speed counting using a hardware counter is performed, and a control burden of the microprocessor can be reduced.

The above error register generates an error exceeding the bit number of a range able to decode the contents of the above memory cell 121 of the designation address. When read-out stored data are data unable to guarantee whether these read-out stored data are conformed to the stored original data, the above error register becomes the second error register 125b for locating an address number generating the error at a second specific address stored as second error data.

The above confirmation reading-out means is operated in accordance with the storage of the second error data to the above second error register 125b. The above confirmation reading-out means becomes second confirmation reading-out means 1103b, 1203b for resetting the second error data, and then again getting access to the error generating address, and reading-out and confirming the contents of the above second error register 125b.

When reading-out confirmation is performed by the above second confirmation reading-out means 1103b, 1203b, the above overlapping abnormality judging means becomes second overlapping abnormality judging means 1120b, 1232 for judging that the contents of a memory of the same address are a continuation abnormality when the contents of the above second error register 125b include the same error data.

The above MRAM 120C has the second error flag generating circuit 124bb in addition to the above second error register 125b. Further, the above MRAM 120C has a second scattering abnormality judging means 1120a constructed by a second totalizing means 1115 and a second scattering abnormality detecting means 1116, and also has an abnormality generation memory means 140C. The above second error flag generating circuit 124bb generates an error exceeding the bit number of a range able to decode the contents of the above memory cell 121 of the designation address. When the read-out stored data are data unable to guarantee whether these read-out stored data are conformed to the stored original data, the second error flag generating circuit 124bb is a logic circuit for generating a second error flag FL22 as binarized logic information.

In the above second error flag FL22, an operating state is changed in accordance with the existence of error generation every access address of the above MRAM 120C.

The above second adding-subtracting circuit 1115 is an abnormality counting circuit 180 constructed by hardware. The second adding-subtracting circuit 1115 adds or subtracts a generation time number of the above second error flag FL22. The subtracting calculation or the adding calculation is made by the frequency dividing signal DNP of a reading-out command signal supplied from the above microprocessor 110C.

The above second scattering abnormality detecting means 1116 generates a count-up output EP2 as a second abnormality detecting signal when the present value of the above abnormality counting circuit 180 exceeds a predetermined set threshold value.

The above abnormality generation memory means 140C is a means for performing at least abnormality notification in accordance with an abnormality judgment made by the above second overlapping abnormality judging means 1120b, 1232, and the generation of the above count-up output EP2.

Accordingly, it is characterized in that a scattering abnormality can be accurately detected in accordance with generation frequency of the second error flag, and high speed counting using a hardware counter is performed, and a control burden of the microprocessor can be reduced.

The above MRAM 120C further includes both control programs constituting the above second overlapping abnormality judging means 1232 and a third abnormality judging means 1233, and a control program constituting an abnormality correction writing means 1327.

The above third abnormality judging means 1333 is a means for sequentially reading-out stored data of a specific interval area of the above MRAM 120C, and judging the existence of a code error by the sum check or the CRC check relative to data of an entire reading-out interval.

When the above third abnormality judging means 1333 judges that there is a code error in the stored data of MRAM 120C of the specific interval, and the above second overlapping abnormality judging means 1232 judges that there is a code error in one stored data within the above specific interval, the above abnormality correction writing means 1327 makes a reverse calculation from sum check data or CRC check data, and presumes and arithmetically calculates correct stored data. The above abnormality correction writing means 1327 is a restoring writing means for overwriting and storing the presumed data to an error generating address of the above MRAM 120C through the above correction code adding writing circuit 122.

The above writing inhibition/releasing means 1410 releases the above writing inhibition function at a restoring operation time using the above abnormality correction writing means 1327.

Accordingly, it is characterized in that normal data before error generation can be arithmetically calculated and recovered even when a code error of many bits is generated in one data.

The above MRAM 120C further includes a control program as third abnormality judging means 1333, and has abnormality generation memory means 140C.

The above third abnormality judging means 1333 is a means for sequentially reading-out stored data of a specific interval area of the above MRAM 120C, and judging the existence of a code error by the sum check or the CRC check relative to data of an entire reading-out interval.

The above abnormality generation memory means 140C is a means for performing at least abnormality notification in accordance with the abnormality judgment made by the above overlapping abnormality judging means 1010b, 1120b, 1231, 1232, and the abnormality judgment made by the above third abnormality judging means 1331.

The above MRAM 120C further includes a control program as an inspecting period judging means 1201 for selecting one of an operation start inspecting means, a constant period inspecting means and a before-stoppage inspecting means.

The above operation start inspecting means is a specific inspecting means for inspecting the existence of a code error by the above overlapping abnormality judging means 1231, 1332 or the above third abnormality judging means 1333 with respect to main data of a specific area stored to the above MRAM 120C just after the electric power switch 102 is turned on.

The above constant period inspecting means is a dividing update inspecting means for dividing all data stored to the above MRAM 120C into plural portions in a turning-on continuing state of the electric power switch 102, and sequentially periodically inspecting the existence of a code error by the above overlapping abnormality judging means 1231, 1332 or the above third abnormality judging means 1333 with respect to each divided data.

The above before-stoppage inspecting means is a collective inspecting means for inspecting the existence of a code error by the above overlapping abnormality judging means 1231, 1332 or the above third abnormality judging means 1333 with respect to all data stored to the above MRAM 120C in a closing period of the delay return opening-closing element 103b just after the electric power switch 102 is interrupted.

The above microprocessor 110C controls the operation of at least an intake air amount control means or a fuel injection control means in accordance with an operating state of vehicle mounting sensor groups 106, 107 for detecting an operating state of a vehicle mounting engine.

The above MRAM 120C further includes a control program as an escaping operation means in addition to the control program as a normal operation means, and also has an abnormality generation memory means 140C.

The above escaping operation means is a means for executing operation control for restraining an engine rotating speed by the restriction of an intake air amount using the above intake air amount control means or the restriction of a fuel supply amount using the fuel injection control means.

The above abnormality generation memory means 140C notifies an abnormality in accordance with the abnormality judgment made by at least the above overlapping abnormality judging means 1010b, 1120b, 1231, 1232, and selectively switches operating modes from a normal operation mode using the above normal operation means to an escaping operation mode using the above escaping operation means.

The watch dog timer 130 and the abnormality generation memory means 140C are used together in the above microprocessor 110C.

The watch dog timer 130 is a timer circuit for generating the reset pulse signal RS1 in accordance with the matter that the pulse width of the watch dog clear signal WD1 generated by the above microprocessor 110C exceeds a predetermined value, and initializing and restarting the microprocessor 110C.

The above abnormality generation memory means 140C is operated in accordance with the generation of abnormality detecting pulse signals ER1, ER2 caused by judging abnormality generation by the above overlapping abnormality judging means 1010b, 1120b, 1231, 1232, and the reset pulse signal RS1 using the above watch dog timer 130. The above abnormality generation memory means 140C performs at least abnormality notification in accordance with the generation of the pulse signal of one time or pulse signals of plural times. Further, the above abnormality generation memory means 140C is a logic circuit constructed by a flip flop circuit or a counter circuit for selectively switching operating modes from the normal operation mode using the above normal operation means to the escaping operation mode using the above escaping operation means. A driving stopping means 142 and a memory releasing means 112C are added to the logic circuit.

The above driving stopping means 142 is operated when the above abnormality generation memory means 140C decides and stores abnormality generation. The above driving stopping means 142 is a gate circuit for inhibiting driving of a partial specific electric load within the above electric load groups 105a, 105b.

The above memory releasing means 112C is a means for resetting an abnormality memory signal using the above abnormality generation memory means 140C by a reset pulse signal operated in accordance with a manual operation using re-turning-on of the electric power switch 102, etc.

The electronic controller of this invention can be also used in a programmable controller used by transferring and writing a sequence program made by e.g., a user from the external tool as well as the vehicle mounting electronic controller.

In the case of the vehicle mounting engine controller explained in the embodiments of this invention, the microprocessor is automatically initialized and restarted even at an abnormality generating time. However, this is because a vehicle escape, etc. from the interior of a railroad crossing are supposed, and it is seriously considered that no operation of the engine is stopped if possible as a safety countermeasure.

In contrast to this, in a programmable controller generally used for control of equipment within a factory, it is general that the operation of the microprocessor is stopped at the abnormality generating time, and the microprocessor can be restarted by a manual operation. In accordance with kinds of equipment, an actuator is individually operated by a manual driving operation after the abnormality stoppage, and an escaping operation is performed so as to perform an original return.

Various modifications and alterations of this invention will be apparent to those skilled in the art without departing from the scope and spirit of this invention, and it should be understood that this is not limited to the illustrative embodiments set forth herein.

What is claimed is:

1. An electronic controller comprising a microprocessor in which electricity is supplied from an external electric power source and the operation of an electric load group is controlled in accordance with an operating situation of an input sensor group, and constructed such that a control program including a control constant is transferred and written from an external tool to a nonvolatile program memory cooperated with the microprocessor;

wherein the microprocessor is operated on the basis of the control program stored to MRAM (Magnetic Random Access Memory) as the nonvolatile program memory electrically read and written;

MRAM is dividedly stored into different address areas comprising a program memory area mainly constructed by an input-output control program not rewritten and changed during the operation of the microprocessor after being transferred and written from the external tool, and a data memory area rewritten and changed at any time during the operation of the microprocessor;

the MRAM further includes:

a correction code adding writing circuit for writing stored data adding an error correction code to a memory cell of a designation address in accordance with a writing command signal from the microprocessor;

a decoding reading-out circuit for decoding and reading-out the stored data from the memory cell of the designation address in accordance with a reading-out command signal from the microprocessor;

an error register arranged in the data memory area; and a control program as a confirmation reading-out means and an overlapping abnormality judging means arranged in the program memory area; and the writing command signal from the microprocessor is constructed so as to be supplied to the MRAM through a writing inhibition/releasing means;

the error register stores an address number generating an error as error data when there is a code error in the stored data of the memory cell;

the stored error data are error data first generated after being reset or transfer-escaped by the microprocessor, or are a memory of a specific address for storing error data sequentially updated if there is a code error with respect to a new address by sequentially reading-out contents of each address of the memory cell;

the confirmation reading-out means is operated in accordance with storage of the error data to the error register, and is a means for again reading-out and confirming contents of the error register after the error data are reset or transfer-escaped and the error generating address is then again accessed;

the overlapping abnormality judging means is a means for judging that the contents of a memory of the same address are a continuation abnormality when the contents of the error register read out by the confirmation reading-out means include the same error data;

the writing inhibition/releasing means inhibits that the writing command signal provided by the microprocessor is supplied to the MRAM with respect to the program memory area of the MRAM in which the control program is stored;

the writing inhibition/releasing means releases the writing inhibition function when the external tool is connected to the microprocessor and the control program is ready to write with respect to the MRAM;

the writing inhibition/releasing means also releases the writing inhibition function as an exception even when restoring writing of the control program is performed when the external tool is not connected to the microprocessor; and abnormality processing including at least one of abnormality notification and storage of abnormality generation information is executed when the overlapping abnormality judging means makes an abnormality judgment, or is executed in accordance with the execution of abnormality judgments made plural times.

2. The electronic controller according to claim 1, wherein the MRAM further comprises a correction writing means;

the error register generates an error within a bit number of a range able to decode the contents of the memory cell of the designation address;

the error register is a first error register for locating an address number generating the error at a first specific address stored as first error data when read-out stored data are data restored and corrected by the decoding reading-out circuit;

the confirmation reading-out means is operated in accordance with the storage of the first error data to the first error register, and is a first confirmation reading-out means for again reading-out and confirming the contents of the first error register after the first error data are reset or transfer-escaped and the error generating address is then again accessed;

the correction writing means is operated in accordance with the storage of the first error data to the first error register as before as a reading-out result using the first confirmation reading-out means, and is a restoring writing means for overwriting and storing stored data of the error generating address read out through the decoding reading-out circuit to an error generating address of the MRAM through the correction code adding writing circuit;

the overlapping abnormality judging means is a first overlapping abnormality judging means for judging that the contents of the memory of the same address are a continuation abnormality when reading-out confirmation is performed by the first confirmation reading-out means, or when the contents of the first error register again include the same error data in the reading-out confirmation after a correction is written by the correction writing means; and the writing inhibition/releasing means releases the writing inhibition function at a restoring operation time using the correction writing means.

3. The electronic controller according to claim 2, wherein the MRAM has a first error flag generating circuit in addition to the first error register;

the first error flag generating circuit generates an error within a bit number of a range able to decode the contents of the memory cell of the designation address;

the first error flag generating circuit is a logic circuit for generating a first error flag as binarized logic information when read-out stored data are data restored and corrected by the decoding reading-out circuit;

the first error flag is connected to an interruption input terminal of the microprocessor;

the first confirmation reading-out means and the correction writing means are operated and executed in accordance with the generation of the first error flag, and an overlapping abnormality judgment is made by the first overlapping abnormality judging means; and the first error flag is automatically reset after a predetermined time, or is reset by the microprocessor.

4. The electronic controller according to claim 2, wherein the MRAM has at least one of the first error register or a first error flag generating circuit, and also has a first scattering abnormality judging means constructed by a first totalizing means and a first scattering abnormality detecting means, operated in accordance with the generation of the first error;

the first error flag generating circuit generates an error within the bit number of a range able to decode the contents of the memory cell of the designation address;

the first error flag generating circuit is a logic circuit for generating a first error flag as binarized logic information when read-out stored data are data restored and corrected by the decoding reading-out circuit;

the first error is periodic information relative to the existence of an error detected by periodically monitoring whether the first error data are stored to the first error register or not, or whether the first error flag is generated or not;

the first totalizing means has a first present value register;

the first totalizing means adds or subtracts a second variational value with respect to the first present value register in accordance with the generation of the first error;

the first error register or the first error flag is reset or transfer-escaped;

a first variational value is subtracted or added and adding and subtracting corrections with respect to the first present value register are made so as to be mutually lessened if no first error is generated;

the first totalizing means stops the adding and subtracting corrections using the first variational value at a predetermined normal side limit value when an unoperating state of the first error is continued;

the first scattering abnormality detecting means generates a first abnormality detecting signal when the value of the first present value register becomes a value outside the area of a predetermined abnormal side limit value by accumulating the first and second variational values;

the second variational value is a value greater than the first variational value, and is set as a value smaller than an allowance accumulating value as a difference between the abnormal side limit value and the normal side limit value; and abnormality processing including at least one of abnormality notification and storage of abnormality generation information is executed in accordance with an abnormality judgment made by the first overlapping abnormality judging means, and an abnormality judgment made by the first scattering abnormality judging means.

5. The electronic controller according to claim 4, wherein the first totalizing means adds or subtracts a third variational value as a value of the second variational value or more with respect to the first totalizing means when reading-out confirmation is performed by the first confirmation reading-out means, or when an overlapping abnormality again generating the first error is generated in the reading-out confirmation after a correction is written by the correction writing means.

6. The electronic controller according to claim 2, wherein the MRAM has a first error flag generating circuit in addition to the first error register, and also has a first scattering abnormality judging means constructed by a first totalizing means and a first scattering abnormality detecting means;

the first error flag generating circuit generates an error within the bit number of a range able to decode the contents of the memory cell of the designation address;

the first error flag generating circuit is a logic circuit for generating a first error flag as binarized logic information when read-out stored data are data restored and corrected by the decoding reading-out circuit;

an operating state of the first error flag is changed in accordance with the existence of error generation every access address of the MRAM;

the first totalizing means is an abnormality counting circuit constructed by hardware and adds or subtracts a generation time number of the first error flag, and makes the subtracting calculation or the adding calculation or is initialized by a frequency dividing signal of a reading-out command signal supplied from the microprocessor, or a clock signal of a predetermined period;

the first scattering abnormality detecting means generates a counting output as a first abnormality detecting signal when the present value of the abnormality counting circuit becomes a value outside the area of a predetermined set threshold value; and abnormality processing including at least one of abnormality notification and storage of abnormality generation information is executed in accordance with an abnormality judgment made by the first overlapping abnormality judging means, and the generation of the counting output.

7. The electronic controller according to claim 1, wherein the error register generates an error exceeding a bit number of a range able to decode the contents of the memory cell of the designation address;

the error register is a second error register for locating an address number generating the error at a second specific address stored as second error data when read-out stored data are data unable to guarantee whether these read-out stored data are conformed to stored original data;

the confirmation reading-out means is operated in accordance with the storage of the second error data to the second error register, and is a second confirmation reading-out means for resetting or transfer-escaping the second error data, and then again getting access to the error generating address, and reading-out and confirming the contents of the second error register; and the overlapping abnormality judging means is a second overlapping abnormality judging means for judging that the contents of a memory of the same address are a continuation abnormality when reading-out confirmation is performed by the second confirmation reading-out means and the contents of the second error register include the same error data.

8. The electronic controller according to claim 7, wherein the MRAM has a second error flag generating circuit in addition to the second error register;

the second error flag generating circuit generates an error exceeding the bit number of a range able to decode the contents of the memory cell of the designation address;

the second error flag generating circuit is a logic circuit for generating a second error flag as binarized logic information when read-out stored data are data unable to guarantee whether these read-out stored data are conformed to stored original data;

the second error flag is connected to an interruption input terminal of the microprocessor;

the second confirmation reading-out means is operated and executed in accordance with the generation of the second error flag, and an overlapping abnormality judgment is made by the second overlapping abnormality judging means; and the second error flag is automatically reset after a predetermined time, or is reset by the microprocessor.

9. The electronic controller according to claim 7, wherein the MRAM has at least one of the second error register or a second error flag generating circuit, and also has a second scattering abnormality judging means constructed by a second totalizing means operated in accordance with the generation of the second error and a second scattering abnormality detecting means;

the second error flag generating circuit generates an error exceeding the bit number of a range able to decode the contents of the memory cell of the designation address;

the second error flag generating circuit is a logic circuit for generating a second error flag as binarized logic information when read-out stored data are data unable to guarantee whether these read-out stored data are conformed to stored original data;

the second error is periodic information relative to the existence of an error detected by periodically monitoring whether the second error data are stored to the second error register or not, or whether the second error flag is generated or not;

the second totalizing means has a second present value register;

the second totalizing means adds or subtracts a fifth variational value with respect to the second present value register in accordance with the generation of the second error;

the second error register or the second error flag is reset or transfer-escaped;

a fourth variational value is subtracted or added and adding and subtracting corrections with respect to the second present value register are made so as to be mutually lessened if no second error is generated;

the second totalizing means stops the adding and subtracting corrections using the fourth variational value at a predetermined normal side limit value when an unoperating state of the second error is continued;

the second scattering abnormality detecting means generates a second abnormality detecting signal when the value of the second present value register becomes a value outside the area of a predetermined abnormal side limit value by accumulating the fourth and fifth variational values;

the fifth variational value is a value greater than the fourth variational value, and is set as a value smaller than an allowance accumulating value as a difference between the abnormal side limit value and the normal side limit value; and abnormality processing including at least one of abnormality notification and storage of abnormality generation information is executed in accordance with an abnormality judgment made by the second overlapping abnormality judging means, and an abnormality judgment made by the second scattering abnormality judging means.

10. The electronic controller according to claim 9, wherein the second totalizing means adds or subtracts a sixth variational value as a value of the fifth variational value or more with respect to the second totalizing means at the generating time of an overlapping abnormality again generating the second error even when reading-out confirmation is performed by the second confirmation reading-out means.

11. The electronic controller according to claim 7, wherein the MRAM has a second error flag generating circuit in addition to the second error register, and also has a second scattering abnormality judging means constructed by a second totalizing means and a second scattering abnormality detecting means;

the second error flag generating circuit generates an error exceeding the bit number of a range able to decode the contents of the memory cell of the designation address;

the first error flag generating circuit is a logic circuit for generating a second error flag as binarized logic information when read-out stored data are data unable to guarantee whether these read-out stored data are conformed to stored original data;

an operating state of the second error flag is changed in accordance with the existence of error generation every access address of the MRAM;

the second totalizing means is an abnormality counting circuit constructed by hardware and adds or subtracts a generation time number of the second error flag, and makes the subtracting calculation or the adding calculation or is initialized by a frequency dividing signal of a reading-out command signal supplied from the microprocessor, or a clock signal of a predetermined period;

the second scattering abnormality detecting means generates a counting output as a second abnormality detecting signal when the present value of the abnormality counting circuit becomes a value outside the area of a predetermined set threshold value; and abnormality processing including at least one of abnormality notification and storage of abnormality generation information is executed in accordance with an abnormality judgment made by the second overlapping abnormality judging means, and the generation of the counting output.

12. The electronic controller according to claim 7, wherein the MRAM further includes both control programs constituting the second overlapping abnormality judging means and a third abnormality judging means, and a control program constituting an abnormality correction writing means;

the third abnormality judging means is a means for sequentially reading-out stored data of a specific interval area of the MRAM, and judging the existence of a code error by a sum check or a CRC check relative to data of an entire reading-out interval;

the abnormality correction writing means makes a reverse calculation from sum check data or CRC check data, and presumes and arithmetically calculates correct stored data when the third abnormality judging means judges that there is a code error in the stored data of MRAM of a specific interval and the second overlapping abnormality judging means judges that there is a code error in one stored data within the specific interval;

the abnormality correction writing means is a restoring writing means for overwriting and storing the presumed data to an error generating address of the MRAM through the correction code adding writing circuit; and the writing inhibition/releasing means releases the writing inhibition function at a restoring operation time using the abnormality correction writing means.

13. The electronic controller according to claim 1, wherein the MRAM has at least one of a first error register and a first error flag generating means, and at least one of a second error register and a second error flag generating means, and also has first and second scattering abnormality judging means operated in accordance with a first error and a second error;

the first error register generates an error within a bit number of a range able to decode the contents of the memory cell of the designation address;

the first error register is a register for locating an address number generating the error at a first specific address stored as first error data when read-out stored data are data restored and corrected by the decoding reading-out circuit;

the first error flag generating circuit generates an error within the bit number of a range able to decode the contents of the memory cell of the designation address;

the first error flag generating circuit is a logic circuit for generating a first error flag as binarized logic information when read-out stored data are data restored and corrected by the decoding reading-out circuit;

the first error is periodic information relative to the existence of an error detected by periodically monitoring whether the first error data are stored to the first error register or not, or whether the first error flag is generated or not;

the second error register generates an error exceeding the bit number of a range able to decode the contents of the memory cell of the designation address;

the second error register is a register for locating an address number generating the error at a second specific address stored as second error data when read-out stored data are data unable to guarantee whether these read-out stored data are conformed to stored original data;

the second error flag generating circuit generates an error exceeding the bit number of a range able to decode the contents of the memory cell of the designation address;

the second error flag generating circuit is a logic circuit for generating a second error flag as binarized logic information when read-out stored data are data unable to guarantee whether these read-out stored data are conformed to stored original data;

the second error is periodic information relative to the existence of an error detected by periodically monitoring whether the second error data are stored to the second error register or not, or whether the second error flag is generated or not;

the first and second scattering abnormality judging means are means for generating first and second abnormality detecting signals when generating frequencies of the first error and the second error exceed predetermined threshold values; and abnormality processing including at least one of abnormality notification and storage of abnormality generation information is executed in accordance with an abnormality judgment made by the overlapping abnormality judging means and an abnormality judgment made by the first and second scattering abnormality judging means.

14. The electronic controller according to claim 13, wherein the first and second scattering abnormality judging means are constructed by a common use totalizing means and first and second scattering abnormality detecting means;
the common use totalizing means has a common use present value register;
the common use totalizing means adds or subtracts a second variational value with respect to the common use present value register if the first error is generated;
the first error register or the first error flag is reset or transfer-escaped;
if no first error is generated, a first variational value is subtracted or added, and adding and subtracting corrections with respect to the common use present value register are made so as to be mutually lessened;
if the second error is generated, a fifth variational value is added or subtracted with respect to the common use present value register, and the second error register or the second error flag is reset or transfer-escaped;
if no second error is generated, a fourth variational value is subtracted or added, and the adding and subtracting corrections with respect to the common use present value register are made so as to be mutually lessened;
the common use totalizing means stops the adding and subtracting corrections using the above first or fourth variational value at a predetermined normal side limit value when an unoperating state of the first or second error is continued;
the first or second scattering abnormality detecting means generates a first or second abnormality detecting signal when the value of the common use present value register becomes a value outside the area of a predetermined abnormal side limit value by accumulating the first, second, fourth and fifth variational values;
the second variational value is a value greater than the first variational value, and the fifth variational value is a value greater than the fourth variational value; and
the second variational value and the fifth variational value are set as values smaller than an allowance accumulating value as a difference between the abnormal side limit value and the normal side limit value.

15. The electronic controller according to claim 1, wherein the MRAM further includes a control program as a third abnormality judging means;
the third abnormality judging means sequentially reads-out stored data of a specific interval area of the MRAM, and judges the existence of a code error by a sum check or a CRC check relative to data of an entire reading-out interval; and
abnormality processing including at least one of abnormality notification and storage of abnormality generation information is executed in accordance with an abnormality judgment made by the overlapping abnormality judging means and an abnormality judgment made by the third abnormality judging means.

16. The electronic controller according to claim 15, wherein the MRAM further includes a control program as an inspecting period judging means for selecting one of an operation start inspecting means, a constant period inspecting means and a before-stoppage inspecting means;
the operation start inspecting means is a specific inspecting means for inspecting the existence of a code error by the overlapping abnormality judging means or the third abnormality judging means with respect to main data of a specific area stored to the MRAM just after an electric power switch is turned on;
the constant period inspecting means is a dividing update inspecting means for dividing all data stored to the MRAM into plural portions in a turning-on continuing state of the electric power switch, and sequentially inspecting the existence of the code error by the overlapping abnormality judging means or the third abnormality judging means with respect to each divided data; and
the before-stoppage inspecting means is a collective inspecting means for inspecting the existence of the code error by the overlapping abnormality judging means or the third abnormality judging means with respect to all the data stored to the MRAM in a closing period of a delay return opening-closing element just after the electric power switch is interrupted.

17. The electronic controller according to claim 7, wherein the microprocessor controls the operation of at least an intake air amount control means or a fuel injection control means in accordance with an operating state of a vehicle mounting sensor group for detecting an operating state of a vehicle mounting engine;
the MRAM further includes a control program as an escaping operation means in addition to a control program as a normal operation means, and also has an abnormality generation memory means;
the escaping operation means is a means for executing operation control for restraining an engine rotating speed by the restriction of an intake air amount using the intake air amount control means or the restriction of a fuel supply amount using the fuel injection control means;
the abnormality generation memory means performs abnormality notification in accordance with an abnormality judgment made by at least the overlapping abnormality judging means, and selectively switches operating modes to a normal operation mode using the normal operation means or an escaping operation mode using the escaping operation means.

18. The electronic controller according to claim 17, wherein the MRAM further includes a control program as a correction transfer means;
the microprocessor has a nonvolatile back-up memory for storing the control program as the escaping operation means;
the correction transfer means is a restoring writing means for overwriting and storing an escaping operation program stored to the backup memory to an error generating address of the MRAM through the correction code adding writing circuit in accordance with the abnormality judgment made by the overlapping abnormality judging means; and
the writing inhibition/releasing means releases the writing inhibition function at a restoring operation time using the correction transfer means.

19. The electronic controller according to claim 18, wherein the microprocessor is serially connected to a cooperating auxiliary CPU;
the auxiliary CPU is a microprocessor for communicating a monitor-control signal between this microprocessor and the serially connected microprocessor in cooperation with a nonvolatile auxiliary program memory; and the auxiliary program memory includes a nonvolatile backup memory for storing the control program as the escaping operation means.

20. The electronic controller according to claim 17, wherein a watch dog timer and an abnormality generation memory means are used together in the microprocessor;

the watch dog timer is a timer circuit for generating a reset pulse signal and initializing and restarting the microprocessor in accordance with the matter that the pulse width of a watch dog clear signal generated by the microprocessor exceeds a predetermined value;

the abnormality generation memory means is operated in accordance with the generation of an abnormality detecting pulse signal caused by judging the abnormality generation by the overlapping abnormality judging means and the reset pulse signal using the watch dog timer, and performs at least abnormality notification in accordance with the generation of a pulse signal of one time or pulse signals of plural times;

the abnormality generation memory means is a logic circuit constructed by a flip flop circuit or a counter circuit for selectively switching operating modes from a normal operation mode using the normal operation means to an escaping operation mode using the escaping operation means;

a driving stopping means and a memory releasing means are added to the logic circuit;

the driving stopping means is a gate circuit operated when the abnormality generation memory means decides and stores the abnormality generation, and inhibiting the operation of a partial specific electric load among the electric load group;

the memory releasing means is a means for resetting an abnormality memory signal using the abnormality generation memory means by a reset pulse signal operated in accordance with a manual operation using re-turning-on of the electric power switch, etc.

21. An electronic controller comprising a microprocessor in which electricity is supplied from an external electric power source and the operation of an electric load group is controlled in accordance with an operating situation of an input sensor group, and constructed such that a control program including a control constant is transferred and written from an external tool to a nonvolatile program memory cooperated with the microprocessor;

wherein the microprocessor is operated on the basis of the control program stored to MRAM (Magnetic Random Access Memory) as a nonvolatile program memory electrically read and written;

MRAM is divided into address areas different in a program memory area mainly constructed by an input-output control program not rewritten and changed during the operation of the microprocessor after being transferred and written from the external tool, and a data memory area rewritten and changed at any time during the operation of the microprocessor, and storage is performed;

the MRAM further has:

a correction code adding writing circuit for writing stored data adding an error correction code to a memory cell of a designation address in accordance with a writing command signal from the microprocessor;

a decoding reading-out circuit for decoding and reading-out the stored data from the memory cell of the designation address in accordance with a reading-out command signal from the microprocessor;

at least one of an error register or an error flag generating circuit arranged in the data memory area; and a scattering abnormality judging means; and the writing command signal from the microprocessor is constructed so as to be supplied to the MRAM through a writing inhibition/releasing means;

the error register stores an address number generating an error as error data when there is a code error in the stored data of the memory cell;

the stored error data are error data first generated after being reset or transfer-escaped by the microprocessor, or are a memory of a specific address for storing error data sequentially updated if there is a code error with respect to a new address by sequentially reading-out contents of each address of the memory cell;

the error flag generating circuit is a logic circuit for generating an error flag as binarized logic information when there is a code error in the stored data of the memory cell of the designation address;

the scattering abnormality judging means is a means for generating an abnormality detecting signal showing that abnormality generation frequency is excessively large when a totalizing time number of error generation every predetermined period detected by monitoring whether the error data are stored to the error register or not, or whether the error flag is generated or not exceeds a predetermined threshold value;

the writing inhibition/releasing means inhibits that the writing command signal provided by the microprocessor is supplied to the MRAM with respect to the program memory area of the MRAM for storing the control program;

the writing inhibition/releasing means releases the writing inhibition function when the external tool is connected to the microprocessor and it is a writing state of the control program with respect to the MRAM;

the writing inhibition/releasing means also releases the writing inhibition function as an exception when restoring writing of the control program is performed at an unconnecting time of the external tool; and abnormality processing including at least one of abnormality notification and storage of abnormality generation information is executed when the scattering abnormality judging means makes an abnormality judgment, or is executed in accordance with the execution of abnormality judgments made plural times.

22. An electronic controller comprising a microprocessor in which electricity is supplied from an external electric power source and the operation of an electric load group is controlled in accordance with an operating situation of an input sensor group, and constructed such that a control program including a control constant is transferred and written from an external tool to a nonvolatile program memory cooperated with the microprocessor;

wherein the microprocessor is operated on the basis of the control program stored to MRAM (Magnetic Random Access Memory) as a nonvolatile program memory electrically read and written;

MRAM is divided into address areas different in a program memory area mainly constructed by an input-output control program not rewritten and changed during the operation of the microprocessor after being transferred and written from the external tool, and a data memory area rewritten and changed at any time during the operation of the microprocessor, and storage is performed;

the MRAM further includes:

a correction code adding writing circuit for writing stored data adding an error correction code to a memory cell of a designation address in accordance with a writing command signal from the microprocessor;

a decoding reading-out circuit for decoding and reading-out the stored data from the memory cell of the designation address in accordance with a reading-out command signal from the microprocessor;

an error register or an error flag generating circuit arranged in the data memory area;

a control program as a conformation reading-out means and an overlapping abnormality judging means arranged in the program memory area; and a scattering abnormality judging means; and the error register stores an address number generating an error as error data when there is a code error in the stored data of the memory cell;

the stored error data are error data first generated after being reset or transfer-escaped by the microprocessor, or are a memory of a specific address for storing error data sequentially updated if there is a code error with respect to a new address by sequentially reading-out contents of each address of the memory cell;

the confirmation reading-out means is operated in accordance with the storage of the error data to the error register, and is a means for again reading-out and confirming contents of the error register after the error data are reset or transfer-escaped and the error generating address is then again accessed;

the overlapping abnormality judging means is a means for judging that the contents of a memory of the same address are a continuation abnormality when the contents of the error register read out by the confirmation reading-out means include the same error data;

the error flag generating circuit is a logic circuit for generating an error flag as binarized logic information when there is a code error in the stored data of the memory cell of the designation address;

the scattering abnormality judging means is a means for generating an abnormality detecting signal showing that abnormality generation frequency is excessively large when a totalizing time number of error generation every predetermined period detected by monitoring whether the error data are stored to the error register or not, or whether the error flag is generated or not exceeds a predetermined threshold value; and abnormality processing including at least one of abnormality notification and storage of abnormality generation information is executed when the overlapping abnormality judging means and the scattering abnormality judging means make an abnormality judgment, or is executed in accordance with the execution of abnormality judgments made plural times.

* * * * *